(12) United States Patent
Ahn et al.

(10) Patent No.: US 10,763,287 B2
(45) Date of Patent: *Sep. 1, 2020

(54) IMAGE SENSOR COMPRISING A LIGHT SHIELDING PATTERN WITH PLURAL PORTIONS SPACED APART ON PIXELS OF A SENSOR ARRAY AREA

(71) Applicant: Samsung Electronics Co., Ltd., Suwon-si, Gyeonggi-do (KR)

(72) Inventors: Yu-jin Ahn, Seongnam-si (KR); Jong-cheol Shin, Hwaseong-si (KR); Min-ji Jung, Daegu (KR)

(73) Assignee: Samsung Electronics Co., Ltd. (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/440,139

(22) Filed: Jun. 13, 2019

(65) Prior Publication Data
US 2019/0296066 A1 Sep. 26, 2019

Related U.S. Application Data

(60) Continuation of application No. 15/639,025, filed on Jun. 30, 2017, now Pat. No. 10,483,305, which is a (Continued)

(30) Foreign Application Priority Data

Mar. 13, 2013 (KR) .................... 10-2013-0026811

(51) Int. Cl.
*H01L 27/146* (2006.01)

(52) U.S. Cl.
CPC .... *H01L 27/14618* (2013.01); *H01L 27/1464* (2013.01); *H01L 27/14623* (2013.01);
(Continued)

(58) Field of Classification Search
CPC ......... H01L 27/14623; H01L 27/14636; H01L 27/1464
(Continued)

(56) References Cited

U.S. PATENT DOCUMENTS

| 6,614,473 B1 | 9/2003 | Kijima |
| 7,755,158 B2 | 7/2010 | Lee |

(Continued)

FOREIGN PATENT DOCUMENTS

| JP | 2005-347707 | 12/2005 |
| JP | 2005-347708 | 12/2005 |

(Continued)

*Primary Examiner* — Que Tan Le
(74) *Attorney, Agent, or Firm* — Myers Bigel, P.A.

(57) ABSTRACT

An image sensor includes a substrate including a sensor array area, a pad area, and a circuit area, a wiring layer on the pad area, and a light-shielding pattern on the sensor array area. The sensor array area includes a first area including active pixels and a second area including optical back pixels. The wiring layer is apart from the substrate by a first distance on the pad area. The light-shielding pattern includes a first portion spaced apart from the substrate by a second distance less than the first distance, a second portion disposed between the first portion and the wiring layer and extending on the same level as the wiring layer, and a third portion disposed between the first portion and the second portion and integrally formed with the first portion and the second portion.

20 Claims, 51 Drawing Sheets

Related U.S. Application Data division of application No. 14/204,170, filed on Mar. 11, 2014, now Pat. No. 9,741,756.

(52) U.S. Cl.
CPC .. *H01L 27/14636* (2013.01); *H01L 27/14685* (2013.01); *H01L 2924/0002* (2013.01)

(58) Field of Classification Search
USPC .......................................... 250/208.1, 214 R
See application file for complete search history.

(56) References Cited

U.S. PATENT DOCUMENTS

| | | |
|---|---|---|
| 8,129,809 B2 | 3/2012 | Jang |
| 8,319,305 B2 | 11/2012 | Nagata |
| 8,445,827 B2 * | 5/2013 | Mizuta .............. H01L 27/14632 250/208.1 |
| 9,006,018 B2 | 4/2015 | Watanabe |
| 9,537,501 B2 | 1/2017 | Lee et al. |
| 2008/0150057 A1 | 6/2008 | Lee et al. |
| 2012/0086094 A1 | 4/2012 | Watanabe |
| 2012/0199930 A1 | 8/2012 | Hayashi |

FOREIGN PATENT DOCUMENTS

| | | |
|---|---|---|
| KR | 1020080109134 A | 12/2008 |
| KR | 1020110049303 | 5/2011 |
| KR | 1020120037876 A | 4/2012 |

\* cited by examiner

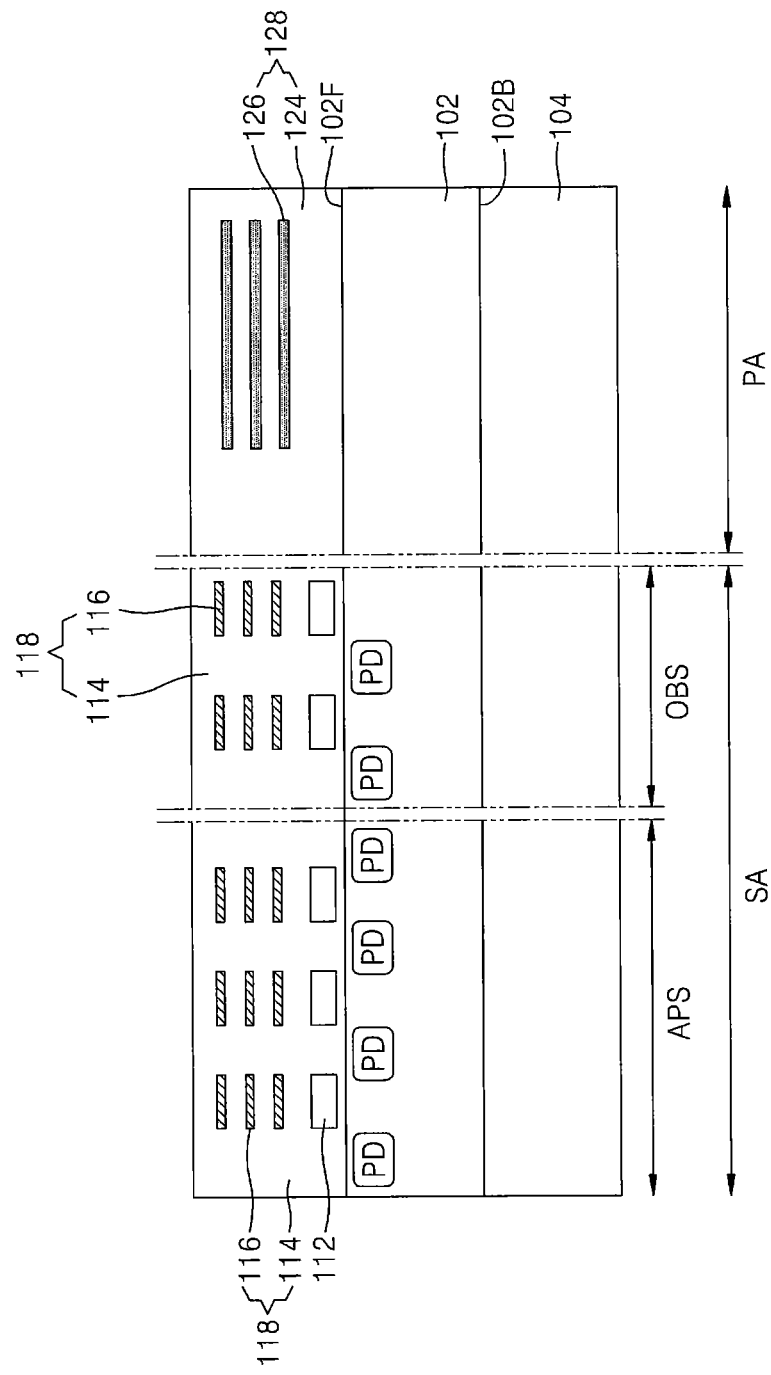

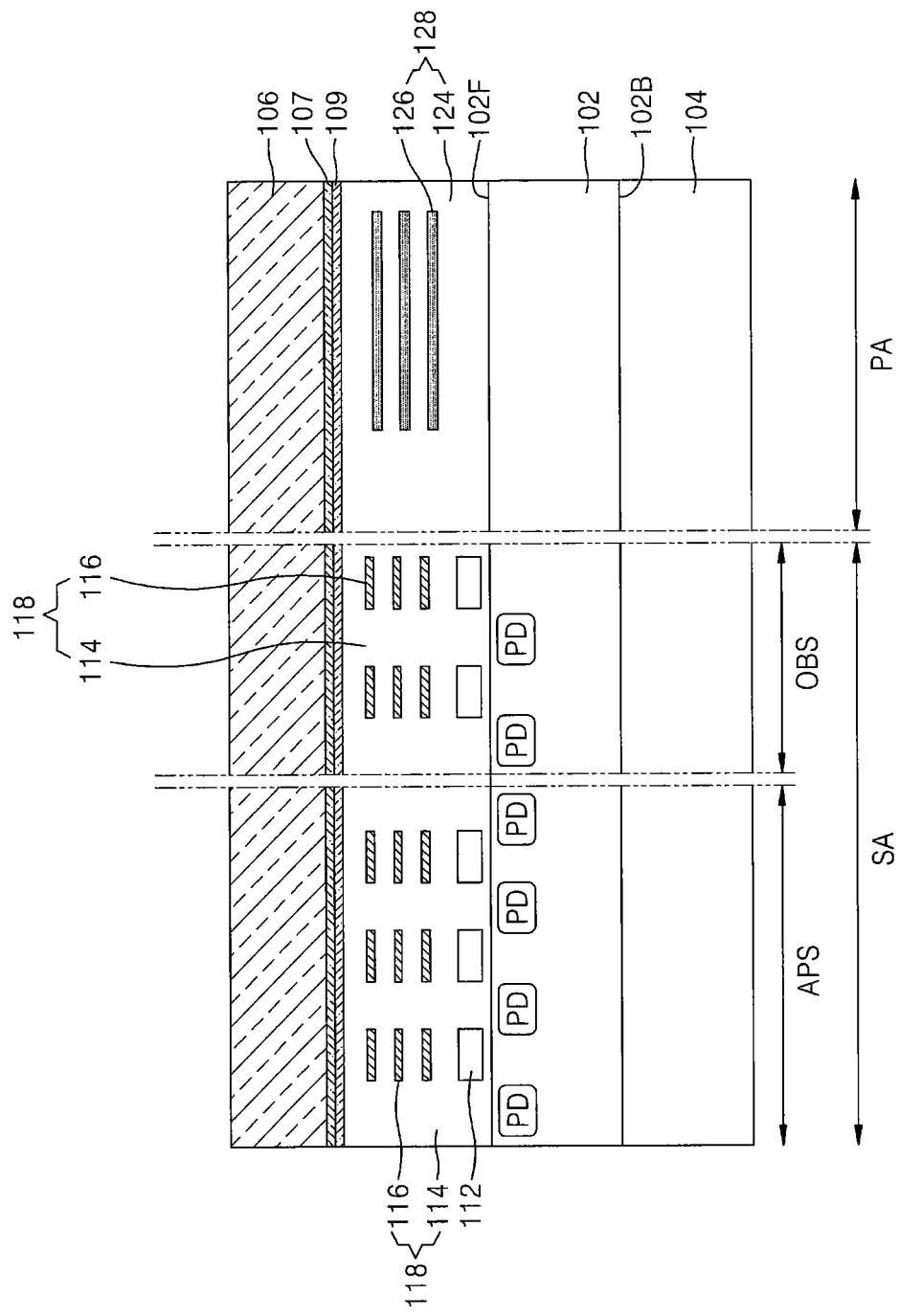

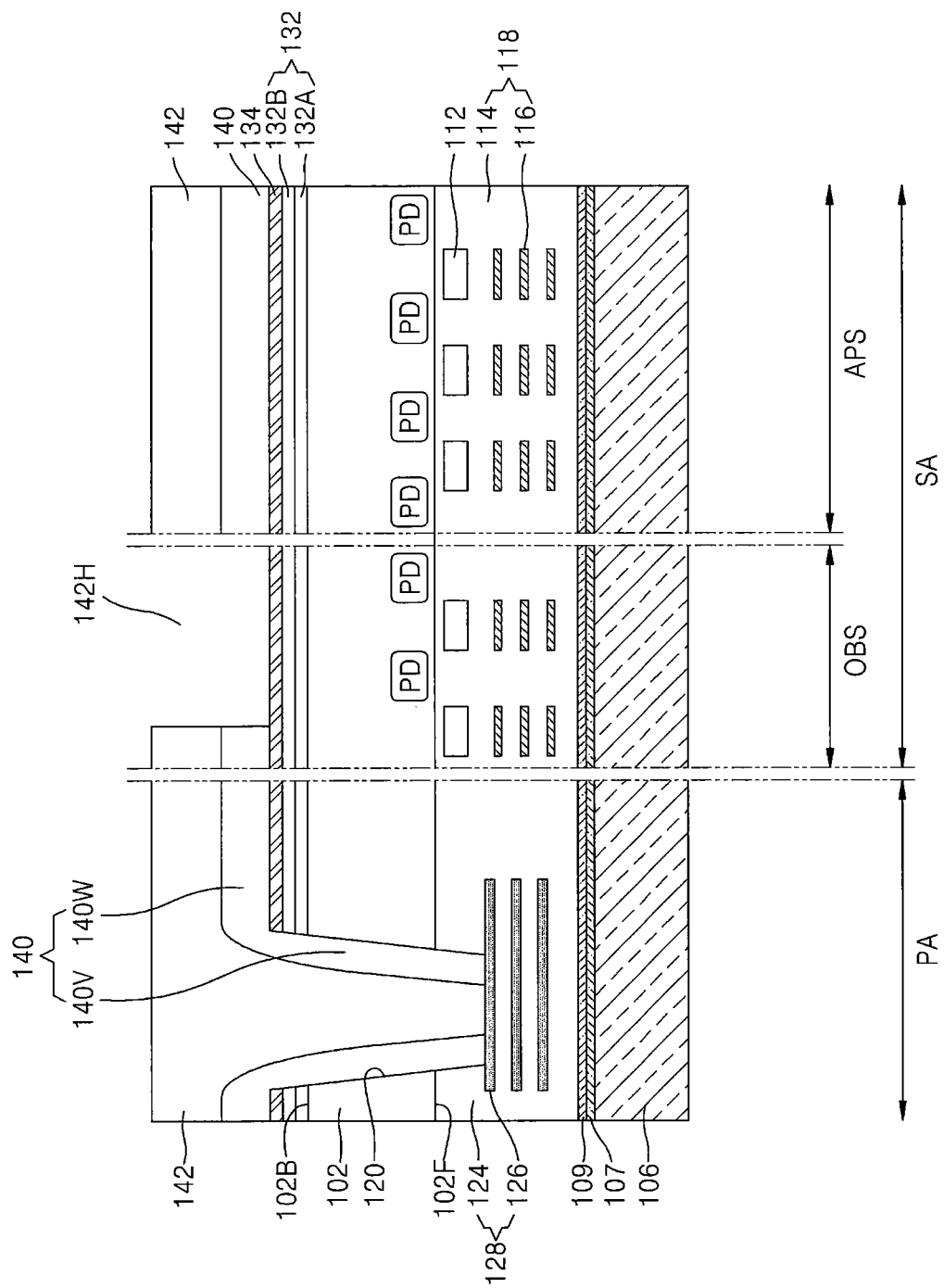

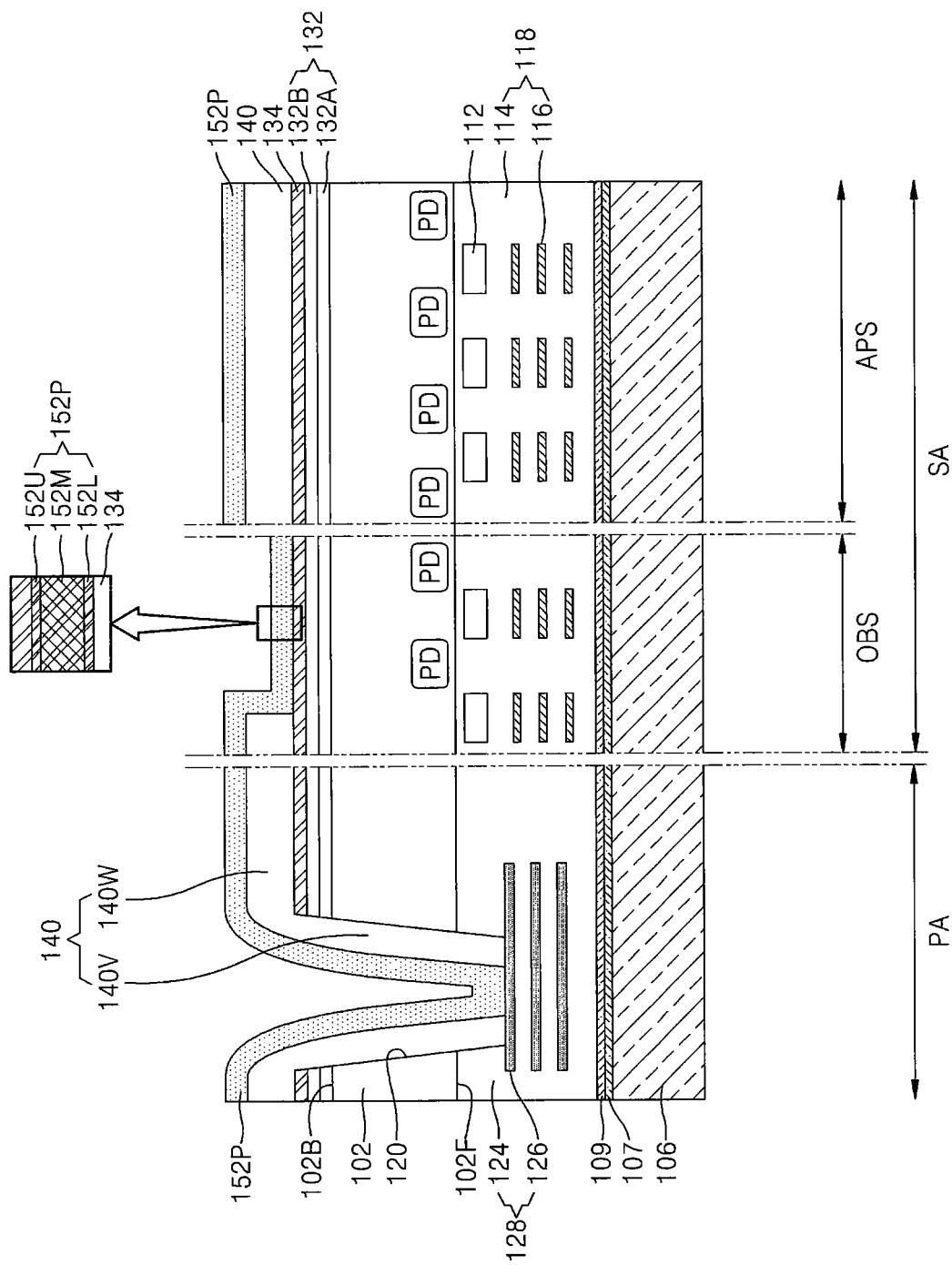

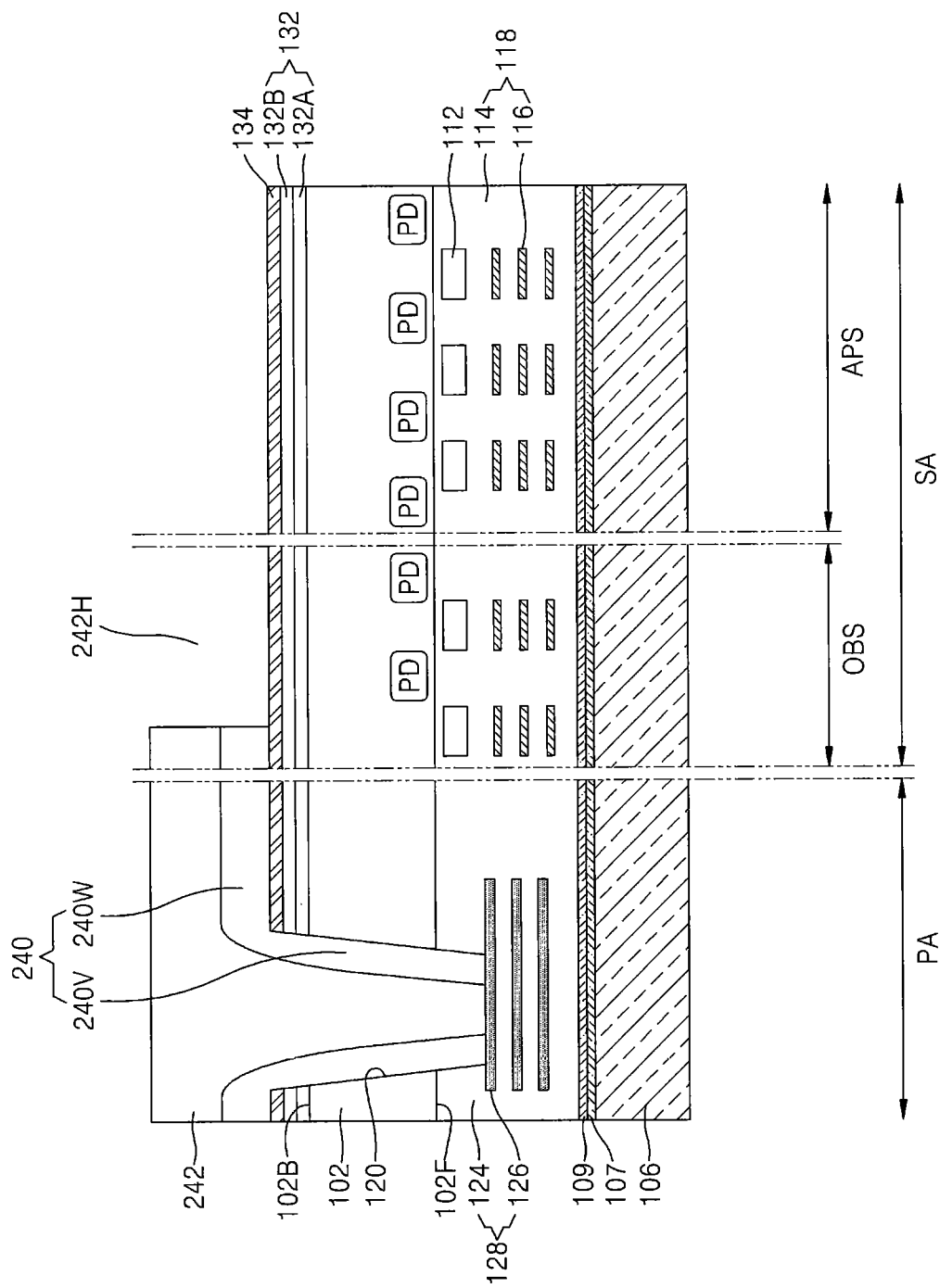

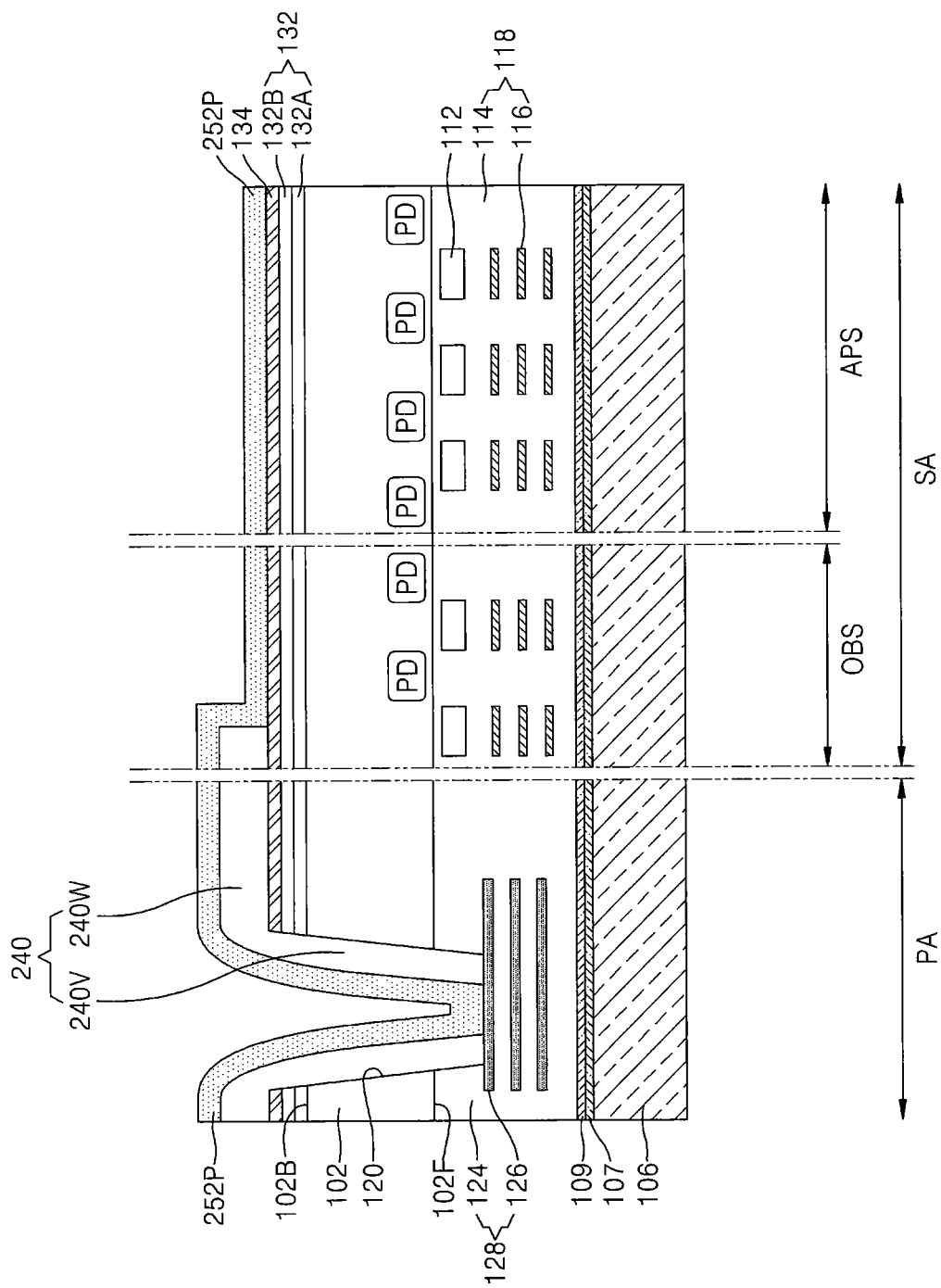

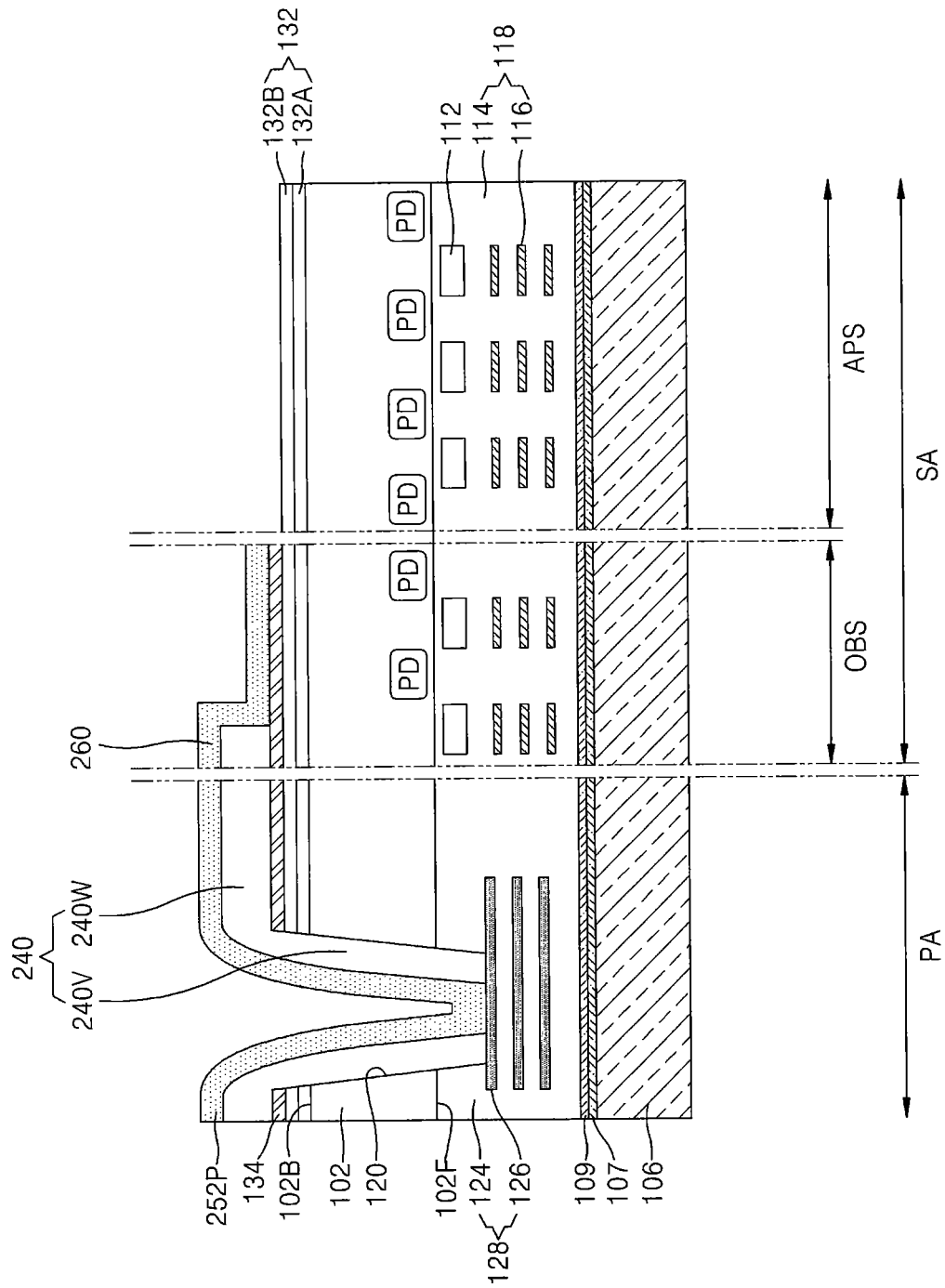

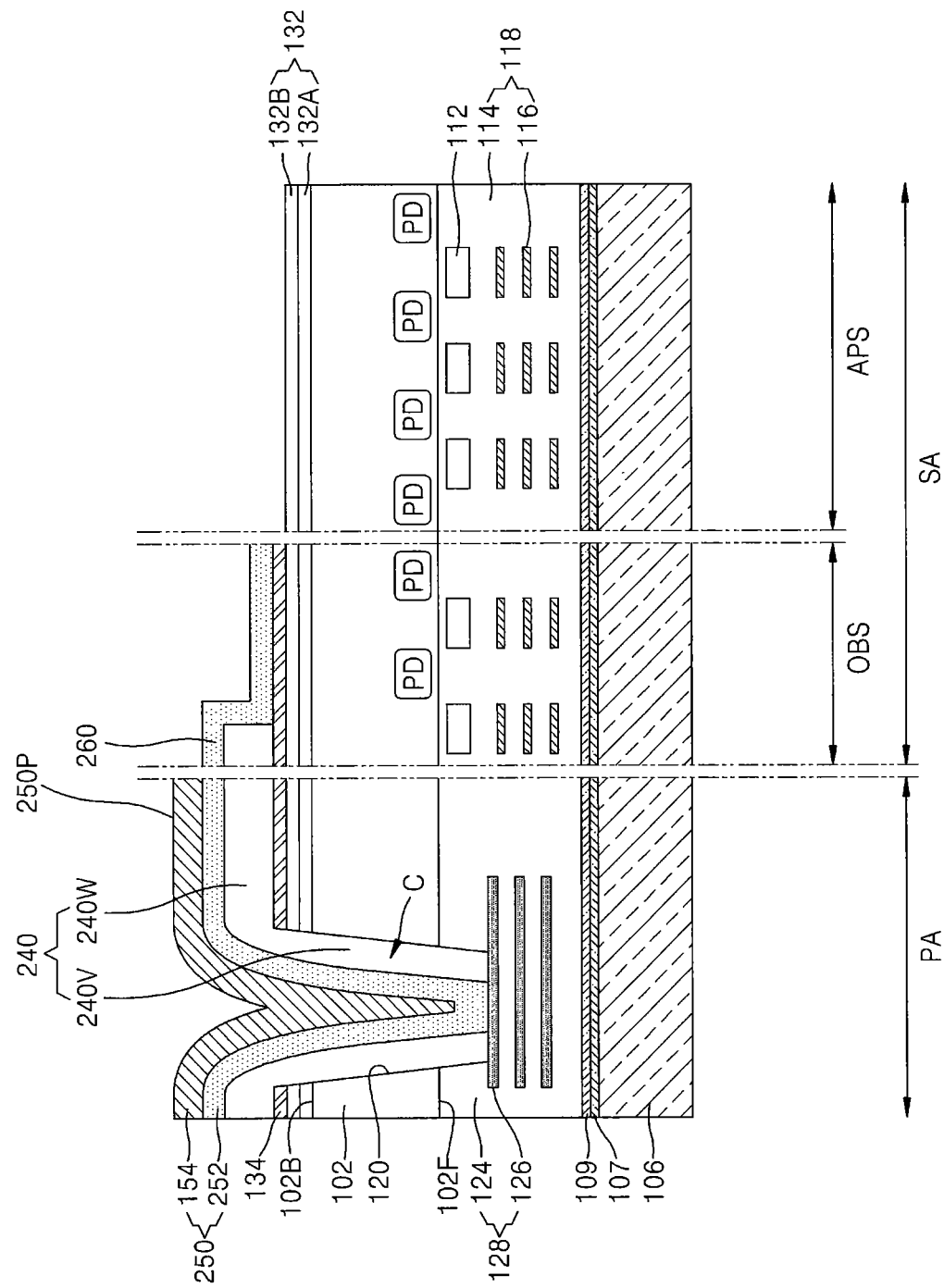

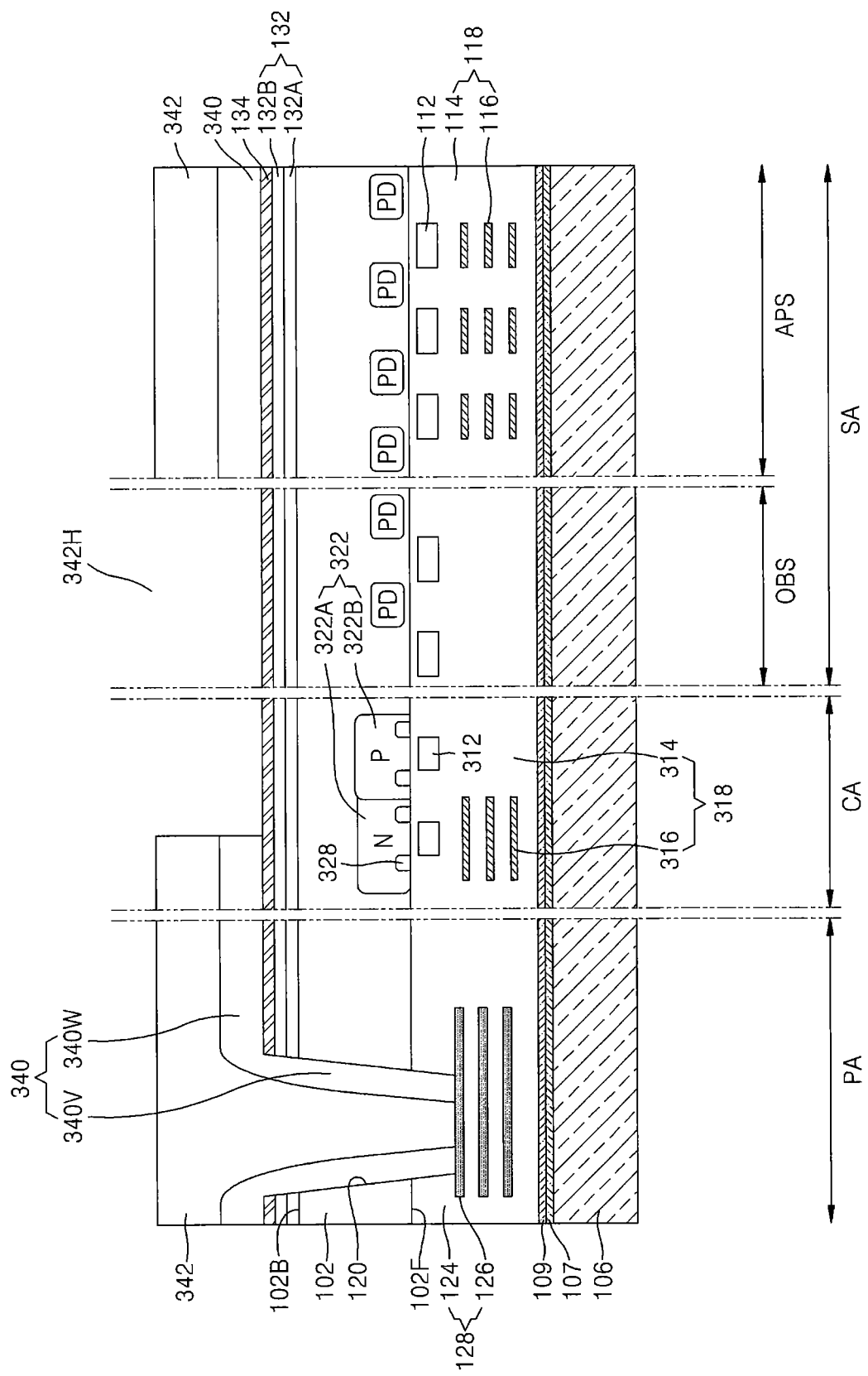

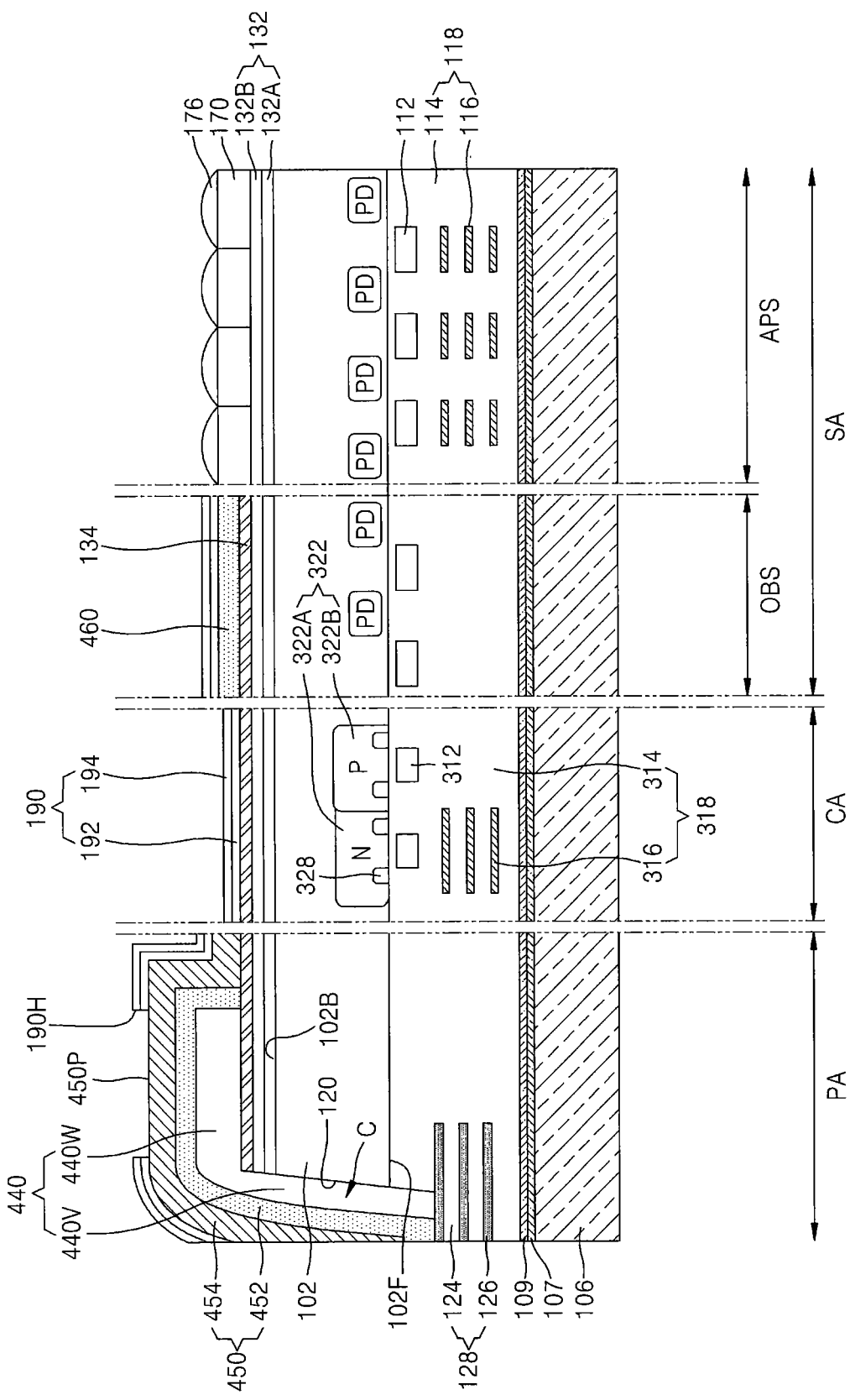

IMAGE SENSOR COMPRISING A LIGHT SHIELDING PATTERN WITH PLURAL PORTIONS SPACED APART ON PIXELS OF A SENSOR ARRAY AREA

CROSS-REFERENCE TO RELATED APPLICATIONS

This application is a continuation of U.S. patent application Ser. No. 15/639,025, filed Jun. 30, 2017, which is a divisional of U.S. patent application Ser. No. 14/204,170, now U.S. Pat. No. 9,741,756, filed Mar. 11, 2014, which claims the benefit of Korean Patent Application No. 10-2013-0026811, filed Mar. 13, 2013 in the Korean Intellectual Property Office, the disclosures of which are incorporated herein in entirety by reference.

BACKGROUND

The inventive concepts relate to image sensors, and more particularly, to image sensors having an optical black sensor area.

Image sensors having improved performance are being used in various fields, such as digital cameras, camcorders, mobile phones, personal communication systems (PCSs), game players, surveillance cameras, and medical microcameras. Image sensors can convert an optical image signal into an electrical image signal. An image sensor may include an active pixel sensor area for receiving incident light and converting the light into an electrical signal and an optical black sensor area for blocking inflow of light and providing a reference of a black signal to the active pixel sensor area. In the manufacturing of the image sensor, when a relatively big step difference exists between the active pixel sensor area and the optical black sensor area while a color filter layer is being formed, thicknesses of color filters adjacent to the optical black sensor area from among a plurality of color filters formed on the active pixel sensor area may be non-uniform due to the step difference. Consequently, problems such as distortion of an image signal or degradation of the color may occur in a portion of the active pixel sensor area that is adjacent to the optical black sensor area.

SUMMARY

Embodiments of the inventive concept provide an image sensor capable of reducing or preventing occurrence of problems, such as distortion of an image signal or degradation of the color, by reducing or minimizing a step difference between the level of a color filter layer formed on an active pixel sensor area, and the level of a light-shielding pattern formed on an optical black sensor area, to provide a color filter layer having a substantially uniform thickness.

According to some embodiments, an image sensor includes a substrate comprising an active pixel sensor area comprising a plurality of pixels, a pad area adjacent the active pixel sensor area, and an optical black sensor area therebetween. A wiring layer extends on a surface of the substrate in the pad area of the substrate, and a light-shielding pattern extends on the surface of the substrate in the optical black sensor area. At least one of the wiring layer and the light-shielding pattern comprises a stepped portion, and a distance between the light shielding pattern and the surface of the substrate is less than a distance between the wiring layer and the surface of the substrate. The surface of the substrate is a backside surface of the image sensor.

In some embodiments, a color filter layer may be provided on the surface of the substrate in the active pixel sensor area. A portion of the color filter layer adjacent a boundary between the optical black sensor area and the active pixel sensor area may have a substantially uniform thickness.

In some embodiments, the light shielding pattern and the wiring layer may be portions of a same conductive metal layer.

In some embodiments, the wiring layer may be separated from the surface of the substrate by an insulating layer.

In some embodiments, the surface of the substrate adjacent the boundary between the optical black sensor area and the active pixel sensor area may be free of the insulating layer.

In some embodiments, the substrate may further include a circuit area between the pad area and the optical black sensor area. A portion of the insulating layer in the circuit area may be recessed relative to a portion thereof in the pad area.

In some embodiments, the light shielding pattern may continuously extend into the circuit area.

In some embodiments, a portion of the light shielding pattern in the circuit area may include the stepped portion.

In some embodiments, the light-shielding pattern may be confined within the optical black sensor area.

In some embodiments, the light shielding pattern in the optical black sensor area may be substantially planar.

In some embodiments, a circuit area of the substrate between the pad area and the optical black sensor area may be free of the insulating layer.

According to further embodiments of the inventive concept, there is provided an image sensor comprising a substrate comprising a sensor array area, a pad area, and a circuit area, wherein the sensor array area comprises a first area including active pixels and a second area including optical back pixels, the pad area is disposed around the sensor array area, and the circuit area is disposed between the sensor array area and the pad area; a wiring layer extending on a level spaced apart from the substrate by a first distance, on the pad area; and a light-shielding pattern comprising a first portion, a second portion, and a third portion, wherein the first portion extends on a level spaced apart from the substrate by a second distance less than the first distance, the second portion is disposed between the first portion and the wiring layer and extends on the same level as the level of the wiring layer, and the third portion is disposed between the first portion and the second portion and is integrally formed with the first portion and the second portion.

The image sensor may further comprise a color filter layer that extends on a level spaced apart from the substrate by a third distance that is less than or equal to the second distance, in the first area.

The second portion and the third portion of the light-shielding pattern may be each positioned on the second area.

The second portion of the light-shielding pattern may extend from the second area to the circuit area, and the third portion of the light-shielding pattern may be positioned on the second area.

The second portion and the third portion of the light-shielding pattern may be each positioned on the circuit area.

The first portion, the second portion, and the third portion of the light-shielding pattern may each comprise the same material as a material used to form the wiring layer.

The image sensor may further comprise an insulation pattern that is interposed between the substrate and the wiring layer and comprises a first top surface portion opposite to the wiring layer, a second top surface portion opposite to the second portion of the light-shielding pattern, and a recessed surface portion positioned between the first top surface portion and the second top surface portion. A bottom surface of the insulation pattern and a bottom surface of the first portion of the light-shielding pattern may be positioned on the same plane.

The image sensor may further comprise a via contact formed within a via hole that penetrates through the substrate in the pad area. The wiring layer may be integrally connected to the via contact. The image sensor may further comprise an insulation pattern that comprises a top surface in contact with the wiring layer on the substrate, a sidewall in contact with the third portion of the light-shielding pattern on the substrate, and a via insulation portion interposed between the substrate and the via contact.

The wiring layer may comprise a first conductive layer formed of the same material as a material used to form the light-shielding pattern; and a second conductive layer formed of a material different from a material used to form the first conductive layer.

The light-shielding pattern may comprise bent portions that are formed between the first portion and the third portion and between the second portion and the third portion, respectively.

According to still further embodiments of the inventive concept, there is provided an image sensor comprising a substrate comprising an active pixel array area comprising a plurality of pixels, and a pad area disposed around the active pixel array area; a wiring layer comprising a via contact portion that penetrates through the substrate in the pad area, and a pad portion that is integrally connected to the via contact portion and extends on a first level spaced apart from the substrate by a first distance in the pad area; and a light-shielding pattern comprising a first portion that extends on a second level spaced apart from the substrate by a second distance, in a first direction parallel to a direction in which a circumferential surface of the substrate extends, in a portion of the active pixel array area, wherein the second distance is less than the first distance. At least one of the wiring layer and the light-shielding pattern comprises a stepped portion extending from the first level to the second level in a second direction different from the first direction.

The stepped portion may be integrally connected to the first portion of the light-shielding pattern.

The image sensor may further comprise a color filter layer formed on a portion of the active pixel array area that is surrounded by the light-shielding pattern.

BRIEF DESCRIPTION OF THE DRAWINGS

Exemplary embodiments of the inventive concept will be more clearly understood from the following detailed description taken in conjunction with the accompanying drawings in which:

FIGS. 9A through 9H are cross-sectional views for explaining a method of fabricating an image sensor according to some embodiments of the inventive concept;

FIGS. 10A through 10J are cross-sectional views for explaining a method of fabricating an image sensor according to some embodiments of the inventive concept;

FIGS. 11A through 11I are cross-sectional views for explaining a method of fabricating an image sensor according to some embodiments of the inventive concept;

DETAILED DESCRIPTION OF THE EMBODIMENTS

Figure 1:
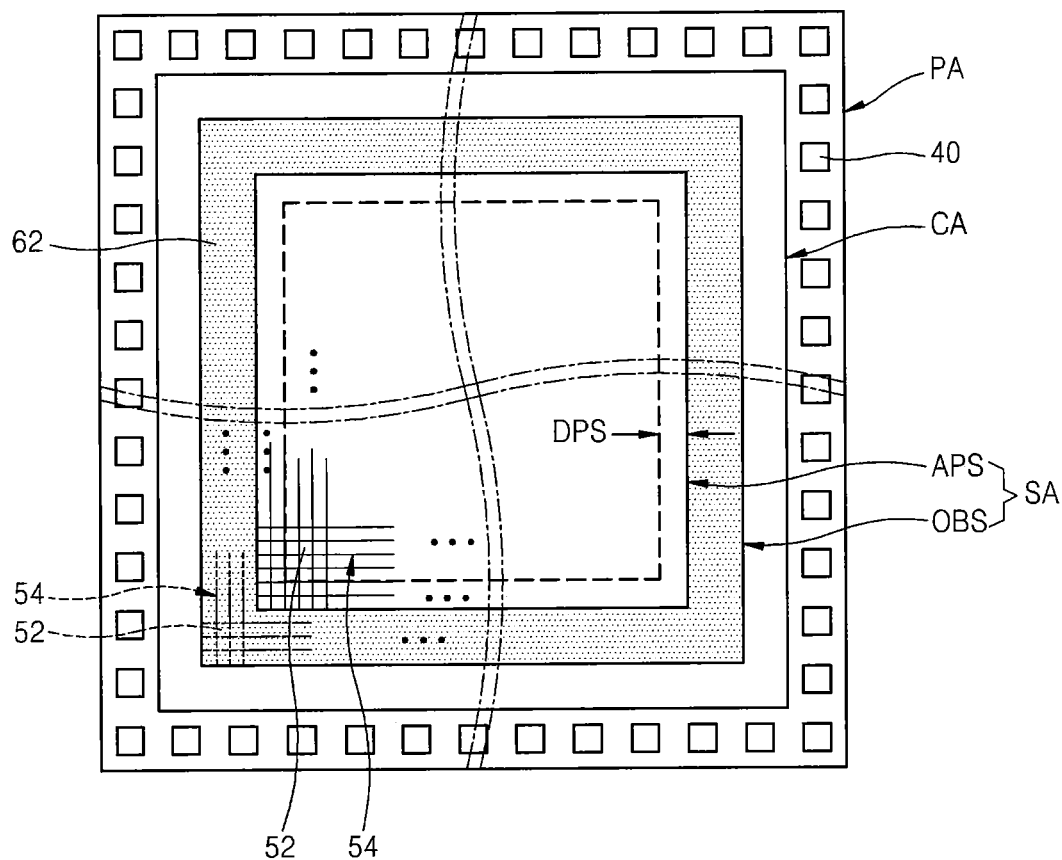
FIG. 1 is a schematic plan view of an image sensor according to some embodiments of the inventive concept.

Hereinafter, the inventive concept will be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the inventive concept to one of ordinary skill in the art. Like reference numerals in the drawings denote like elements, and thus their description will be omitted.

It will be understood that, although the terms first, second, third, etc., may be used herein to describe various elements, regions, layers, sections, and/or components, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept. For example, a first component discussed below could be termed a second component, and similarly, a second component may be termed a first component without departing from the teachings of this disclosure.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The operations of all methods described herein can be performed in any suitable order unless otherwise indicated herein or otherwise clearly contradicted by context. The inventive concept is not limited to the described order of the operations. For example, operations consecutively described herein may be simultaneously performed in practice, or may be executed in the opposite order to the described order.

As such, variations from the shapes of the illustrations as a result, for example, of manufacturing techniques and/or tolerances, are to be expected. Thus, embodiments of the inventive concept should not be construed as being limited to the particular shapes of regions illustrated herein but are to include deviations in shapes that result, for example, from manufacturing. As used herein, the term "and/or" includes any and all combinations of one or more of the associated listed items. Expressions such as "at least one of," when preceding a list of elements, modify the entire list of elements and do not modify the individual elements of the list.

Figure 2:
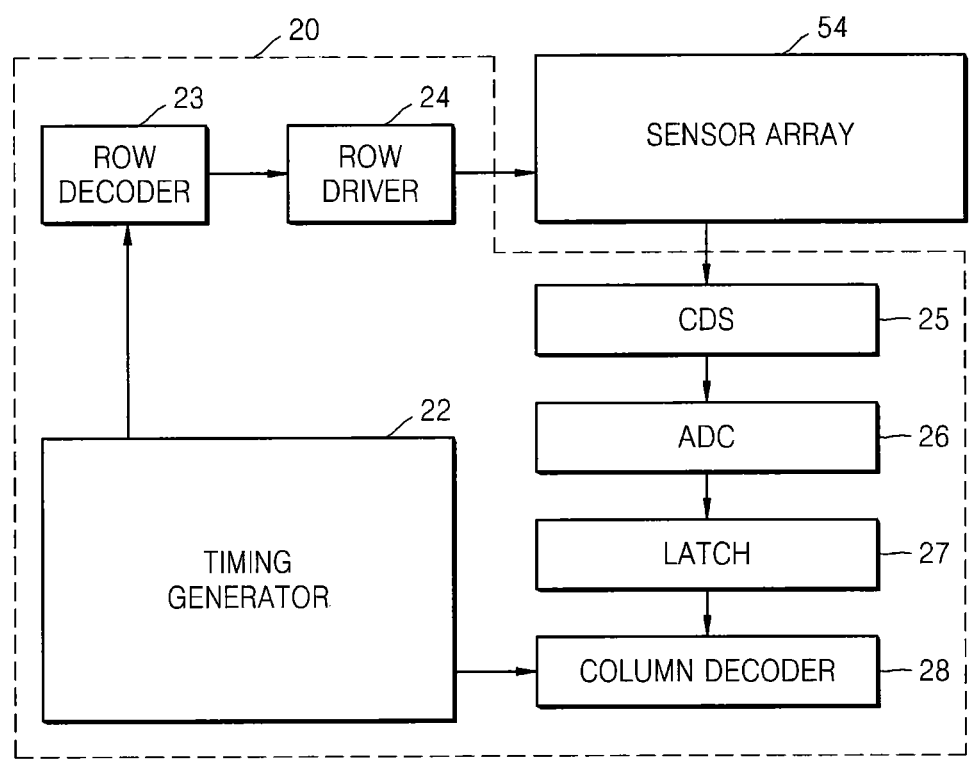
FIG. 2 is a block diagram of a portion of the image sensor of FIG. 1.

FIG. 1 is a schematic plan view of an image sensor 10 according to some embodiments of the inventive concept. FIG. 2 is a block diagram of a portion of the image sensor 10 of FIG. 1.

Referring to FIGS. 1 and 2, the image sensor 10 includes a sensor array area SA, a circuit area CA including a plurality of circuits 20 formed around the sensor array area SA, and a pad area PA including a plurality of pads 40 arranged around the circuit area CA. The sensor array area SA includes an active pixel sensor area APS including active pixels for generating active signals corresponding to wavelengths of external light, and an optical black sensor area OBS including optical black pixels for generating optical black signals by blocking the inflow of external light. A dummy pixel sensor area DPS is formed on an edge portion of the active pixel sensor area APS that is close to the optical black sensor area OBS. In some embodiments, the dummy pixel sensor area DPS may not be included.

In some embodiments, the pads 40 formed on the pad area PA receive and transmit an electrical signal from and to an external device. In other embodiments, the pads 40 transmit driving power, such as a power supply voltage or a ground voltage, received from an external source to the circuits disposed on the circuit area CA.

The sensor array area SA includes a sensor array 54 including a plurality of unit pixels 52. Each of the unit pixels 52 includes a photoelectric conversion device.

The circuit area CA includes a plurality of CMOS transistors, and provides a certain signal to each of the unit pixels 52 of the sensor array area SA or controls an output signal of each of the unit pixels 52.

As shown in FIG. 2, each of the circuits 20 formed on the circuit area CA includes a timing generator 22, a row decoder 23, a row driver 24, a correlated double sampler (CDS) 25, an analog to digital converter (ADC) 26, a latch 27, and a column decoder 28.

The sensor array 54 on the sensor array area SA is driven by receiving a plurality of driving signals such as a row selection signal, a reset signal, and a charge transmission signal, from the row driver 24. The electrical signal output by the sensor array 54 is provided to the CDS 25.

The timing generator 22 provides a timing signal and a control signal to the row decoder 23 and the column decoder 28.

The row driver 24 provides a plurality of driving signals for driving the unit pixels 52, to the sensor array 54 of the sensor array area SA, according to a result of the decoding performed by the row decoder 23. When the unit pixels 52 are arranged in a matrix, a driving signal is provided to each row of the matrix.

The CDS 25 receives the electrical signal from the sensor array 54 of the sensor array area SA and maintains and samples the electrical signal. In other words, a specific noise level and a signal level of the electrical signal output by the sensor array 54 are sampled twice to generate a difference level corresponding to a difference between the noise level and the signal level.

The ADC 26 converts an analog signal corresponding to the difference level into a digital signal and outputs the digital signal.

The latch 27 latches the digital signal. A result of the latching is sequentially output to an image signal output unit according to a result of the decoding performed by the column decoder 28.

In some embodiments, the image sensor 10 may be a backside illumination type CMOS image sensor. Light is incident upon a portion other than the optical black sensor area OBS of the sensor array area SA on a backside surface of the image sensor 10 exposing the pads 40.

Figure 3:
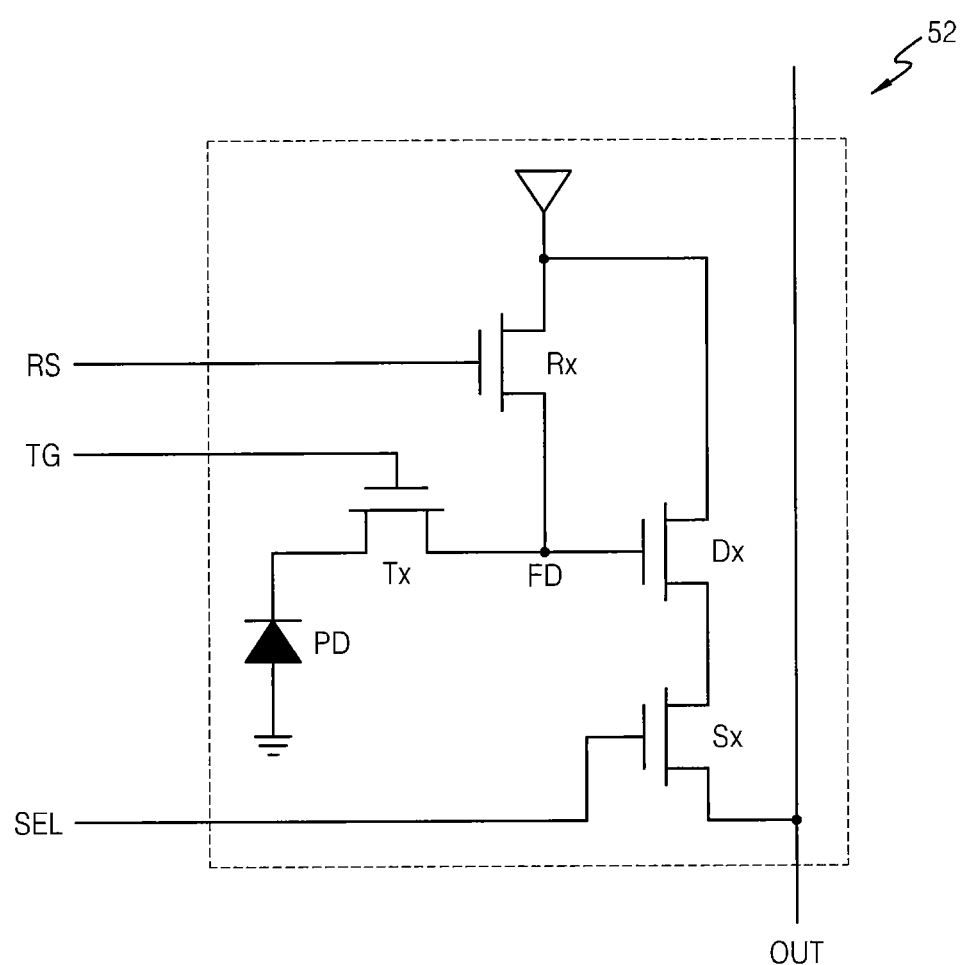
FIG. 3 is an equivalent circuit diagram of a unit pixel of a sensor array in a sensor array area included in the image sensor of FIG. 1.

FIG. 3 is an equivalent circuit diagram of a unit pixel 52 of the sensor array 54 in the sensor array area SA of FIG. 1.

Referring to FIG. 3, the unit pixel 52 includes a photodiode PD, which receives light, generates photocharge via photoelectric conversion, and accumulates the generated photocharge; a transfer transistor Tx, which transfers the photocharge generated by the photodiode PD to a floating diffusion region FD; a reset transistor Rx, which periodically resets the photocharge stored in the floating diffusion region FD; a drive transistor Dx, which serves as a source follower buffer amplifier and buffers a signal corresponding to the photocharge stored in the floating diffusion region FD; and a selection transistor Sx, which performs switching and addressing to select the unit pixel 52. In FIG. 3, reference character "RS" denotes a signal applied to a gate of the reset transistor Rx, reference character "TG" denotes a signal applied to a gate of the transfer transistor Tx, and reference character "SEL" denotes a signal applied to a gate of the selection transistor Sx. In FIG. 3, the unit pixel 52 includes one photodiode PD and four MOS transistors Tx, Rx, Dx, and Sx. However, embodiments of the inventive concepts are not limited to this.

The circuit area CA may include a plurality of CMOS logic areas formed of a plurality of CMOS transistors. The CMOS logic areas may provide a certain signal to each pixel included in the sensor array area SA or control an output signal of each pixel.

Referring back to FIG. 1, a plurality of unit pixels 52 formed on the optical black sensor area OBS in the sensor array area SA are covered with a light-shielding pattern 62. The unit pixels 52 formed on the optical black sensor area OBS may be used to measure a dark current. The same power as power supplied to a portion of the sensor array 54 in the active pixel sensor area APS may be supplied to a portion of the sensor array 54 in the optical black sensor area OBS. Accordingly, it is possible to transmit the same noise as power supply noise generated in the active pixel sensor area APS via an output signal of the optical black sensor area OBS. Since inflow of light into the portion of the sensor array 54 existing in the optical black sensor area OBS is blocked by the light-shielding pattern 62, power supply noise may be transmitted via a black level signal generated by the portion of the sensor array 54 existing in the optical black sensor area OBS.

In some embodiments, the light-shielding pattern 62 may be formed only on the optical black sensor area OBS. In other embodiments, the light-shielding pattern 62 may be formed to cover the optical black sensor area OBS and the circuit area CA. A portion or the entire portion of the circuit area CA may be covered with the light-shielding pattern 62. These embodiments will now be described in more detail with reference to FIGS. 4A through 11I.

Figure 4A:
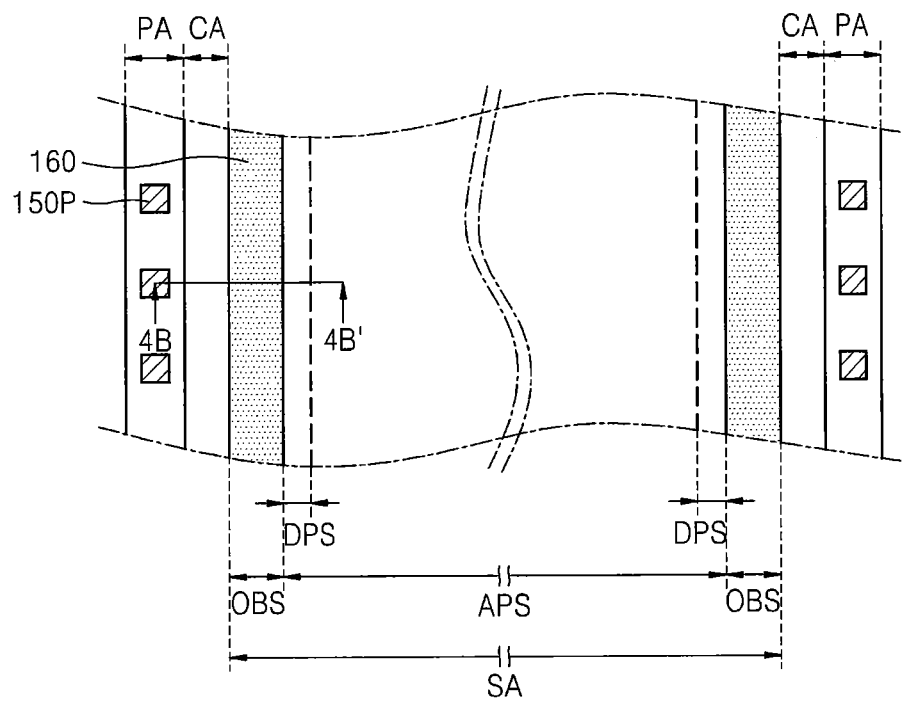
FIG. 4A is a cross-sectional view showing parts of an image sensor according to some embodiments of the inventive concept.
Figure 4B:
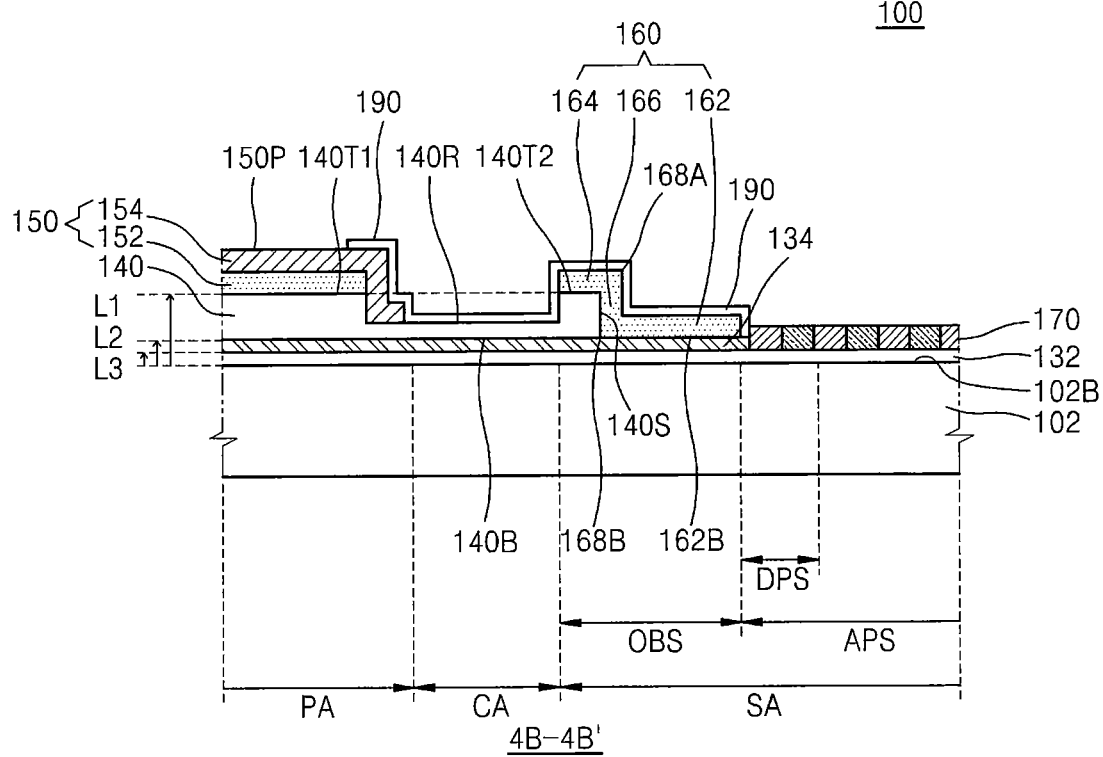
FIG. 4B is a cross-sectional view taken along line 4B-4B' of FIG. 4A.

FIG. 4A is a cross-sectional view showing parts of an image sensor 100 according to some embodiments of the inventive concept. FIG. 4B is a cross-sectional view taken along line 4B-4B' of FIG. 4A. The same reference numerals in FIGS. 4A and 4B as those in FIGS. 1 through 3 denote the same elements, and thus their description will be omitted for simplification of explanation.

Referring to FIGS. 4A and 4B, a substrate 102 of the image sensor 100 includes the sensor array area SA, the pad area PA disposed around the sensor array area SA, and the circuit area CA disposed between the sensor array area SA and the pad area PA. The active pixel sensor area APS and the dummy pixel sensor area DPS in the sensor array area SA may include active pixels that generate active signals corresponding to the wavelengths of external light. The optical black sensor area OBS of the sensor array area SA may include optical black pixels that generate optical black signals by blocking inflow of external light.

In some embodiments, the substrate 102 is a P-type semiconductor substrate. For example, the substrate 102 may be a P-type silicon substrate. In other embodiments, the substrate 102 may include a P-type bulk substrate and a P-type or N-type epitaxial layer grown on the P-type bulk substrate. Alternatively, the substrate 102 may include an N-type bulk substrate and a P-type or N-type epitaxial layer grown on the N-type bulk substrate. The substrate 102 may also be an organic plastic substrate.

In the sensor array area SA, a plurality of unit pixels 52 (see FIG. 1) are formed within the substrate 102.

A wiring layer 150 extends on the pad area PA. The wiring layer 150 includes a first conductive layer 152 extending on a level spaced apart from a backside 102B of the substrate 102 by a first vertical distance L1, and a second conductive layer 154 covering the first conductive layer 152. The first conductive layer 152 and the second conductive layer 154 may include different materials. The first conductive layer 152 may include a light-shielding material. For example, the first conductive layer 152 may include a first main metal layer formed of W, Au, Ag, Cu, Al, or a combination thereof. The second conductive layer 154 may include a second main metal layer formed of Al, Cu, CuSn, CuMg, CuNi, CuZn, CuPd, CuAu, CuRe, CuW, W, W alloy, or a combination thereof. In some embodiments, the first conductive layer 152 may further include a first conductive barrier layer that covers at least a portion of the surface of the first main metal layer. The second conductive layer 154 may further include a second conductive barrier layer that covers at least a portion of the surface of the second main metal layer. In some embodiments, the first conductive barrier layer and the second conductive barrier layer may be each formed of Ti, TiN, Ta, TaN, Ru, Co, Mn, WN, Ni, NiB, or a combination thereof. In the first conductive layer 152 and the second conductive layer 154, the first conductive barrier layer and the second conductive barrier layer may reduce or prevent the first main metal layer and the second main metal layer, respectively, from being oxidized. The first conductive barrier layer and the second conductive barrier layer may also reduce or prevent the first main metal layer and the second main metal layer, respectively, from reacting with other materials around them.

A light-shielding pattern 160 is formed on the optical black sensor area OBS of the sensor array area SA. The light-shielding pattern 160 includes a first portion 162 extending on a level spaced apart from the backside 102B of the substrate 102 of the substrate 102 by a second vertical distance L2, which is less than the first vertical distance L1, a second portion 164 disposed between the first portion 162 and the wiring layer 150 and extending on the same level as the level of the first conductive layer 152 of the wiring layer 150, and a third portion 166 disposed between the first and second portions 162 and 164 and integrally formed with the first and second portions 162 and 164.

The light-shielding pattern 160 includes a first bent portion 168A between the second portion 164 and the third portion 166, and a second bent portion 168B between the first portion 162 and the third portion 166.

In some embodiments, the light-shielding pattern 160 may include the same material as a material used to form the first conductive layer 152 of the wiring layer 150. For example, the first conductive layer 152 of the wiring layer 150 and the light-shielding pattern 160 may each include W, Au, Ag, Cu, Al, or a combination thereof.

A color filter layer 170 is formed on the active pixel sensor area APS of the sensor array area SA. The color filter layer 170 extends on a level spaced apart from the backside 102B of the substrate 102 by a third vertical distance L3, which is less than the second vertical distance L2. However, embodiments of the inventive concepts are not limited to this. For example, the color filter layer 170 may extend on a level spaced apart from the backside 102B of the substrate 102 by the second vertical distance L2, namely, on the same level as the level of the first portion 162 of the light-shielding pattern 160. The color filter layer 170 may include a plurality of R areas, a plurality of G areas, and a plurality of B areas.

An insulation pattern 140 is formed between the substrate 102 and the wiring layer 150. The insulation pattern 140 extends to cover the pad area PA, the circuit area CA, and the optical black sensor area OBS of the substrate 102. The insulation pattern 140 includes a first top surface portion 140T1 on or adjacent to the first conductive layer 152 of the wiring layer 150, a second top surface portion 140T2 on or adjacent to the second portion 164 of the light-shielding pattern 160, and a recessed surface portion 140R disposed between the first top surface portion 140T1 and the second top surface portion 140T2. A bottom surface 140B of the insulation pattern 140 faces the backside 102B of the substrate 102. The bottom surface 140B of the insulation pattern 140 may be positioned on the same level as the level of a bottom surface 162B of the first portion 162 of the light-shielding pattern 160. In some embodiments, the insulation pattern 140 may be formed of an oxide layer, a nitride layer, a carbide layer, or a combination thereof.

The first conductive layer 152 of the wiring layer 150, and the light-shielding pattern 160 each may include a conductive barrier layer that contacts the insulation pattern 140. The conductive barrier layer may be formed of Ti, TiN, Ta, TaN, Ru, Co, Mn, WN, Ni, NiB, or a combination thereof.

The third portion 166 of the light-shielding pattern 160 covers a sidewall 140S of the insulation pattern 140. The third portion 166 of the light-shielding pattern 160 extends along the sidewall 140S of the insulation pattern 140. The third portion 166 may extend in a direction different from the direction in which the circumferential surface of the substrate 102 extends. In some embodiments, the third portion 166 may extend in a direction perpendicular to the direction in which the circumferential surface of the substrate 102 extends. In other embodiments, the sidewall 140S of the insulation pattern 140 may be an inclined surface inclined with respect to the direction in which the circumferential surface of the substrate 102 extends, and the third portion 166 may extend along the inclined surface.

Insulation layers 132 and 134 are both interposed between the backside 102B of the substrate 102 and the insulation pattern 140 and between the backside 102B of the substrate 102 and the light-shielding pattern 160. The insulation layer 132 corresponds to a first passivation layer 132 covering the backside 102B of the substrate 102, and the insulation layer 134 corresponds to an etching stop layer 134 interposed between the first passivation layer 132 and the insulation pattern 140. The first passivation layer 132 may be formed of a single layer or multiple layers. In some embodiments, the first passivation layer 132 may be formed of a silicon oxide layer, a metal oxide layer, or a combination thereof. The etching stop layer 134 may be formed of a silicon nitride layer.

The insulation pattern 140, a portion of the wiring layer 150, and the light-shielding pattern 160 are each covered with a second passivation layer 190. The second passivation layer 190 may be formed of a single layer or multiple layers. In some embodiments, the second passivation layer 190 may be formed of a silicon oxide layer, a silicon nitride layer, or a combination thereof.

The wiring layer 150 includes a pad portion 150P. The pad portion 150P may be exposed to the outside of the image sensor 100. Driving power may be received from an external source via the pad portion 150P.

In the embodiment illustrated in FIG. 4B, the first portion 162, the second portion 164, and the third portion 166 of the light-shielding pattern 160 are each disposed on and confined within the optical black sensor area OBS, but embodiments of the inventive concepts are not limited thereto. For example, at least a portion of the light-shielding pattern 160 may be disposed on an area deviating from or otherwise extending beyond the optical black sensor area OBS.

The image sensor 100 may constitute or define a backside illumination image sensor in which light is incident upon a portion other than the optical black sensor area OBS of the sensor array area SA on the backside 102B of the substrate 102.

Figure 5A:
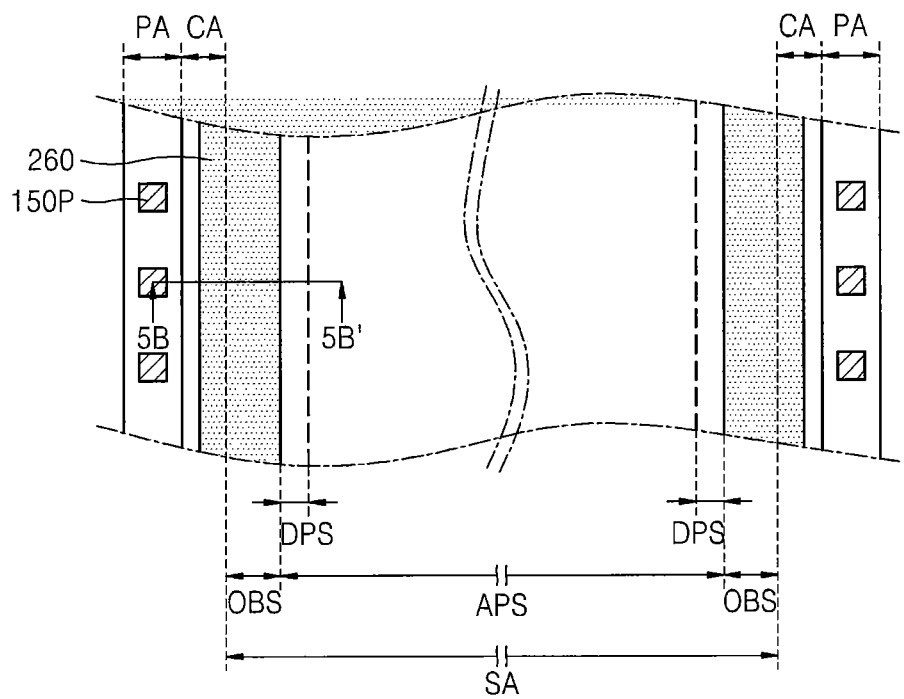
FIG. 5A is a cross-sectional view showing parts of an image sensor according to some embodiments of the inventive concept.
Figure 5B:
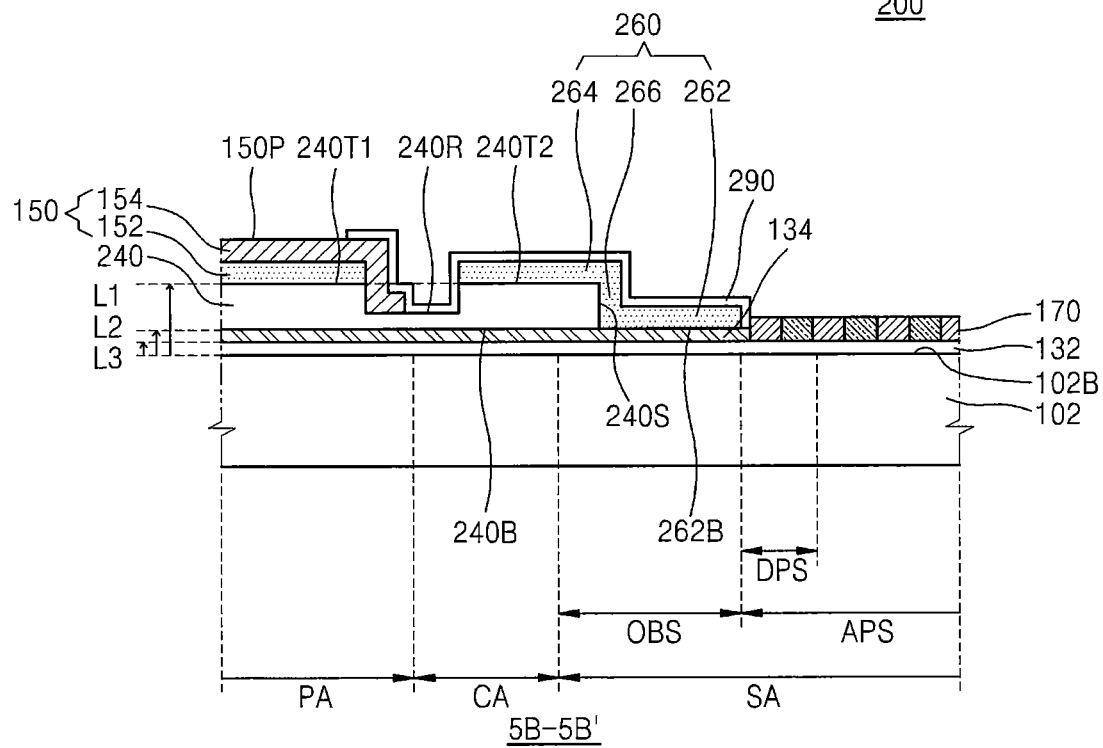
FIG. 5B is a cross-sectional view taken along line 5B-5B' of FIG. 5A.

FIG. 5A is a cross-sectional view showing parts of an image sensor 200 according to some embodiments of the inventive concept. FIG. 5B is a cross-sectional view taken along line 5B-5B' of FIG. 5A. The same reference characters and numerals in FIGS. 5A and 5B as those in FIGS. 1 through 4B denote the same elements, and thus their description will be omitted for simplification of explanation.

Referring to FIGS. 5A and 5B, a light-shielding pattern 260 extends from the optical black sensor area OBS to the circuit area CA, on a substrate 102 of the image sensor 200. The light-shielding pattern 260 includes a first portion 262 extending on a level spaced apart from the backside 102B of the substrate 102 by the second vertical distance L2, which is less than the first vertical distance L1, a second portion 264 disposed between the first portion 262 and the wiring layer 150 and extending on the same level as the level of the first conductive layer 152 of the wiring layer 150, and a third portion 266 disposed between the first and second portions 262 and 264 and integrally formed with the first and second portions 262 and 264. The first portion 262 of the light-shielding pattern 260 is positioned on the optical black sensor area OBS. The second portion 264 of the light-shielding pattern 260 extends from the optical black sensor area OBS to the circuit area CA. The third portion 266 of the light-shielding pattern 260 is positioned on the optical black sensor area OBS. A detailed description of the light-shielding pattern 260 is mostly the same as that of the light-shielding pattern 160 made with reference to FIGS. 4A and 4B.

An insulation pattern 240 is formed between the substrate 102 and the wiring layer 150. The insulation pattern 240 extends to cover the pad area PA, the circuit area CA, and the optical black sensor area OBS of the substrate 102. The insulation pattern 240 includes a first top surface portion 240T1 on or adjacent to the first conductive layer 152 of the wiring layer 150, a second top surface portion 240T2 on or adjacent to the second portion 264 of the light-shielding pattern 260, and a recessed surface portion 240R disposed between the first top surface portion 240T1 and the second top surface portion 240T2. A bottom surface 240B of the insulation pattern 240 faces the backside 102B of the substrate 102, and a sidewall 240S of the insulation pattern 240 faces the third portion 266 of the light-shielding pattern 260. The bottom surface 240B of the insulation pattern 240 may be positioned on the same level as the level of a bottom surface 262B of the first portion 262 of the light-shielding pattern 260. A detailed description of the insulation pattern 240 is mostly the same as that of the insulation pattern 140 made above with reference to FIGS. 4A and 4B.

The insulation pattern 240, a portion of the wiring layer 150, and the light-shielding pattern 260 are each covered with a second passivation layer 290. The second passivation layer 290 may be formed of a silicon oxide layer, a silicon nitride layer, or a combination thereof.

The image sensor 200 may constitute or define a backside illumination image sensor in which light is incident upon a portion other than the optical black sensor area OBS of the sensor array area SA on the backside 102B of the substrate 102.

Figure 6:
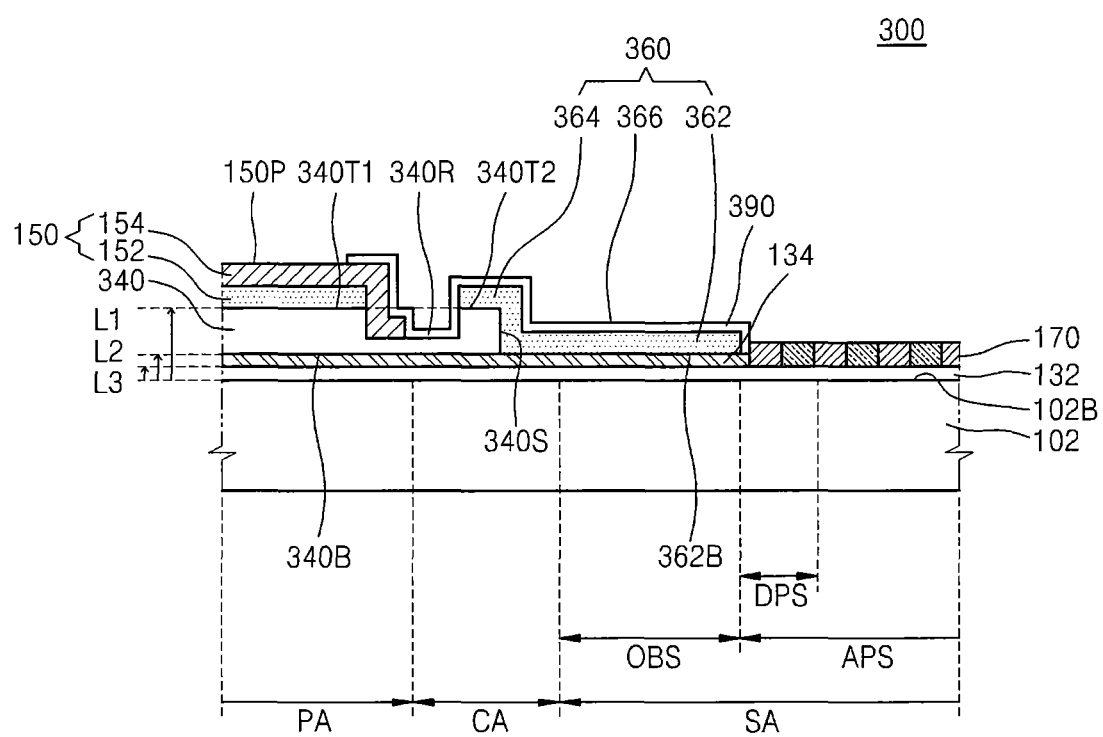
FIG. 6 is a cross-sectional view showing parts of an image sensor according to some embodiments of the inventive concept.

FIG. 6 is a cross-sectional view showing parts of an image sensor 300 according to some embodiments of the inventive concept. FIG. 6 illustrates a cross-section taken along line 5B-5B' of FIG. 5A, according to another embodiment of the inventive concept. The same reference characters and numerals in FIG. 6 as those in FIGS. 1 through 4B denote the same elements, and thus their description will be omitted for simplification of explanation.

Referring to FIG. 6, a light-shielding pattern 360 extends from the optical black sensor area OBS to the circuit area CA, on the substrate 102 of the image sensor 300. The light-shielding pattern 360 includes a first portion 362 extending on a level spaced apart from the backside 102B of the substrate 102 by the second vertical distance L2, which is less than the first vertical distance L1, a second portion 362 disposed between the first portion 364 and the wiring layer 150 and extending on the same level as the level of the first conductive layer 152 of the wiring layer 150, and a third portion 364 disposed between the first and second portions 362 and 362 and integrally formed with the first and second portions 364 and 366. The first portion 362 of the light-shielding pattern 360 extends from the optical black sensor area OBS to the circuit area CA. The second portion 364 and the third portion 366 of the light-shielding pattern 360 are positioned on the circuit area CA. A detailed description of the light-shielding pattern 360 is mostly the same as that of the light-shielding pattern 160 made above with reference to FIGS. 4A and 4B.

An insulation pattern 340 is formed between the substrate 102 and the wiring layer 150. The insulation pattern 340 extends to cover the pad area PA and the circuit area CA of the substrate 102. The insulation pattern 340 includes a first top surface portion 340T1 on or adjacent to the first conductive layer 152 of the wiring layer 150, a second top surface portion 340T2 on or adjacent to the second portion 364 of the light-shielding pattern 360, and a recessed surface portion 340R disposed between the first top surface portion 340T1 and the second top surface portion 340T2. A bottom surface 340B of the insulation pattern 340 faces the backside 102B of the substrate 102, and a sidewall 340S of the insulation pattern 340 faces the third portion 366 of the light-shielding pattern 360. The bottom surface 340B of the insulation pattern 340 may be positioned on the same level as the level of a bottom surface 362B of the first portion 362 of the light-shielding pattern 360. A detailed description of the insulation pattern 340 is mostly the same as that of the insulation pattern 140 made above with reference to FIGS. 4A and 4B.

The insulation pattern 340, a portion of the wiring layer 150, and the light-shielding pattern 360 are each covered with a second passivation layer 390. The second passivation layer 390 may be formed of a silicon oxide layer, a silicon nitride layer, or a combination thereof.

The image sensor 300 may constitute or define a backside illumination image sensor in which light is incident upon a portion other than the optical black sensor area OBS of the sensor array area SA on the backside 102B of the substrate 102.

Figure 7A:
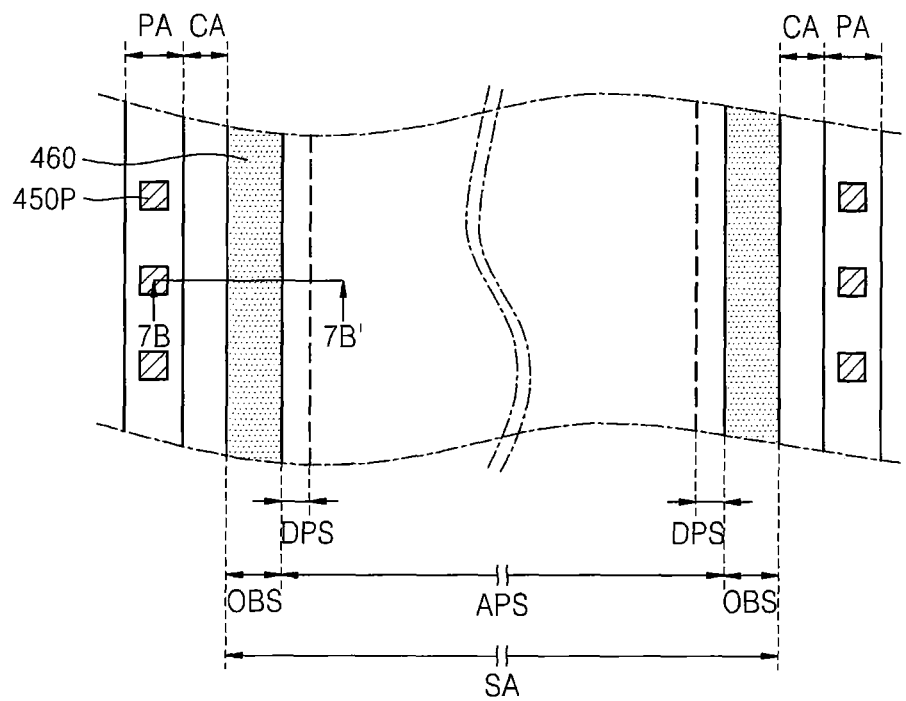
FIG. 7A is a cross-sectional view showing parts of an image sensor according to some embodiments of the inventive concept.
Figure 7B:
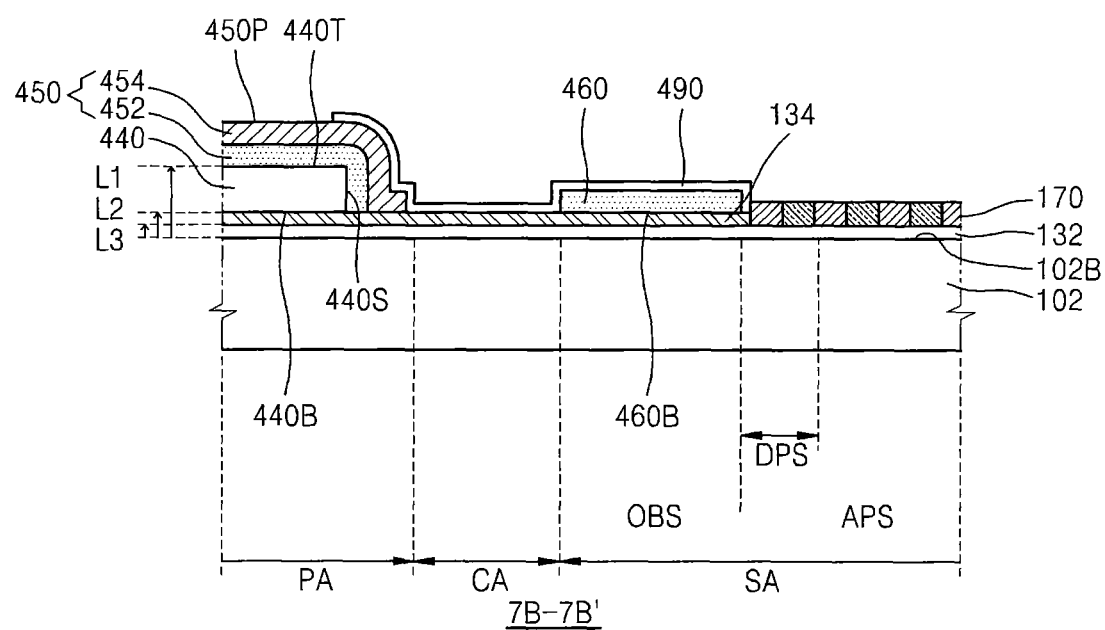
FIG. 7B is a cross-sectional view taken along line 7B-7B' of FIG. 7A.

FIG. 7A is a cross-sectional view showing parts of an image sensor 400 according to some embodiments of the inventive concept. FIG. 7B is a cross-sectional view taken along line 7B-7B' of FIG. 7A. The same reference characters and numerals in FIGS. 7A and 7B as those in FIGS. 1 through 4B denote the same elements, and thus their description will be omitted for simplification of explanation.

Referring to FIGS. 7A and 7B, a wiring layer 450 is formed on the pad area PA of the substrate 102 of the image sensor 400. The wiring layer 450 includes a first conductive layer 452 extending on a level spaced apart from the backside 102B of the substrate 102 by the first vertical distance L1, and a second conductive layer 454 covering the first conductive layer 452. The wiring layer 450 includes a pad portion 450P. The pad portion 450P may be exposed to the outside of the image sensor 400. Driving power may be received from an external source via the pad portion 450P. Details of the first conductive layer 452 and the second conductive layer 454 of the wiring layer 450 will be referred to the description of the first conductive layer 152 and the second conductive layer 154 of the wiring layer 150 made with reference to FIGS. 4A and 4B.

A light-shielding pattern 460 is formed on the optical black sensor area OBS of the substrate 102. The light-shielding pattern 460 extends on a level spaced apart from the backside 102B of the substrate 102 by the second vertical distance L2, which is less than the first vertical distance L1. The light-shielding pattern 460 may extend flat without being stepped, on the optical black sensor area OBS. Details of the material used to form the light-shielding pattern 460 will be referred to the description about the light-shielding pattern 160 made above with reference to FIGS. 4A and 4B.

An insulation pattern 440 is formed between the substrate 102 and the wiring layer 450. The insulation pattern 440 extends on the pad area PA. The insulation pattern 440 includes a top surface 440T and a sidewall 440S each facing the first conductive layer 452 of the wiring layer 450. A bottom surface 440B of the insulation pattern 440 faces the backside 102B of the substrate 102. The insulation pattern 440 and the light-shielding pattern 460 are separated from each other with the circuit area CA interposed therebetween. The bottom surface 440B of the insulation pattern 440 may be positioned on the same level as the level of a bottom surface 460B of the light-shielding pattern 460. A detailed description of the insulation pattern 440 is similar to that of the insulation pattern 140 made above with reference to FIGS. 4A and 4B.

A portion of the wiring layer 450 and the light-shielding pattern 460 are each covered with a second passivation layer 490. The second passivation layer 490 may be formed of a silicon oxide layer, a silicon nitride layer, or a combination thereof.

The image sensor 400 may constitute or define a backside illumination image sensor in which light is incident upon a portion other than the optical black sensor area OBS of the sensor array area SA on the backside 102B of the substrate 102.

In the image sensors 100, 200, 300, and 400 of FIGS. 4A through 7B, at least a portion of an insulation layer interposed between the substrate 102 and each of the light-shielding patterns 160, 260, 360, and 460 formed on the optical black sensor area OBS of the substrate 102 is removed so that at least a portion of each of the light-shielding patterns 160, 260, 360, and 460 is relatively closer to the substrate 102. In other words, portions of the light-shielding patterns 160, 260, 360, 460 adjacent an edge or boundary between the optical black sensor area OBS and the active pixel sensor area APS are free of the insulation pattern that separates the wiring layers 150, 250, 350, 450 from the backside 102B of the substrate 102 in the pad area PA. Therefore, a step difference between the level of the color filter layer 170 formed on the active pixel sensor area APS and the level of each of the light-shielding patterns 160, 260, 360, and 460 formed on the optical black sensor area OBS may be reduced or minimized. Accordingly, when the color filter layer 170 including a plurality of color filters is formed, the thicknesses of color filters positioned adjacent to the optical black sensor area OBS of the active pixel sensor area APS may be reduce or prevented from being non-uniform, and problems such as distortion of an image signal and degradation of the color may be reduce or prevented from occurring. As such, portions of the color filter layer 170 adjacent the boundary between the optical black sensor area OBS and the active pixel sensor area APS may have a substantially uniform thickness.

FIGS. 8A through 8O are cross-sectional views for explaining a method of fabricating an image sensor according to some embodiments of the inventive concept. FIGS. 8A through 8O illustrates a method of fabricating the image sensor 100 of FIGS. 4A and 4B. FIGS. 8A through 8O illustrate only a part of each of the active pixel sensor area APS, the optical black sensor area OBS, and the pad area PA of the substrate 102. The same reference numerals in FIGS. 8A through 8O as those in FIGS. 1 through 4B denote the same elements, and thus their description will be omitted for simplification of explanation.

Referring to FIG. 8A, a semiconductor epitaxial layer is grown on a semiconductor substrate 104 to produce a substrate 102 including the semiconductor epitaxial layer. The sensor array area SA (see FIG. 1), the circuit area CA (see FIG. 1), and the pad area PA (see FIG. 1) are defined in the substrate 102. The sensor array area SA includes the active pixel sensor area APS and the optical black sensor area OBS.

In the sensor array area SA, a plurality of unit pixels 52 (see FIG. 1) are formed within the substrate 102. To form the unit pixels 52, photoelectric conversion devices, such as photodiodes PDs, and a plurality of impurity diffusion regions are formed within the substrate 102, and a plurality of gate electrodes 112 are formed on a front side 102F of the substrate 102, in the sensor array area SA.

Then, a multi-layered wiring structure 118 including an interlayer insulation layer 114, covering the front side 102F of the substrate 102, and a plurality of wiring lines 116, at least some of which are insulated from each other by the interlayer insulation layer 114, is formed in the sensor array area SA. While the multi-layered wiring structure 118 is being formed in the sensor array area SA, a multi-layered wiring structure 128 including an interlayer insulation layer 124 and a plurality of wiring lines 126, at least some of which are insulated from each other by the interlayer insulation layer 124, is formed in the pad area PA.

In some embodiments, the interlayer insulation layers 114 and 124 may each be formed of a plurality of layers. In the sensor array area SA and the pad area PA, wiring lines to be formed on the same level from among the wiring lines 116 and 126 may be formed in the same process.

In some embodiments, the interlayer insulation layers 114 and 124 may each be formed of at least one selected from the group consisting of a flowable oxide (FOX), a high density plasma (HDP) oxide, tonen silazene (TOSZ), spin on glass (SOG), and undoped silica glass (USG).

Referring to FIG. 8B, a support substrate 106 is attached onto the multi-layered wiring structures 118 and 128. In some embodiments, to attach the support substrate 106 onto the multi-layered wiring structures 118 and 128, a first adhesion layer 107 may be attached to the support substrate 106, a second adhesion layer 109 may be attached to the multi-layered wiring structures 118 and 128. Then, the multi-layered wiring structures 118 and 128 and the support substrate 106 may be overlapped with each other so that the first and second adhesion layers 107 and 109 face each other, and then may be laminated.

Figure 8C:
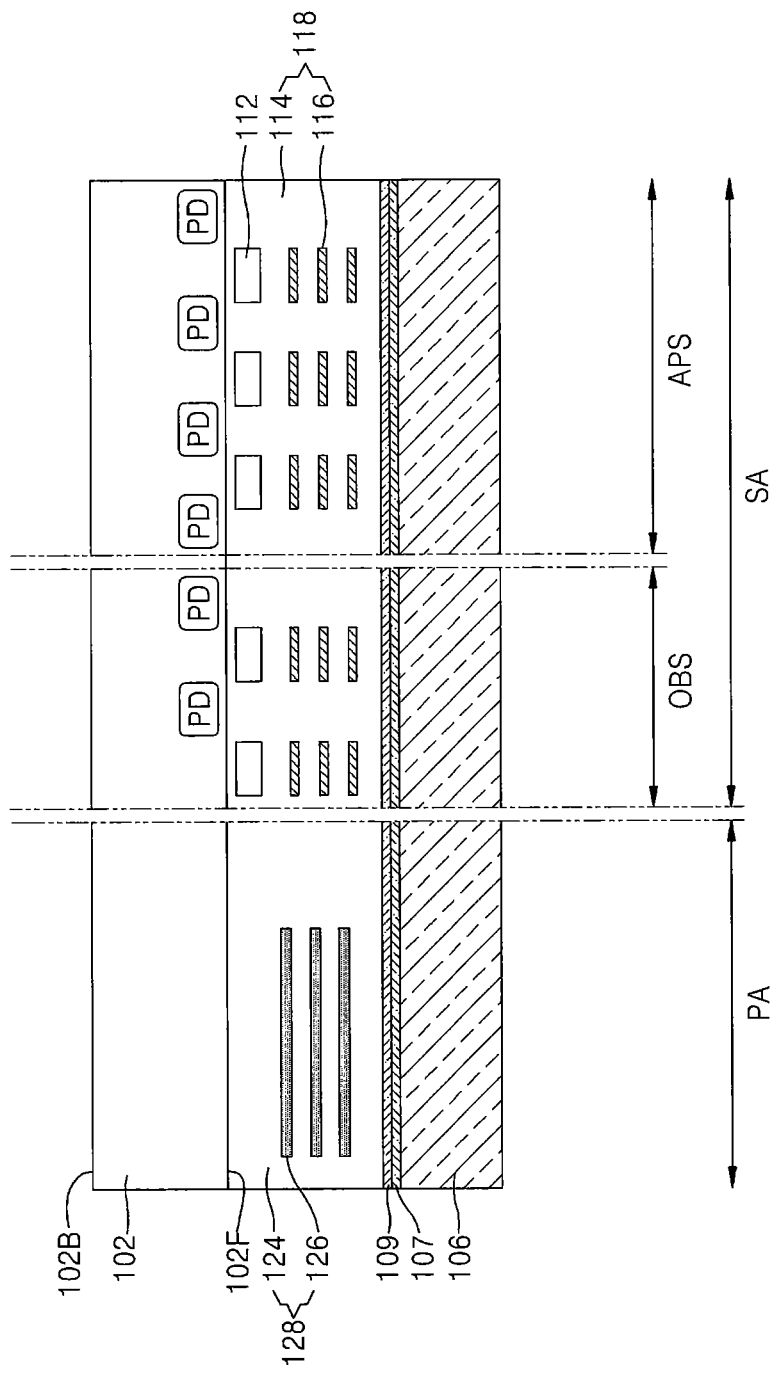
FIGS. 8A through 8O are cross-sectional views for explaining a method of fabricating an image sensor according to some embodiments of the inventive concept.

Referring to FIG. 8C, the substrate 102 with the support substrate 106 attached thereto is turned upside down, and the semiconductor substrate 104 is removed so that the backside 102B of the substrate 102 is exposed. In some embodiments, the semiconductor substrate 104 may be removed by at least one of chemical mechanical polishing (CMP), back grinding (BGR), and reactive ion etching. In some embodiments, to cure a portion of the substrate 102 that has a defect, such as a dangling bond, the backside 102B of the substrate 102 as exposed may be treated by hydrogen plasma.

Figure 8D:
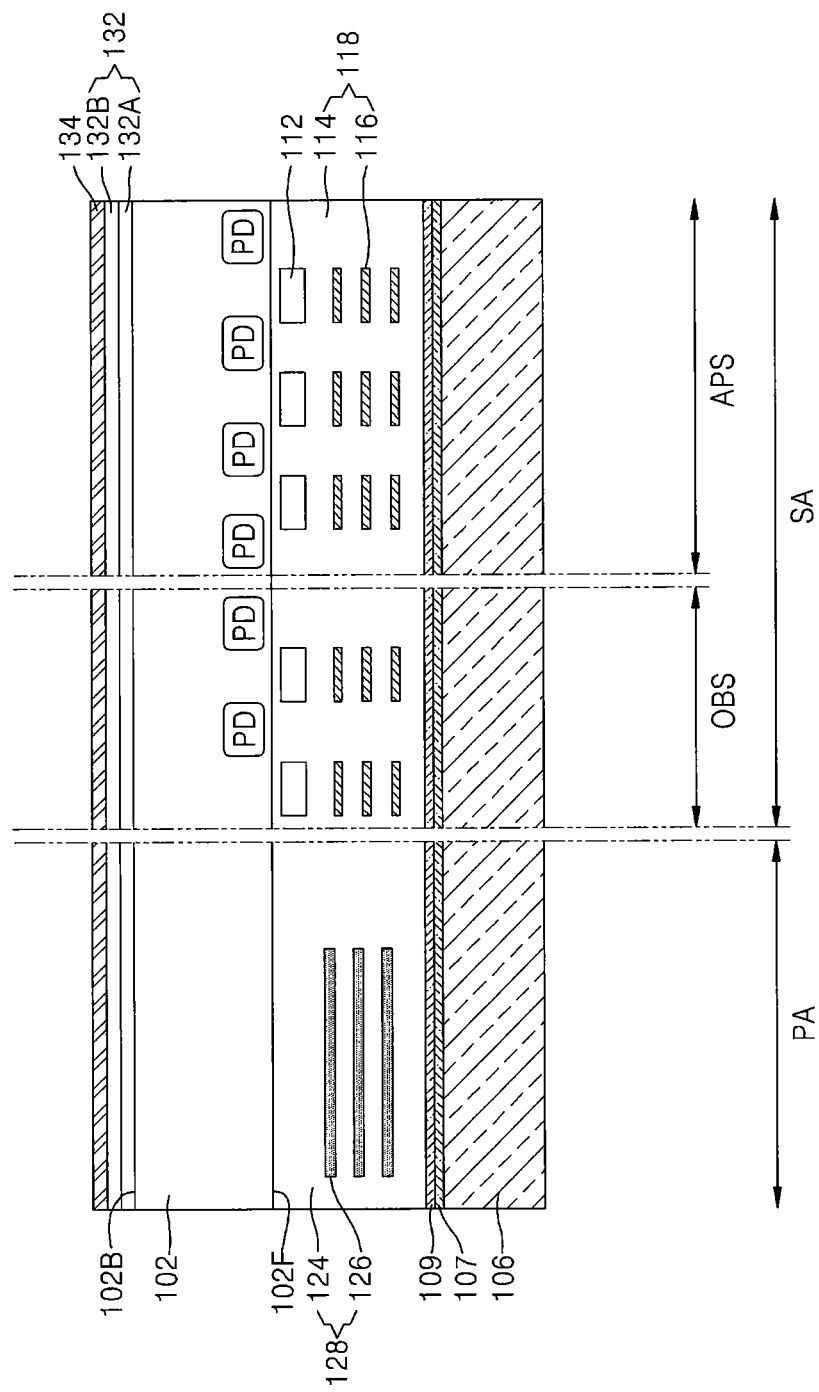

Referring to FIG. 8D, the first passivation layer 132 and the etch stop layer 134 are sequentially formed to cover the backside 102B of the substrate 102. The first passivation layer 132 may be a stack of an insulating or insulative metal oxide layer 132A and a silicon oxide layer 132B. In some embodiments, the insulative metal oxide layer 132A may be formed of a hafnium oxide layer. In some embodiments, the insulative metal oxide layer 132A, the silicon oxide layer 132B, and the etching stop layer 134 may each have a thickness of about 500 to 2000 Å, but the thicknesses thereof are not limited thereto.

Figure 8E:
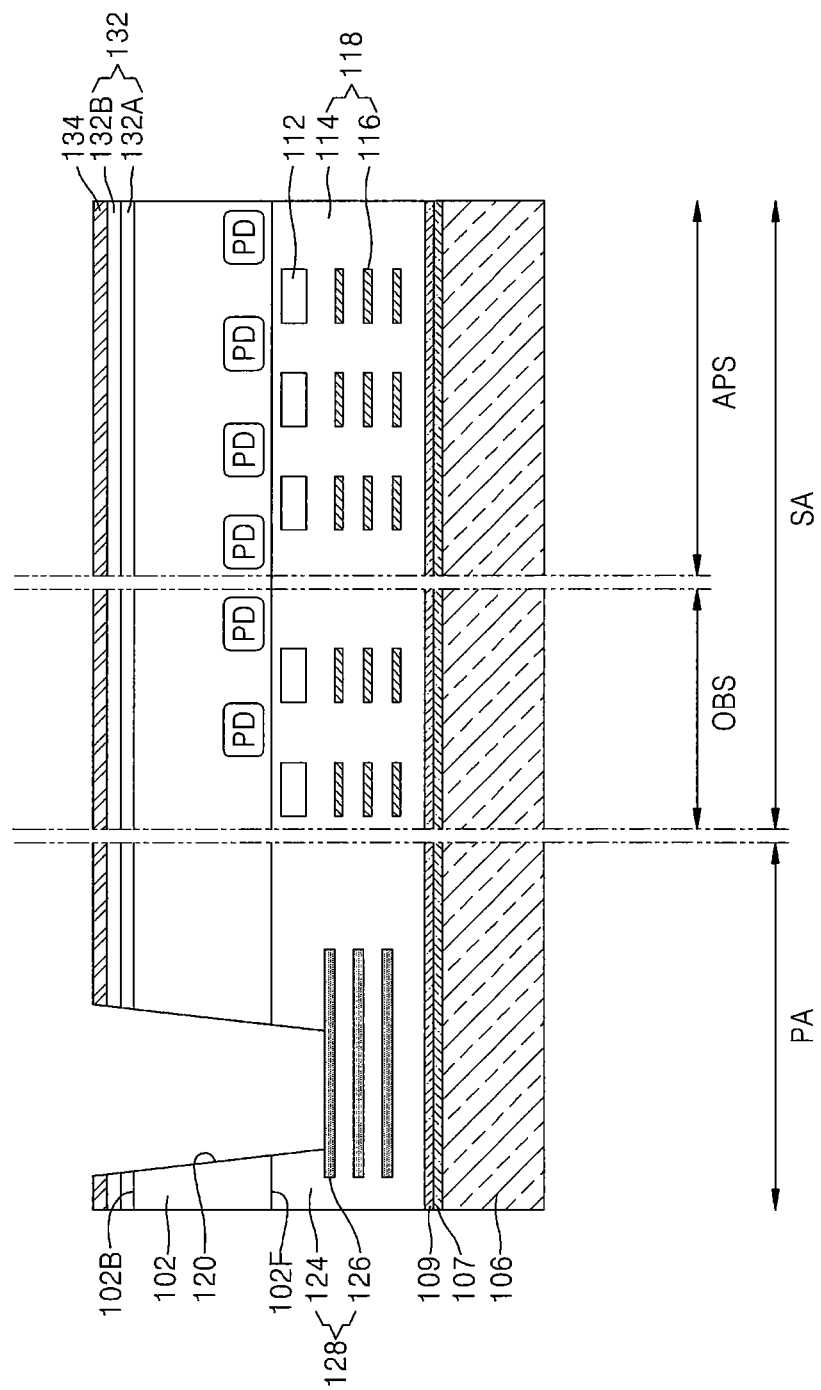

Referring to FIG. 8E, the etching stop layer 134 and the first passivation layer 132 are partially etched out using an etch mask pattern in the pad area PA, and consequently-exposed portions of the substrate 102 and the interlayer insulation layer 124 are removed. Thus, a via hole 120 via which a wiring line 126 on the pad area PA is exposed is formed by penetrating through the substrate 102, and the etch mask pattern is removed.

Figure 8F:
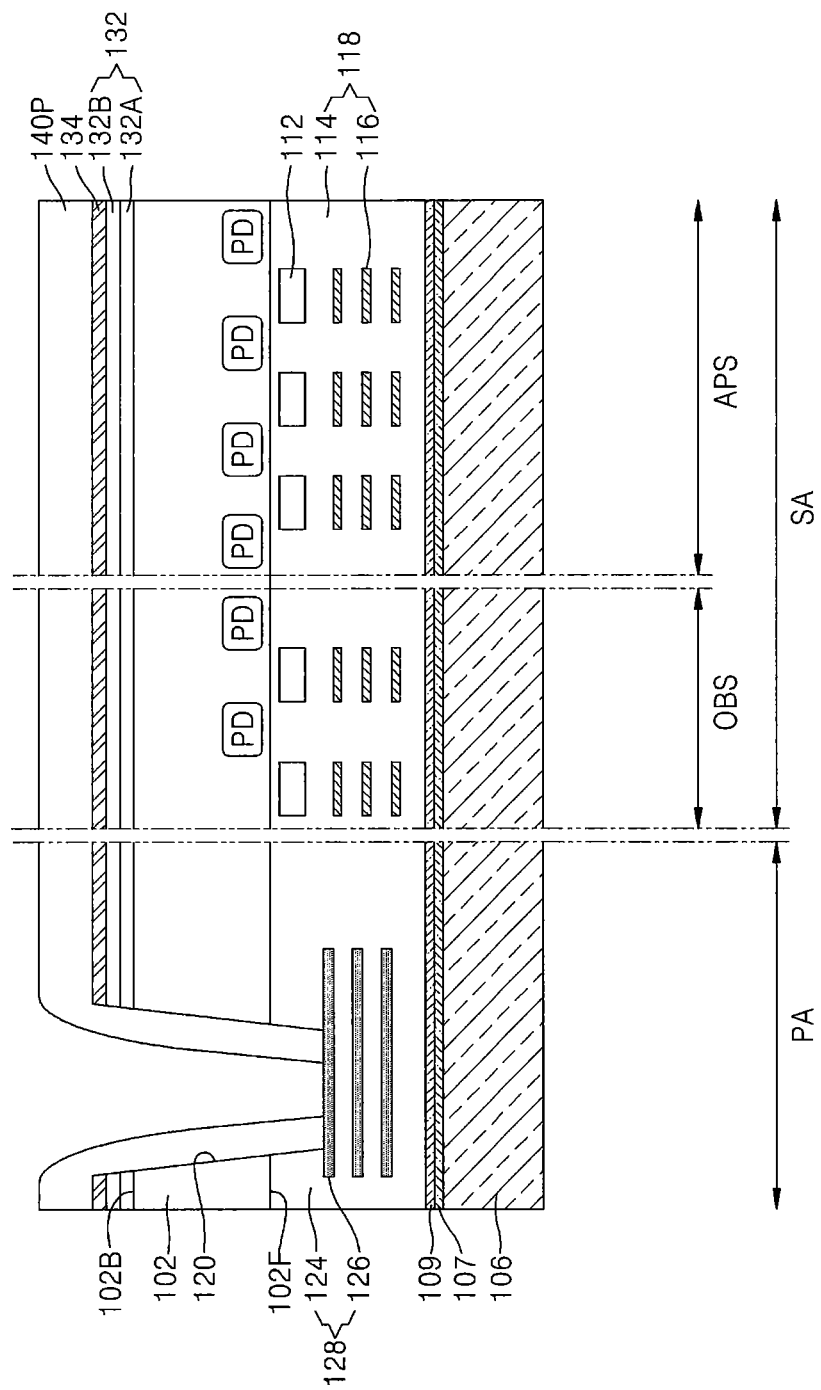

Referring to FIG. 8F, a preliminary insulation pattern 140P is formed to cover an internal sidewall of the via hole 120 and a top surface of the etching stop layer 134.

In an exemplary process of forming the preliminary insulation pattern 140P, an insulation material may be deposited on the backside 102B of the substrate 102 to form an insulation layer on the top surface of the etching stop layer 134 and within the via hole 120. The insulation layer may be formed of an oxide layer, a nitride layer, or a combination thereof. In some embodiments, the insulation layer may be formed by chemical vapor deposition (CVD) or physical vapor deposition (PVD). Thereafter, a portion of the insulation layer is etched back so that the wiring line 126 is exposed via the via hole 120, and thus the preliminary insulation pattern 140P may remain. In some embodiments, the preliminary insulation pattern 140P may have a thickness of about 1500 to 2500 Å within the via hole 120, but the thickness of the preliminary insulation pattern 140P is not limited thereto. In some embodiments, the preliminary insulation pattern 140P may have a relatively greater thickness of about 1500 to 4000 Å on the top surface of the etch stop layer 134, but the thickness of the preliminary insulation pattern 140P is not limited thereto.

Figure 8G:
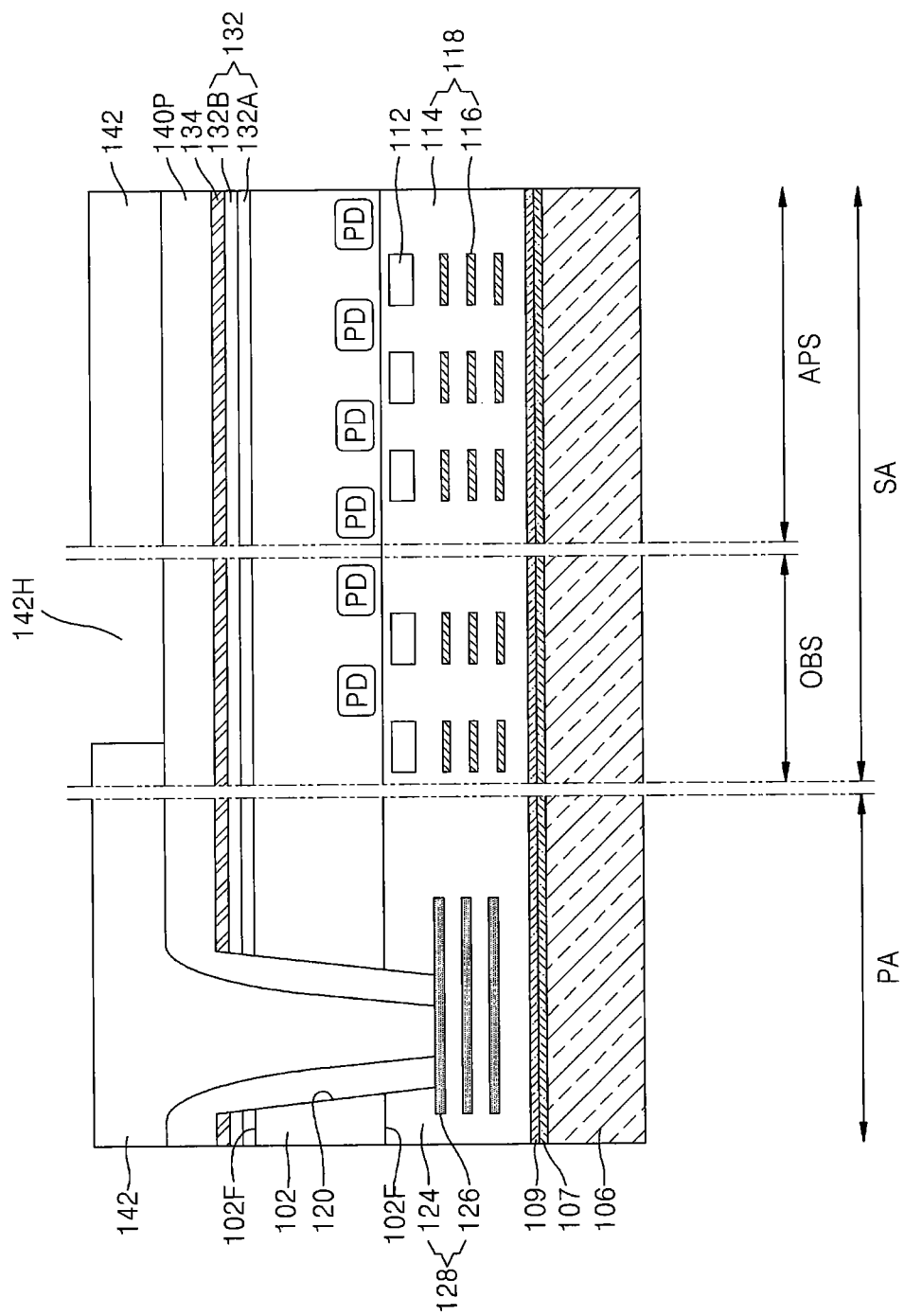

Referring to FIG. 8G, a first mask pattern 142 is formed on the preliminary insulation pattern 140P. A hole 142H via which the preliminary insulation pattern 140P is exposed is formed on the optical black sensor area OBS in the first mask pattern 142.

In some embodiments, the first mask pattern 142 may be, but is not limited thereto, a photoresist layer.

Referring to FIG. 8H, the preliminary insulation pattern 140P is etched using the first mask pattern 142 as an etch mask and the etching stop layer 134 as an etch stop layer, thereby forming the insulation pattern 140. As such, an edge or boundary of the optical black sensor area OBS adjacent the active pixel sensor area APS is free of the insulation pattern 140.

In the pad area PA, the insulation pattern 140 includes a via insulation pattern portion 140V, which is formed within the via hole 120 and covers the internal sidewall of the via hole 120, and an external insulation pattern portion 140W, which is integrally connected to the via insulation pattern portion 140V and covers the backside 102B of the substrate 102.

Referring to FIG. 8I, after the first mask pattern 142 (see FIG. 8H) is removed, a preliminary first conductive layer 152P covering an exposed surface of the insulation pattern 140 and an exposed portion of the top surface of the etching stop layer 134 is formed within the via hole 120 and on the backside 102B of the substrate 102.

The preliminary first conductive layer 152P may include, but is not limited to, a first main metal layer 152M, and a lower barrier layer 152L and an upper barrier layer 152U, which cover a bottom surface and a top surface, respectively, of the first main metal layer 152M. In some embodiments, the preliminary first conductive layer 152P may include only the first main metal layer 152M. In other embodiments, the preliminary first conductive layer 152P may include the first main metal layer 152M and only one of the lower barrier layer 152L and the upper barrier layer 152U.

In some embodiments, the first main metal layer 152M may be formed of W, Au, Ag, Cu, Al, or a combination thereof. The lower barrier layer 152L and the upper barrier layer 152U may each be formed of Ti, TiN, Ta, TaN, Ru, Co, Mn, WN, Ni, NiB, or a combination thereof.

Figure 8J:
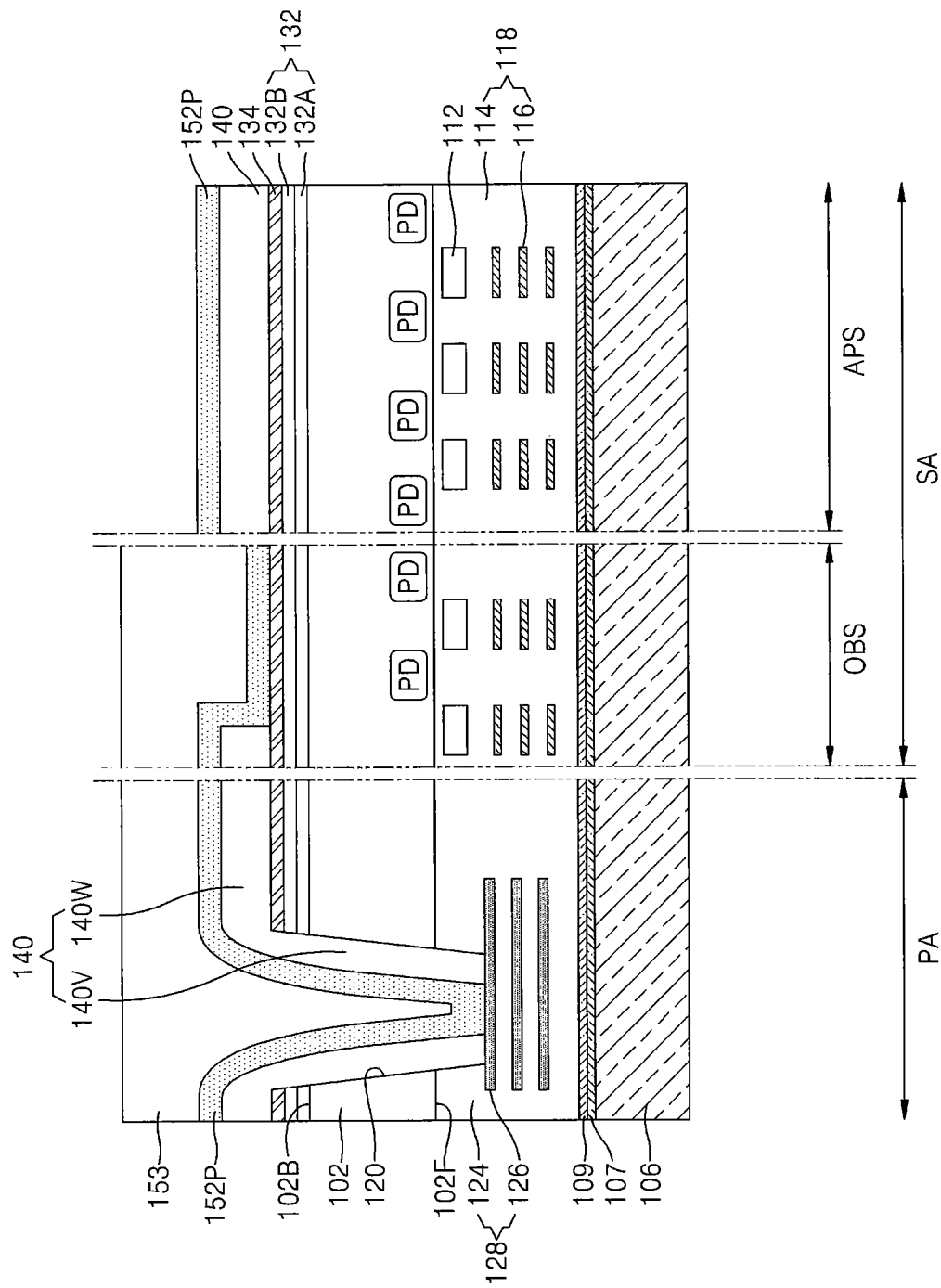

Referring to FIG. 8J, a second mask pattern 153 covering the preliminary first conductive layer 152P is formed on the optical black sensor area OBS and the pad area PA so that the preliminary first conductive layer 152P is exposed on the active pixel sensor area APS of the substrate 102.

In FIG. 8J, after the second mask pattern 153 is formed, the preliminary first conductive layer 152P may also be exposed on the circuit area CA of the substrate 102. In some embodiments, the second mask pattern 153 may be, but is not limited to, a photoresist layer.

Figure 8K:
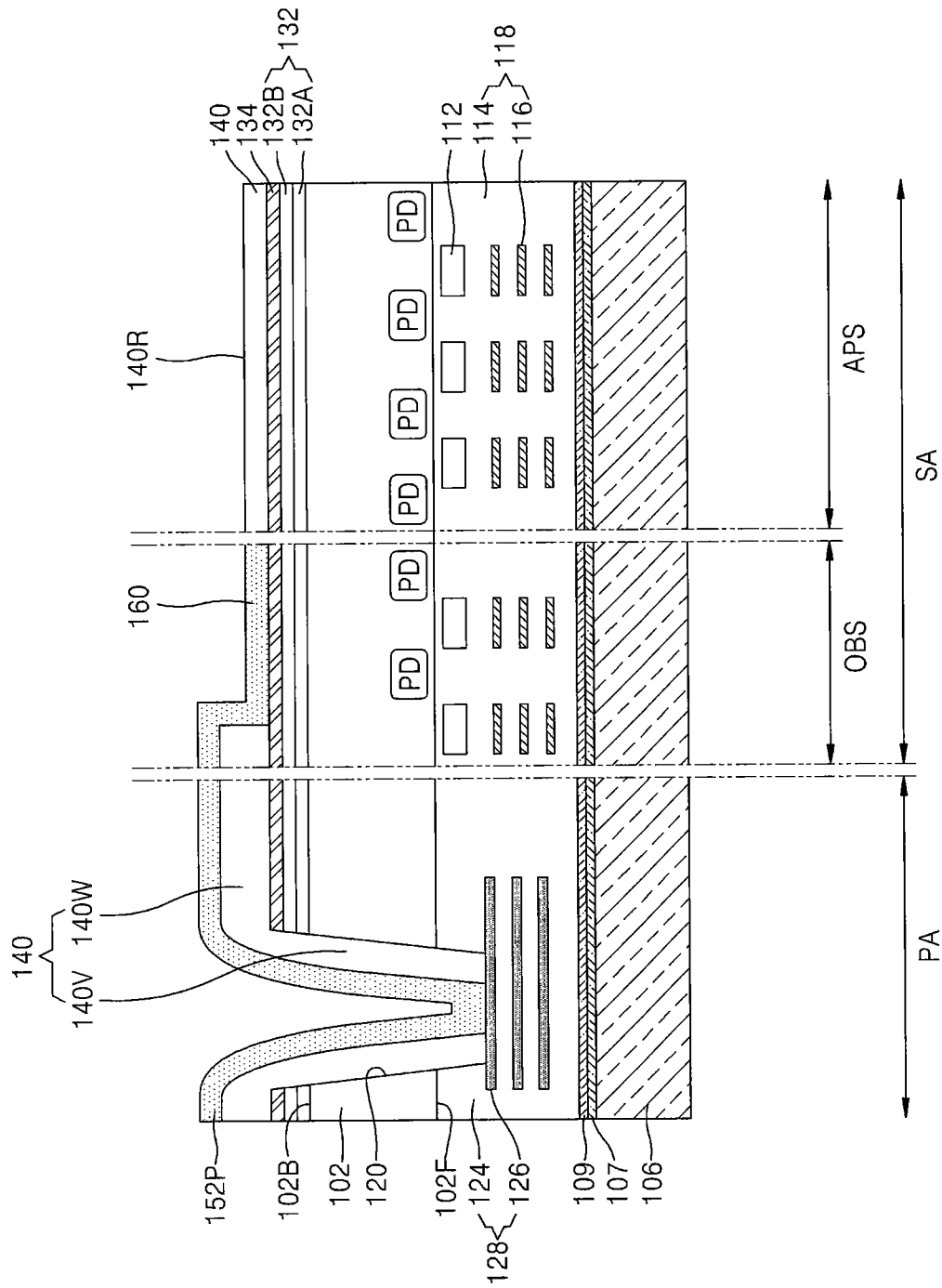

Referring to FIG. 8K, the preliminary first conductive layer 152P is etched out on the active pixel sensor area APS by using the second mask pattern 153 (see FIG. 8J) as an etch mask. A consequently-exposed portion of the external insulation pattern portion 140W of the insulation pattern 140 is over-etched to thereby form the recessed surface portion 140R in a portion of the insulation pattern 140.

Due to the partial removal of the preliminary first conductive layer 152P, a portion of the preliminary first conductive layer 152P remaining on the pad area PA constitutes or defines the first conductive layer 152 extending from the top surface of the insulation pattern 140, which covers the backside 102B of the substrate 102, to the inside of the via hole 120. A portion of the preliminary first conductive layer 152P that remains on the optical black sensor area OBS constitutes or defines the light-shielding pattern 160.

In FIG. 8K, when the preliminary first conductive layer 152P is exposed on the circuit area CA of the substrate 102 via the second mask pattern 153 in the process of FIG. 8J, the preliminary first conductive layer 152P and the insulation pattern 140 may also be etched out on the circuit area CA while they are being etched on the active pixel sensor area APS, and thus the recessed surface portion 140R may also be formed on the circuit area CA as illustrated in FIG. 4B.

Figure 8L:
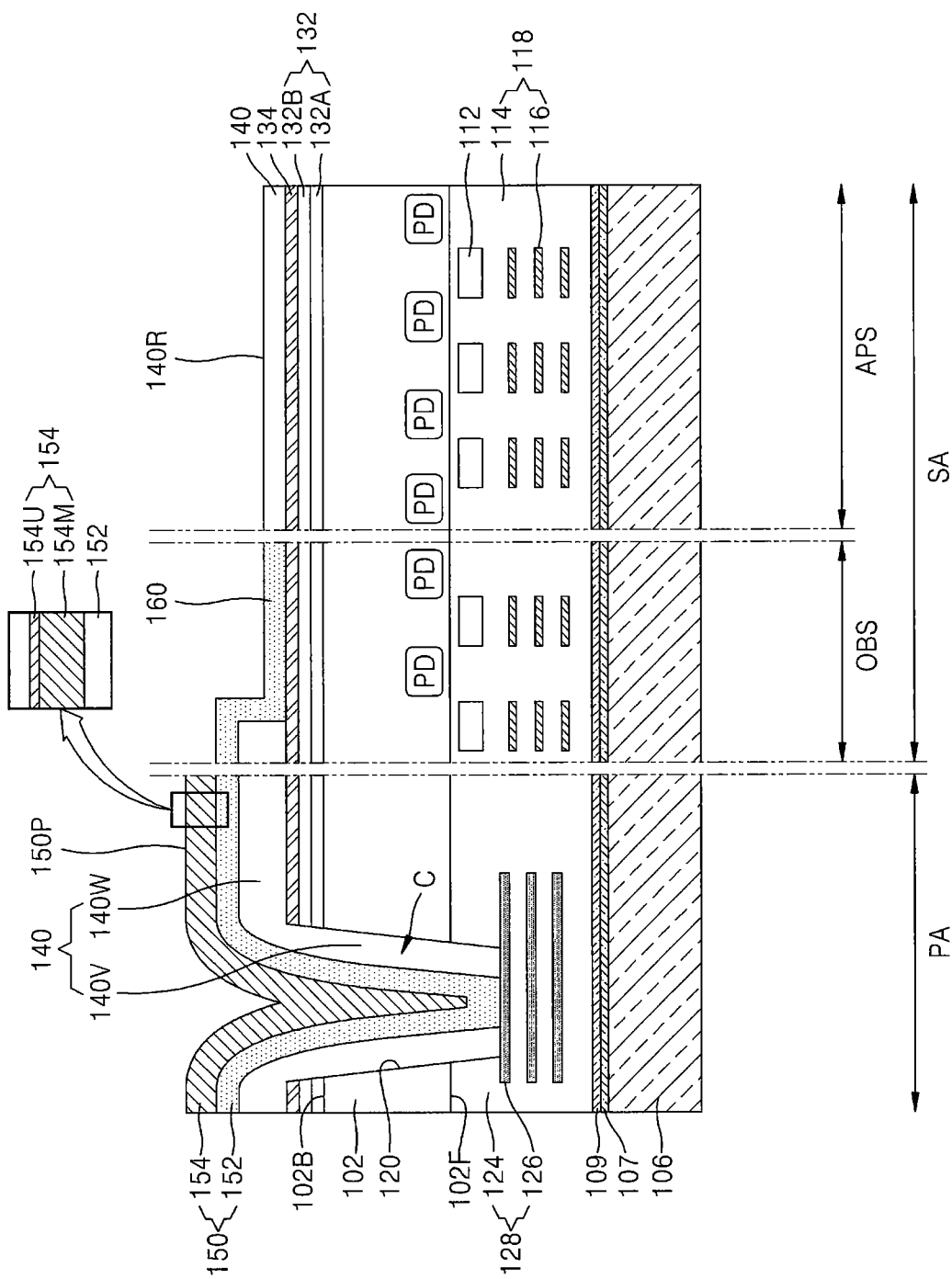

Referring to FIG. 8L, the second conductive layer 154 is formed on the first conductive layer 152, on the pad area PA. The second conductive layer 154 may include a second main metal layer 154M, and an upper barrier layer 154U covering a top surface of the second main metal layer 154M. In some embodiments, the upper barrier layer 15U may not be formed.

The first conductive layer 152 and the second conductive layer 154 constitute or define the wiring layer 150 formed on the pad area PA. The wiring layer 150 includes a via contact portion C, which penetrates through the substrate 102 and fills the via hole 120, and the pad portion 150P, which is integrally connected to the via contact portion C and extends on the insulation pattern 140 on the pad area PA.

In some embodiments, the second conductive layer 154 may be formed of Al, Cu, CuSn, CuMg, CuNi, CuZn, CuPd, CuAu, CuRe, CuW, W, W alloy, or a combination thereof. The upper barrier layer 154U may be formed of Ti, TiN, Ta, TaN, Ru, Co, Mn, WN, Ni, NiB, or a combination thereof.

Figure 8M:
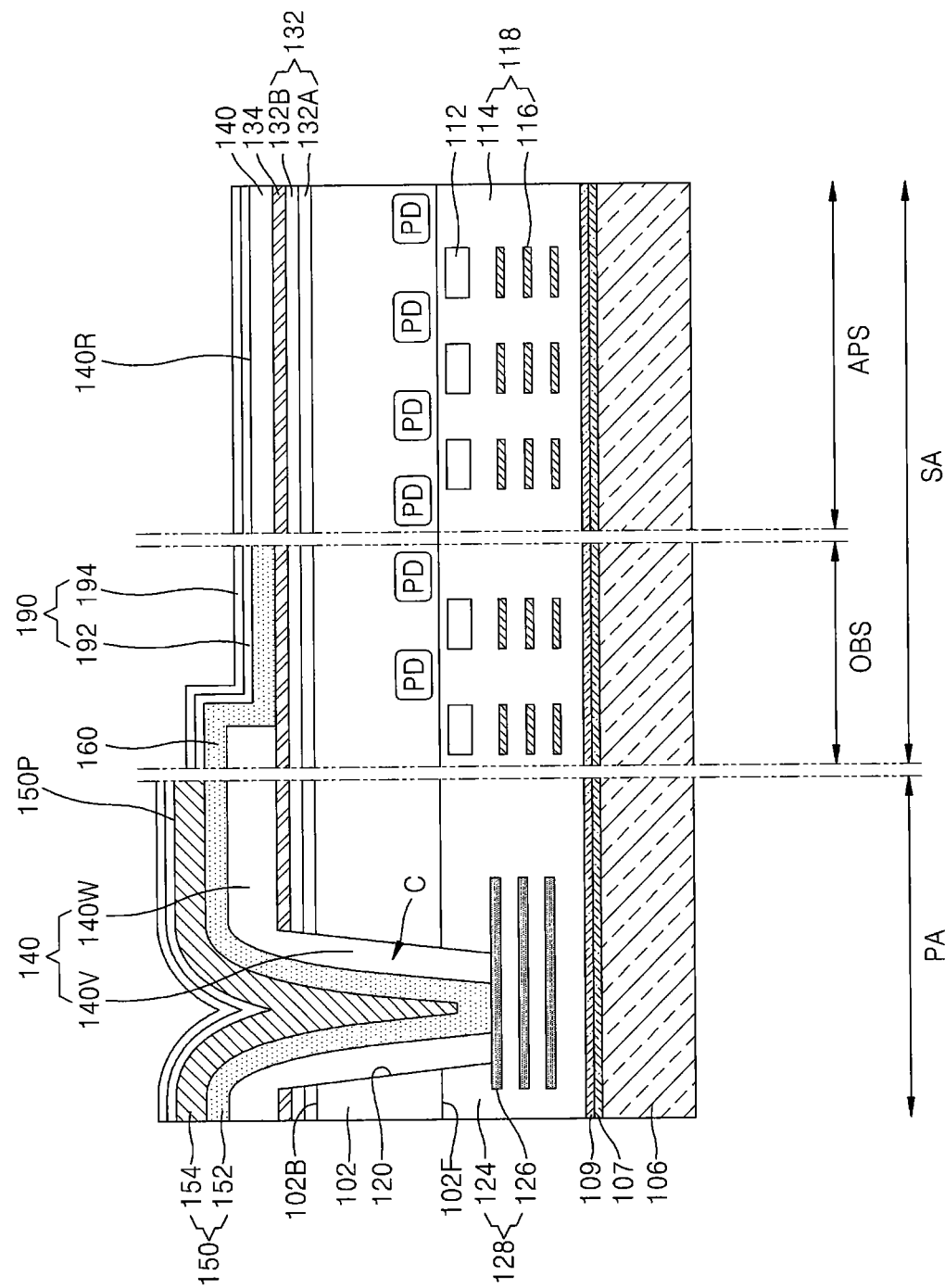

Referring to FIG. 8M, the second passivation layer 190 covering the wiring layer 150, the light-shielding pattern 160, and the recessed surface portion 140R of the insulation pattern 140 is formed on the backside 102B of the substrate 102.

The second passivation layer 190 may be a stack of a first insulation layer 192 and a second insulation layer 194. In some embodiments, the first insulation layer 192 may be a silicon oxide layer, and the second insulation layer 194 may be a silicon nitride layer, but embodiments of the inventive concepts are not limited thereto. The first insulation layer 192 and the second insulation layer 194 may each have a thickness of about 1000 to 3000 Å, but the thicknesses thereof are not limited thereto.

Figure 8N:
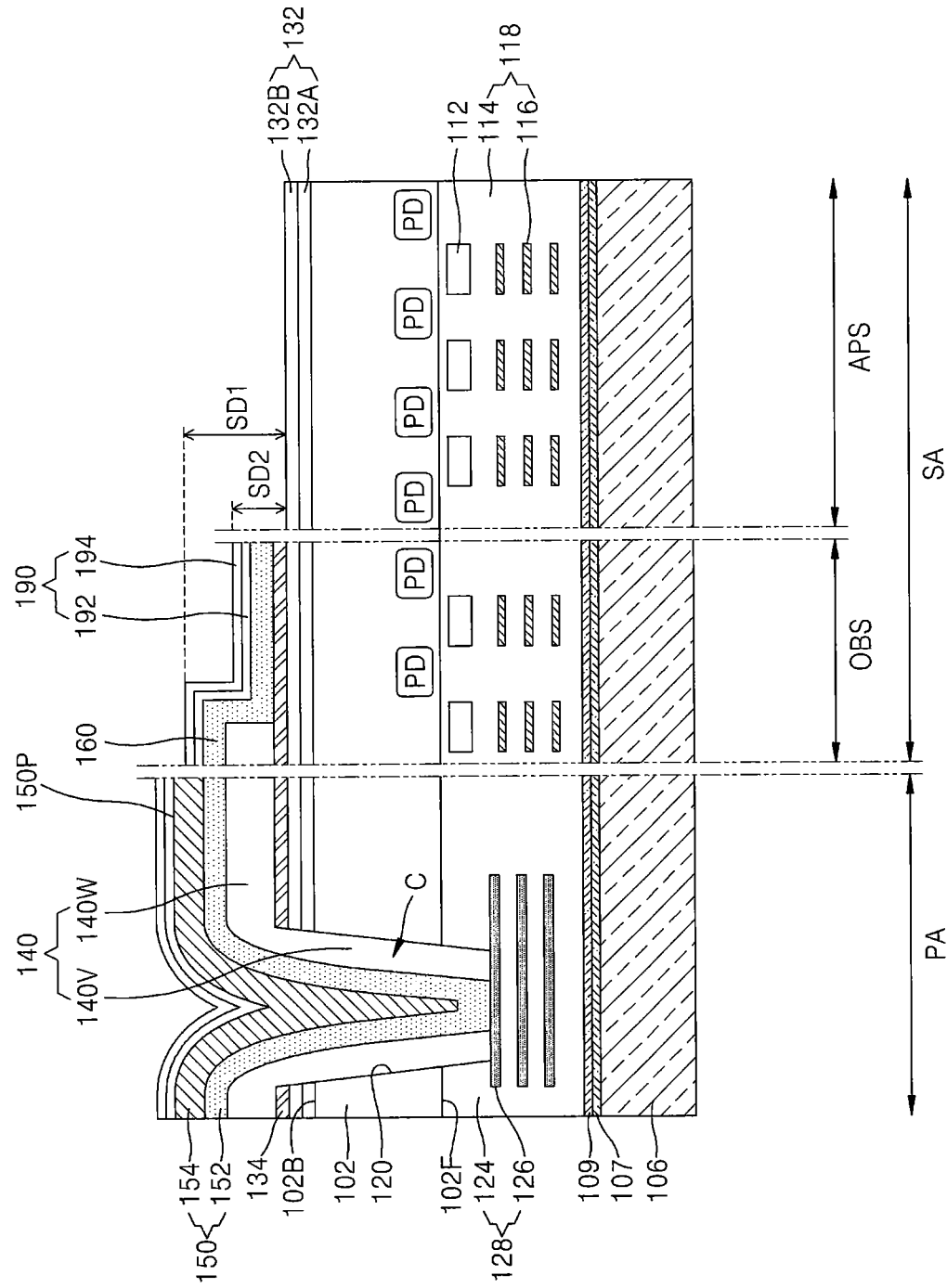
Figure 80:
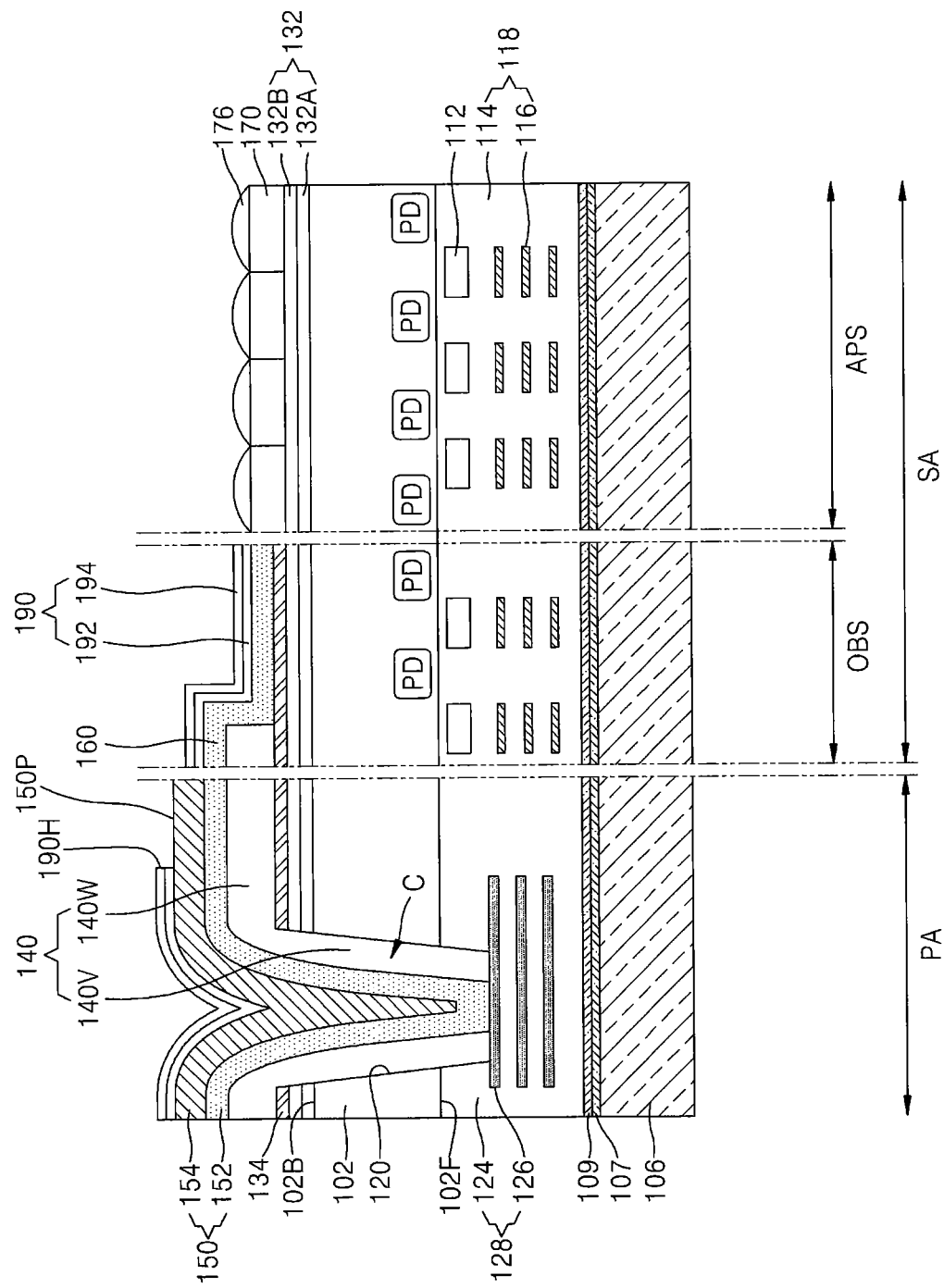

Referring to FIG. 8N, the second passivation layer 190 is selectively removed from the active pixel sensor area APS, and the etching stop layer 134 as exposed according to a result of the removal is also removed, thereby exposing the first passivation layer 132.

Since a portion of the preliminary insulation pattern 140P has been removed on a boundary or region of the optical black sensor area OBS adjacent to the active pixel sensor area APS in the process of FIG. 8H, a step difference SD1 due to the insulation pattern 140 between the optical black sensor area OBS and the active pixel sensor area APS does not exist in the portion of the optical black sensor area OBS adjacent to the active pixel sensor area APS. Rather, a step difference SD2 between the active pixel sensor area APS and the optical black sensor area OBS, which is less than a step difference SD1 due to the insulation pattern 140, may exist in the region of the optical black sensor area OBS adjacent to the active pixel sensor area APS.

Referring to FIG. 8O, in the pad area PA, a portion of the second passivation layer 190 is removed to form a hole 190H via which the pad portion 150P of the wiring layer 150 is exposed. In the active pixel sensor area APS, the color filter layer 170 and a microlens portion 176 are sequentially formed on the first passivation layer 132.

In some embodiments, while the color filter layer 170 and the microlens portion 176 are being formed, the pad portion 150P exposed via the hole 190H may be covered with a protective layer, and a final passivation layer may be formed on the color filter layer 170 and the microlens portion 176. Then, unnecessary layers that cover the pad portion 150P may be removed to expose the pad portion 150P again.

The color filter layer 170 may include a plurality of R areas, a plurality of G areas, and a plurality of B areas.

In some embodiments, the microlens portion 176 may be formed of TMR-based resin (a product made by Tokyo Ohka Kogyo, Co.) or MFR-based resin (a product made by Japan Synthetic Rubber Corporation).

In the image sensor 100, a portion of an insulation layer between the substrate 102 and the light-shielding pattern 160 is removed so that at least a portion of the light-shielding pattern 160 formed on the optical black sensor area OBS of the substrate 102 is relatively closer to the substrate 102. Therefore, a step difference between the level of the color filter layer 170 formed on the active pixel sensor area APS and the level of the light-shielding pattern 160 formed on the optical black sensor area OBS may be reduced or minimized. Accordingly, when the color filter layer 170 including a plurality of color filters is formed, the thicknesses of color filters positioned in a region of the active pixel sensor area APS adjacent to the optical black sensor area OBS may be substantially uniform or otherwise reduce or prevented from being non-uniform, and problems, such as distortion of an image signal and degradation of the color, may be reduce or prevented from occurring.

Although methods for fabricating the image sensor 100 of FIGS. 4A and 4B have been described above with reference to FIGS. 8A through 8O, the methods illustrated in FIGS. 8A through 8O may also be applied to methods for fabricating the image sensor 200 of FIGS. 5A and 5B. For example, to manufacture the image sensor 200 of FIGS. 5A and 5B, when the second mask pattern 153 covering the preliminary first conductive layer 152P is formed on the optical black sensor area OBS and the pad area PA of the substrate 102 in the process of FIG. 8J, the second mask pattern 153 may also be formed on a portion of the circuit area CA so as to cover the preliminary first conductive layer 152P. In the process of FIG. 8K, the preliminary first conductive layer 152P is etched out on the active pixel sensor area APS by using the second mask pattern 153 as an etch mask, and a consequently-exposed portion of the external insulation pattern portion 140W of the insulation pattern 140 is over-etched to thereby form the recessed surface portion 140R in a portion of the insulation pattern 140 in the active pixel sensor area APS, and at the same time, a process of forming the recessed surface portion 140R in a portion of the insulation pattern 140 between the pad area PA and the circuit area CA may also be performed. Thereafter, the processes of FIGS. 8L through 8O may be performed to complete the fabrication of the image sensor 200 of FIGS. 5A and 5B.

FIGS. 9A through 9H are cross-sectional views for explaining methods of fabricating an image sensor according to some embodiments of the inventive concept. FIGS. 9A through 9H illustrate fabrication of the image sensor 200 of FIGS. 5A and 5B. FIGS. 9A through 9H illustrate a part of each of the active pixel sensor area APS, the optical black sensor area OBS, and the pad area PA of the substrate 102. The same reference numerals in FIGS. 9A through 9H as those in FIGS. 1 through 8O denote the same elements, and thus their description will be omitted for simplification of explanation.

Figure 9A:
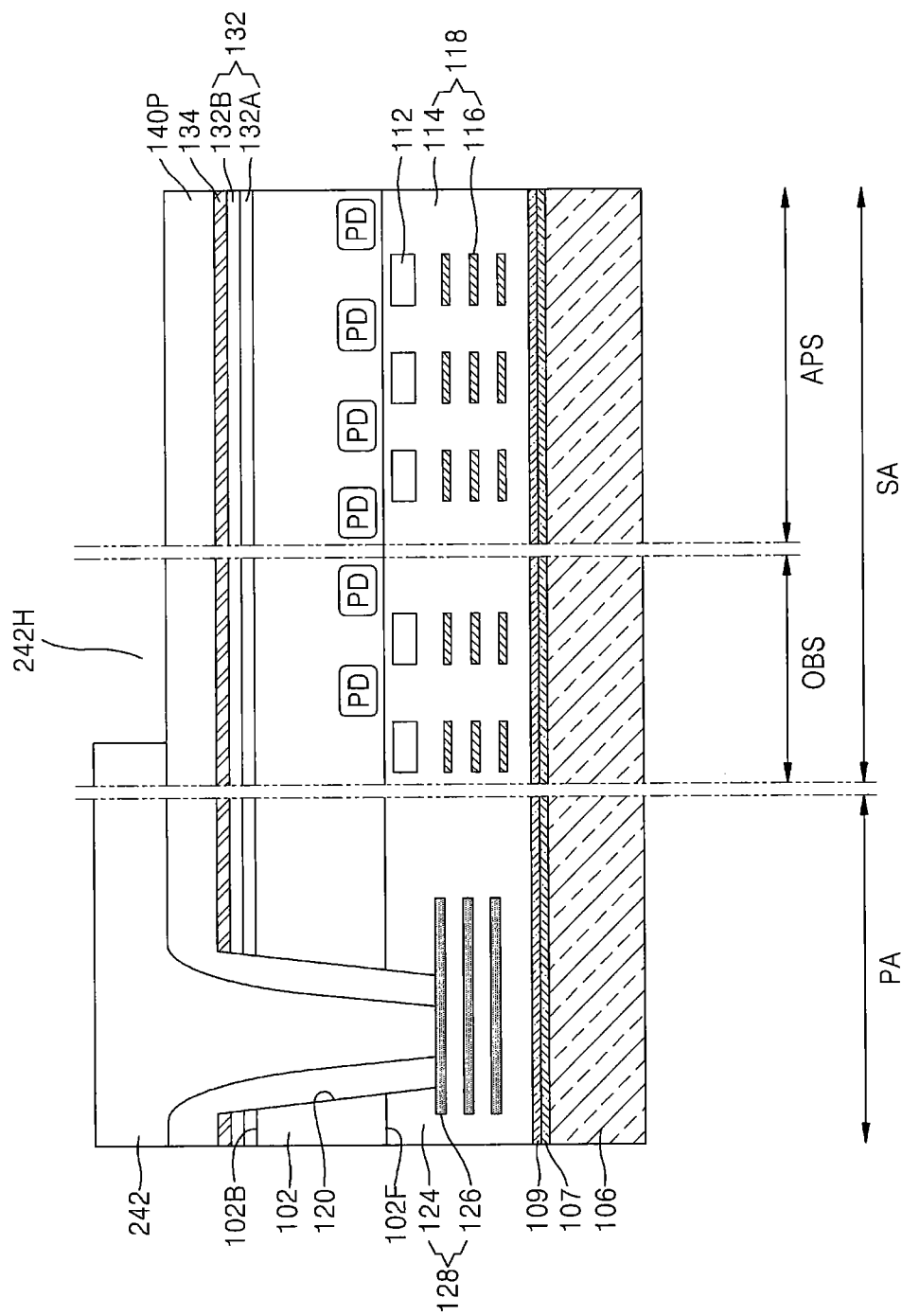

Referring to FIG. 9A, a series of processes as described above with reference to FIGS. 8A through 8F are performed to form the preliminary insulation pattern 140P on the backside 102B of the substrate 102, and then a first mask pattern 242 is formed on the preliminary insulation pattern 140P in a method similar to the formation of the first mask pattern 142 described above with reference of FIG. 8G. However, a relatively large hole 242H via which the preliminary insulation pattern 140P is exposed is formed in the first mask pattern 242 not only on the optical black sensor area OBS but also on the active pixel sensor area APS.

In some embodiments, the first mask pattern 242 may be, but is not limited to, a photoresist layer.

Referring to FIG. 9B, the preliminary insulation pattern 140P is etched using the first mask pattern 242 as an etch mask and the etching stop layer 134 as an etch stop layer, thereby forming the insulation pattern 240.

In the pad area PA, the insulation pattern 240 includes a via insulation pattern portion 240V, which is formed within the via hole 120 and covers the internal sidewall of the via hole 120, and an external insulation pattern portion 240W, which is integrally connected to the via insulation pattern portion 240V and covers the backside 102B of the substrate 102.

Referring to FIG. 9C, after the first mask pattern 242 (see FIG. 9B) is removed, a preliminary first conductive layer 252P covering an exposed surface of the insulation pattern 240 and an exposed portion of the top surface of the etching stop layer 134 is formed within the via hole 120 and on the backside 102B of the substrate 102. A detailed description of the preliminary first conductive layer 252P is the same as that of the preliminary first conductive layer 152P made with reference to FIG. 8I.

Referring to FIG. 9D, the preliminary first conductive layer 252P is removed from the active pixel sensor area APS of the substrate 102 in a method similar to the method described above with reference to FIGS. 8J and 8K, and the etching stop layer 134 as exposed according to a result of the removal is over-etched, thereby exposing the first passivation layer 132.

A portion of the preliminary first conductive layer 252P remaining on the pad area PA constitutes or defines the first conductive layer 252 extending from the top surface of the insulation pattern 240, which covers the backside 102B of the substrate 102, to the inside of the via hole 120. A portion of the preliminary first conductive layer 252P that remains on the optical black sensor area OBS constitutes or defines the light-shielding pattern 260.

Referring to FIG. 9E, as similarly described above with reference to FIG. 8L, the second conductive layer 154 is formed on the first conductive layer 252, on the pad area PA.

The first conductive layer 252 and the second conductive layer 154 constitute or define the wiring layer 250 formed on the pad area PA. The wiring layer 250 includes a via contact portion C, which penetrates through the substrate 102 and fills the via hole 120, and a pad portion 250P, which is integrally connected to the via contact portion C and extends on the insulation pattern 140 on the pad area PA.

Figure 9F:
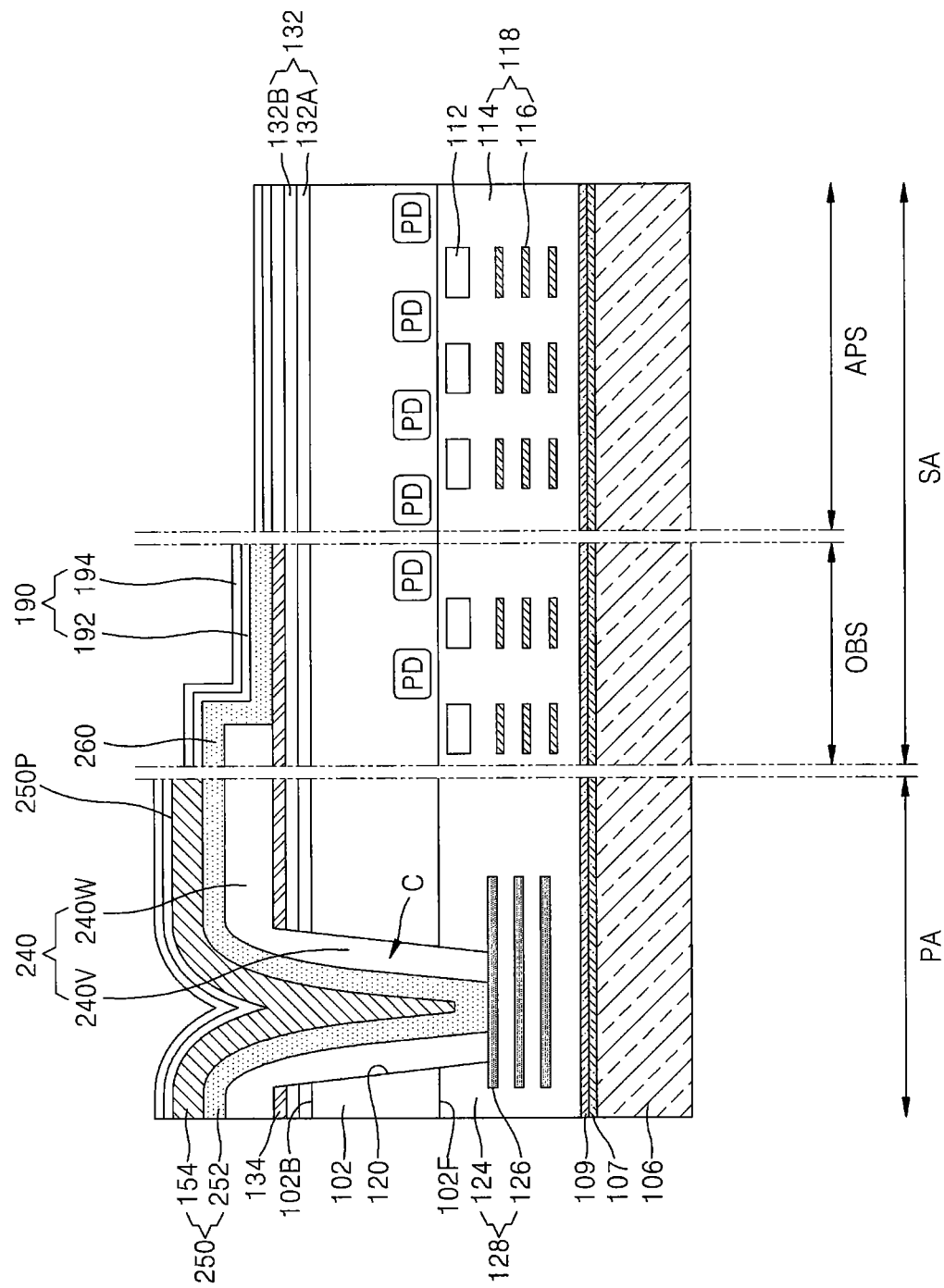

Referring to FIG. 9F, as similarly described above with reference to FIG. 8M, the second passivation layer 190 covering the wiring layer 250, the light-shielding pattern 260, and the first passivation layer 132 is formed on the backside 102B of the substrate 102.

Figure 9G:
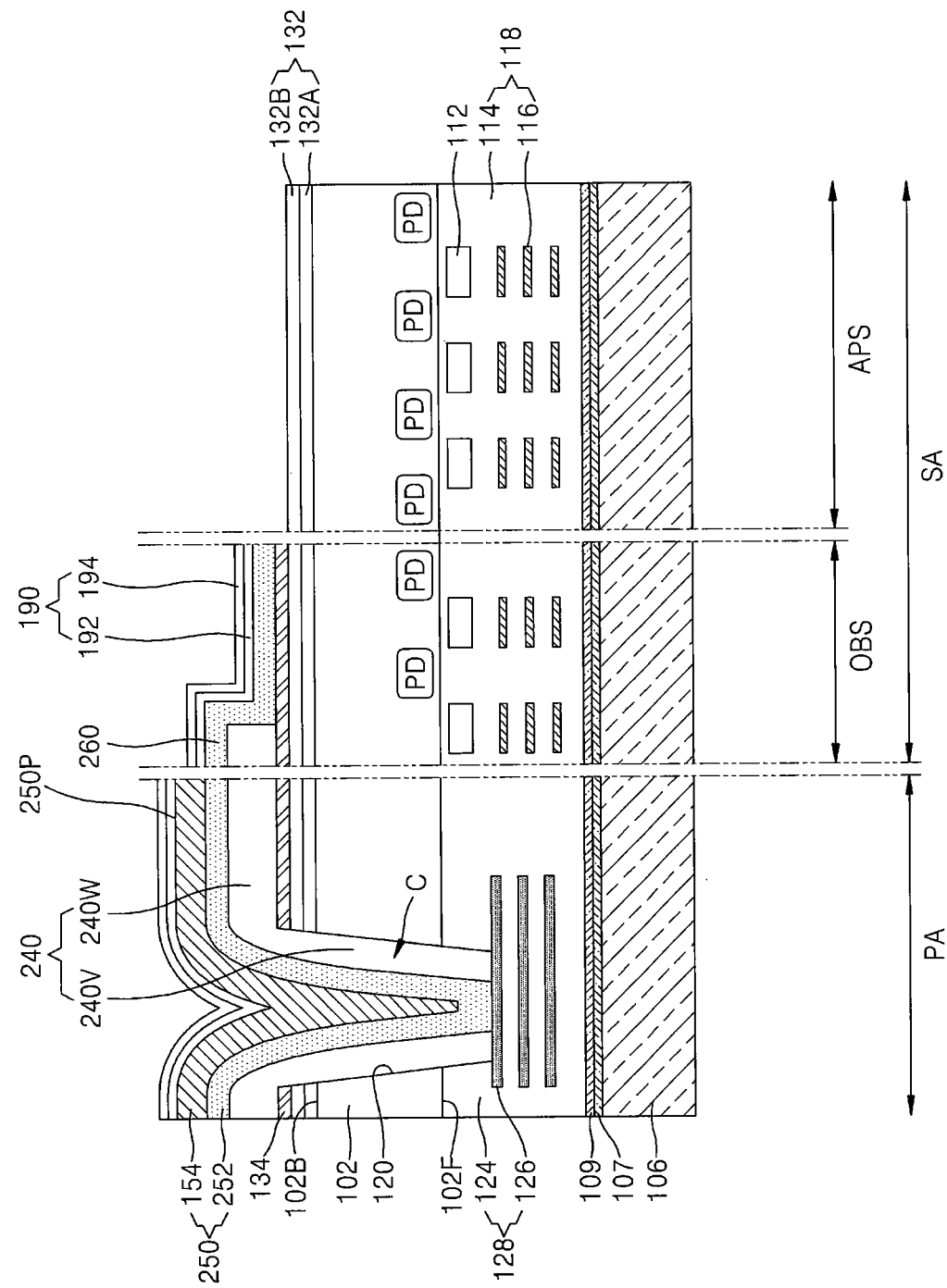

Referring to FIG. 9G, the second passivation layer 190 is removed from the active pixel sensor area APS, thereby exposing the first passivation layer 132.

Figure 9H:
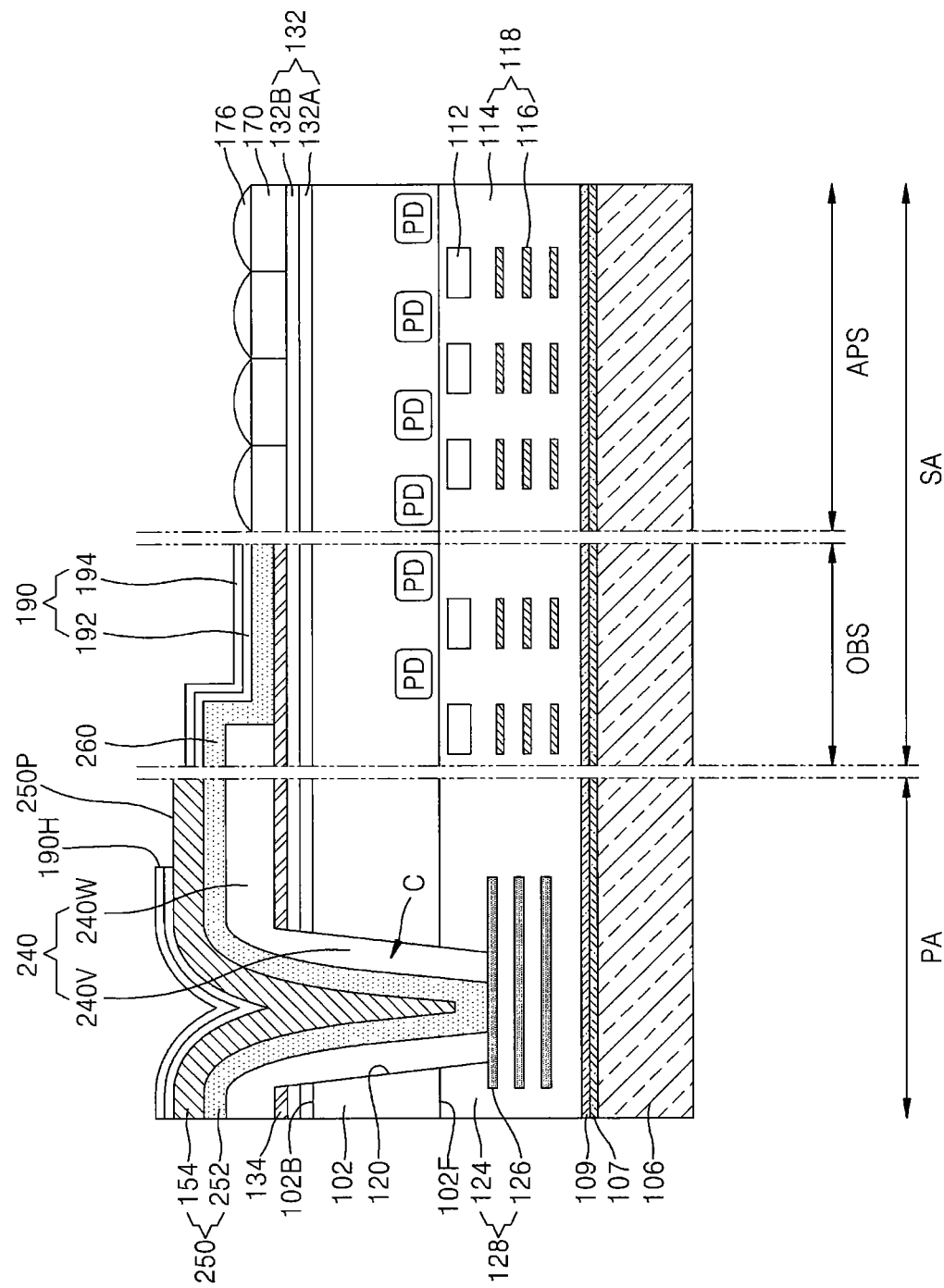

Referring to FIG. 9H, as similarly described above with reference to FIG. 8O, a portion of the second passivation layer 190 is removed to form a hole 190H via which the pad portion 250P of the wiring layer 250 is exposed, and in the active pixel sensor area APS, the color filter layer 170 and the microlens portion 176 are sequentially formed on the first passivation layer 132.

Although methods for fabricating the image sensor 100 of FIGS. 4A and 4B have been described above with reference to FIGS. 9A through 9H, the methods illustrated in FIGS. 9A through 9H may also be applied to a method for fabricating the image sensor 200 of FIGS. 5A and 5B. For example, to manufacture the image sensor 200 of FIGS. 5A and 5B, when the preliminary first conductive layer 252P is formed as in the process of FIG. 9C and then the preliminary first conductive layer 252P is removed from the active pixel sensor area APS as in the process of FIG. 9D, the preliminary first conductive layer 152P is also removed from a region between the pad area PA and the circuit area CA, and a portion of the external insulation pattern portion 240W of the insulation pattern 240 consequently exposed in the region between the pad area PA and the circuit area CA is over-etched to thereby form the recessed surface portion 240R as illustrated in FIG. 5B. Thereafter, the processes of FIGS. 9E through 9H may be performed to complete the fabrication of the image sensor 200 of FIGS. 5A and 5B.

FIGS. 10A through 10J are cross-sectional views for explaining methods of fabricating an image sensor according to some embodiments of the inventive concept. FIGS. 10A through 10J illustrate a method of fabricating the image sensor 300 of FIG. 6. FIGS. 10A through 10J illustrate only a part of each of the active pixel sensor area APS, the optical black sensor area OBS, the circuit area CA, and the pad area PA of the substrate 102.

The same reference numerals in FIGS. 10A through 10J as those in FIGS. 1 through 8O denote the same elements, and thus their description will be omitted for simplification of explanation.

Figure 10A:
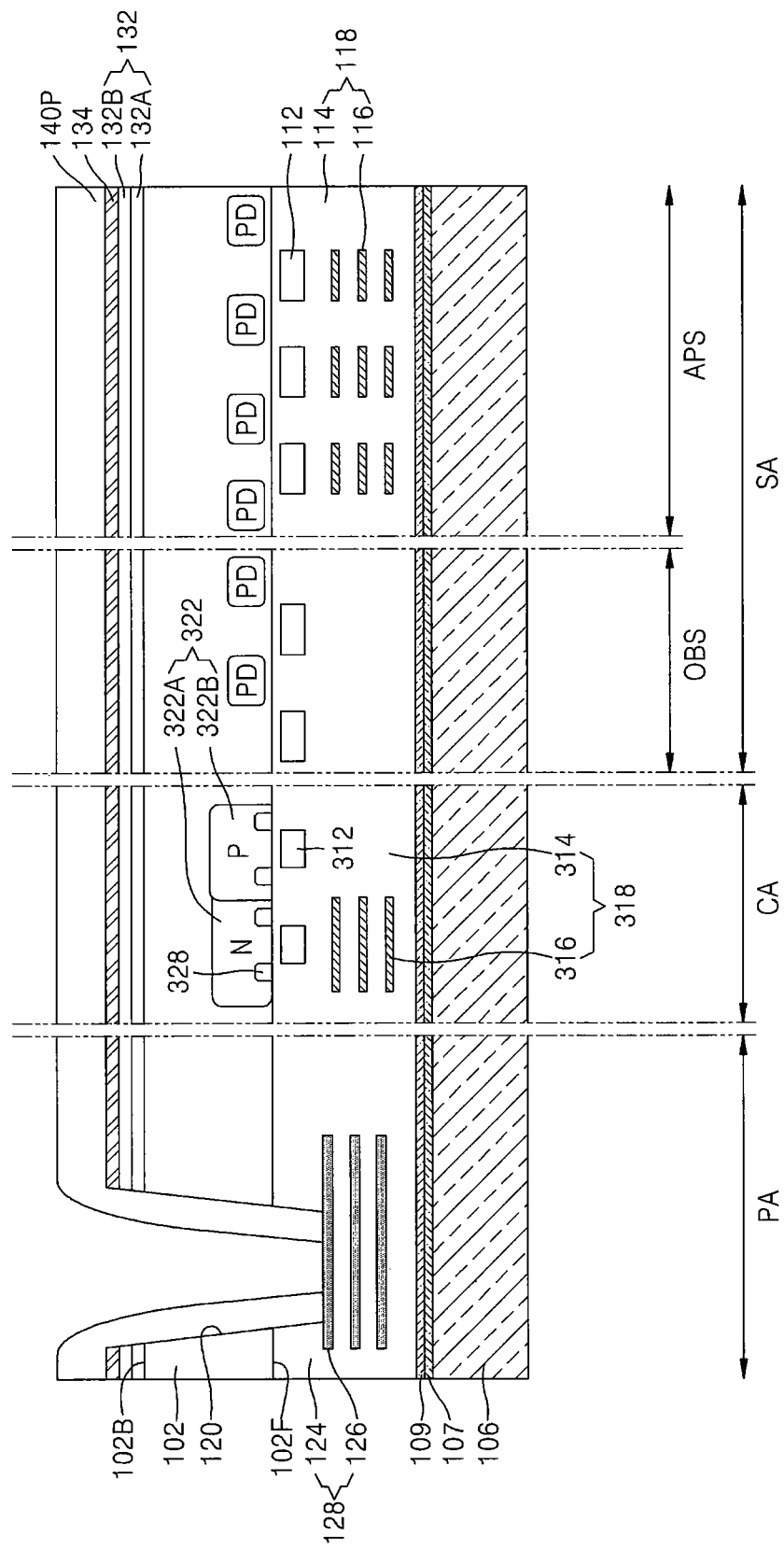

Referring to FIG. 10A, a series of processes as described above with reference to FIGS. 8A through 8F are performed to form the preliminary insulation pattern 140P on the backside 102B of the substrate 102.

The preliminary insulation pattern 140P is formed to cover the active pixel sensor area APS, the optical black sensor area OBS, the circuit area CA, and the pad area PA.

In the circuit area CA, a plurality of wells 322 used to define the circuits 20 (see FIG. 2) are formed within the substrate 102. Each of the wells 322 includes a first well 322A of a first conductivity type and a second well 322B of a second conductivity type. The second conductivity type is opposite to the first conductivity type. Although the first well 322A is an N-type well and the second well 322B is a P-type well in FIGS. 10A through 10J, the inventive concept is not limited thereto. A plurality of first wells 322A and a plurality of second wells 322B may be formed within the substrate 102.

In the circuit area CA, a plurality of gate electrodes 312 used to define the circuits 20 (see FIG. 2) may be formed on the frontside 102F of the substrate 102. In some embodiments, a plurality of source/drain regions 328 may be formed within the wells 322 so as to be positioned on both sides of the gate electrodes 312. In some embodiments, the source/drain regions 328 may constitute or define transistors together with the gate electrodes 312.

In the circuit area CA, a multi-layered wiring structure 318 is formed on the front surface 102F of the substrate 102. The multi-layered wiring structure 318 includes an inter-metal layer insulation layer 314 and a plurality of wiring layers 316. Adjacent wiring layers 316 from among the plurality of wiring layers 316 may be insulated from each other by the inter-metal layer insulation layer 314.

Figure 10B:
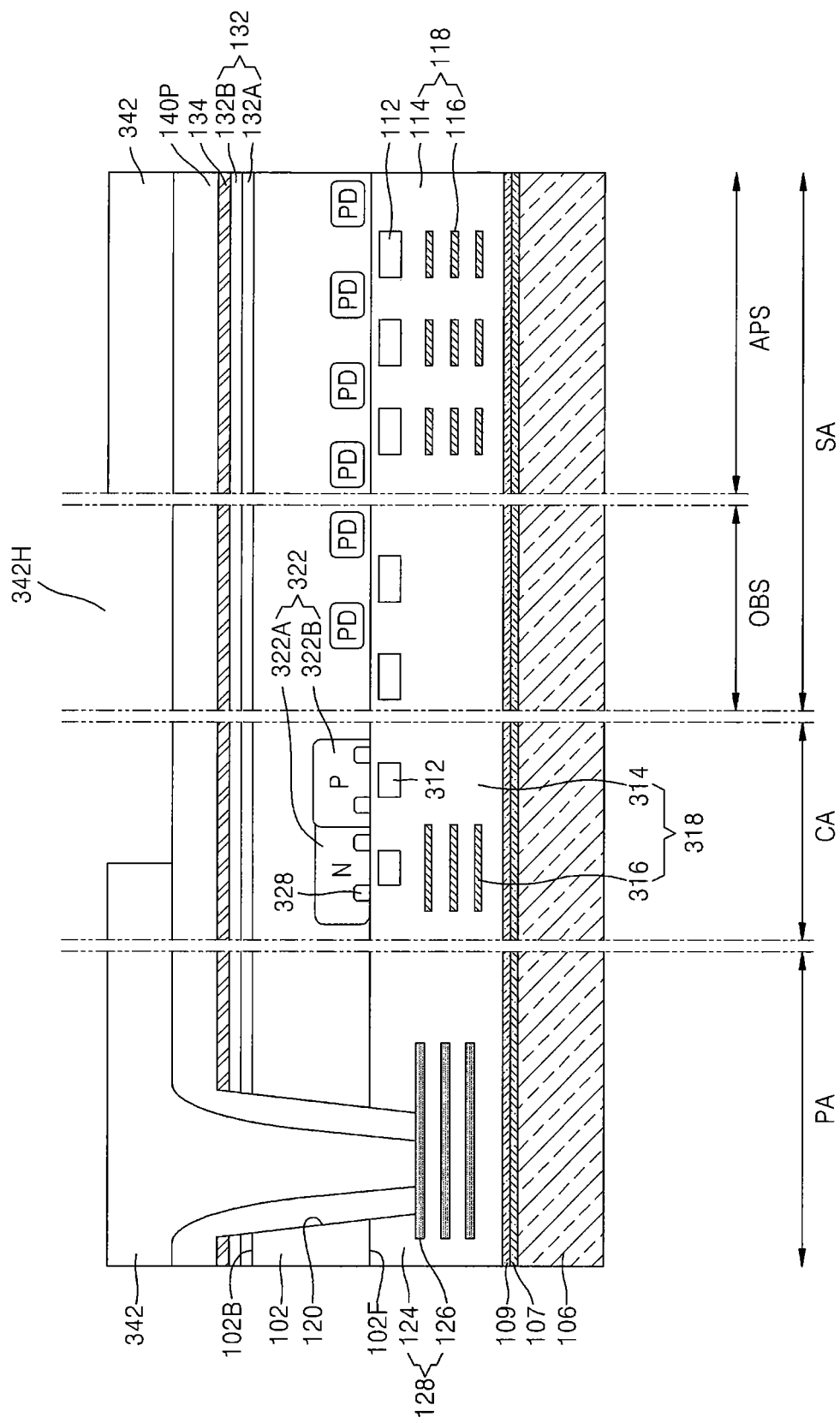

Referring to FIG. 10B, a first mask pattern 342 is formed on the preliminary insulation pattern 140P in a method similar to the method of FIG. 8G. However, a hole 342H via which the preliminary insulation pattern 140P is exposed is formed in the first mask pattern 342 not only on the optical black sensor area OBS but also on the circuit area CA. The first mask pattern 342 may be, but is not limited thereto, a photoresist layer.

Referring to FIG. 10C, the preliminary insulation pattern 140P is etched using the first mask pattern 342 as an etch mask and the etching stop layer 134 as an etch stop layer, thereby forming the insulation pattern 340.

In the pad area PA, the insulation pattern 340 includes a via insulation pattern portion 340V, which is formed within the via hole 120 and covers the internal sidewall of the via hole 120, and an external insulation pattern portion 340W, which is integrally connected to the via insulation pattern portion 340V and covers the backside 102B of the substrate 102.

Figure 10D:
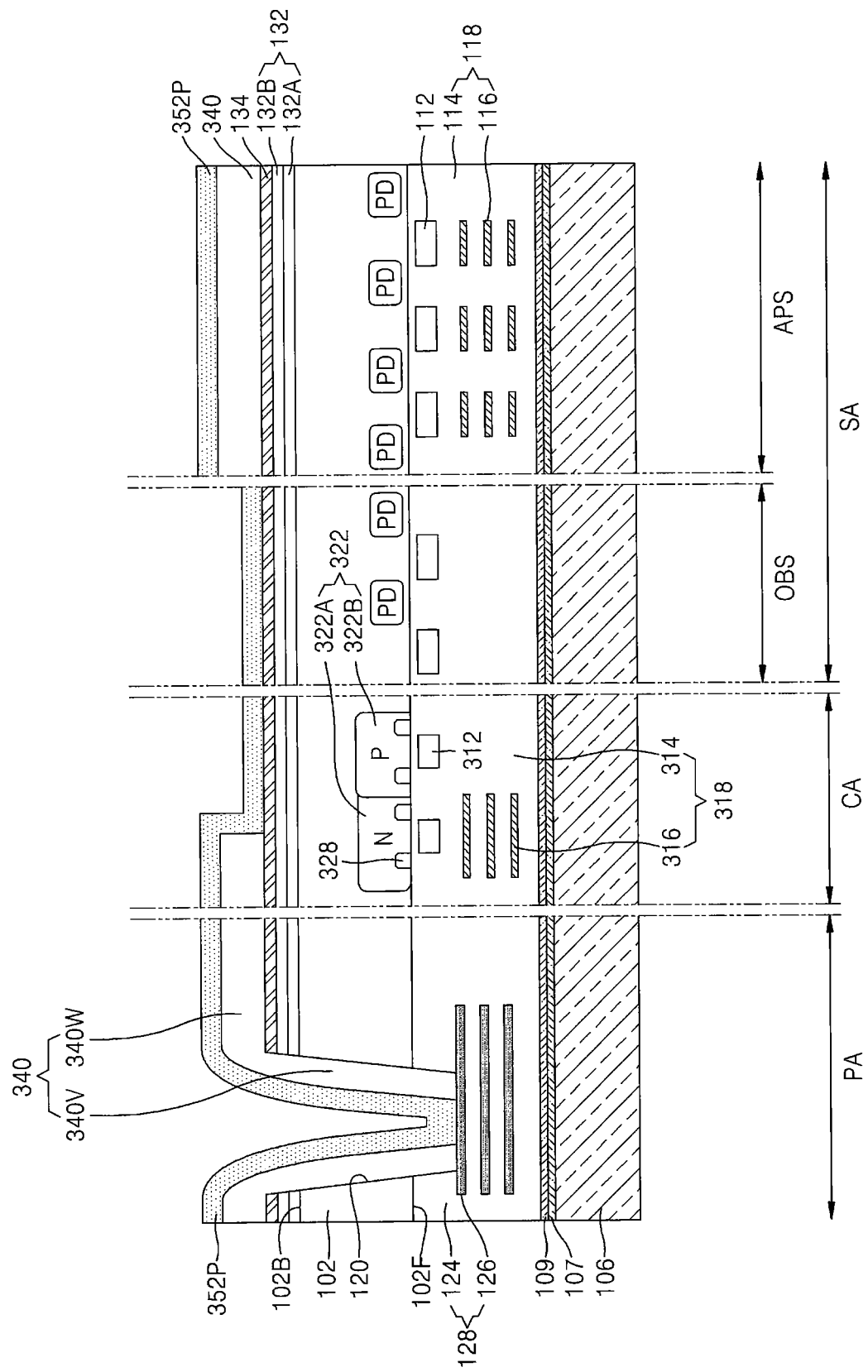

Referring to FIG. 10D, after the first mask pattern 342 (see FIG. 10C) is removed, a preliminary first conductive layer 352P covering an exposed surface of the insulation pattern 340 and an exposed portion of the top surface of the etching stop layer 134 is formed within the via hole 120 and on the backside 102B of the substrate 102.

A detailed description of the preliminary first conductive layer 352P is the same as that of the preliminary first conductive layer 152P made with reference to FIG. 8I.

Figure 10E:
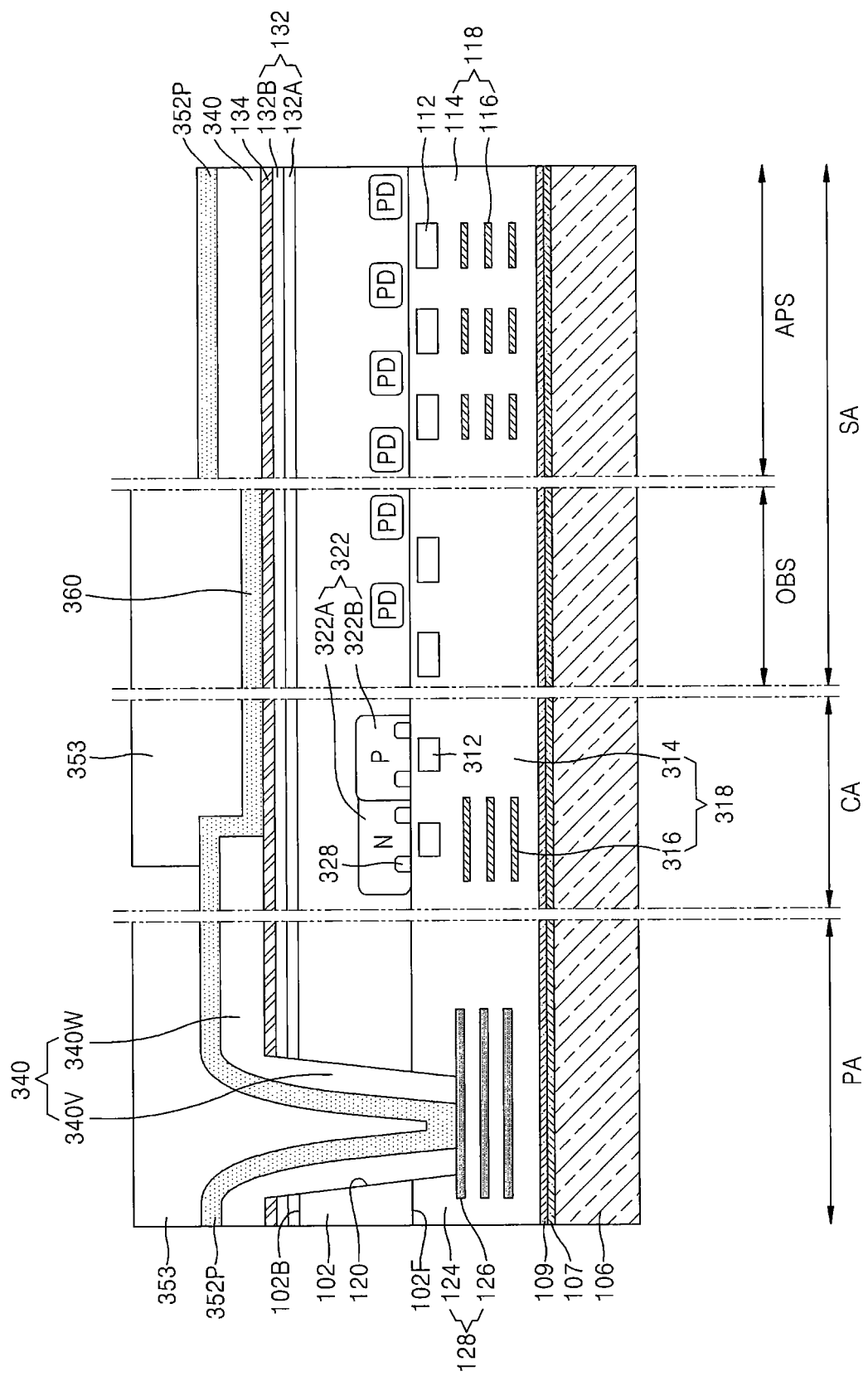

Referring to FIG. 10E, a second mask pattern 353 covering the preliminary first conductive layer 352P is formed on the optical black sensor area OBS, the circuit area CA, and the pad area PA so that the preliminary first conductive layer 352P is exposed on the active pixel sensor area APS of the substrate 102 and on a portion of the circuit area CA adjacent to the pad area PA.

The second mask pattern 353 may be, but is not limited thereto, a photoresist layer.

Figure 10F:
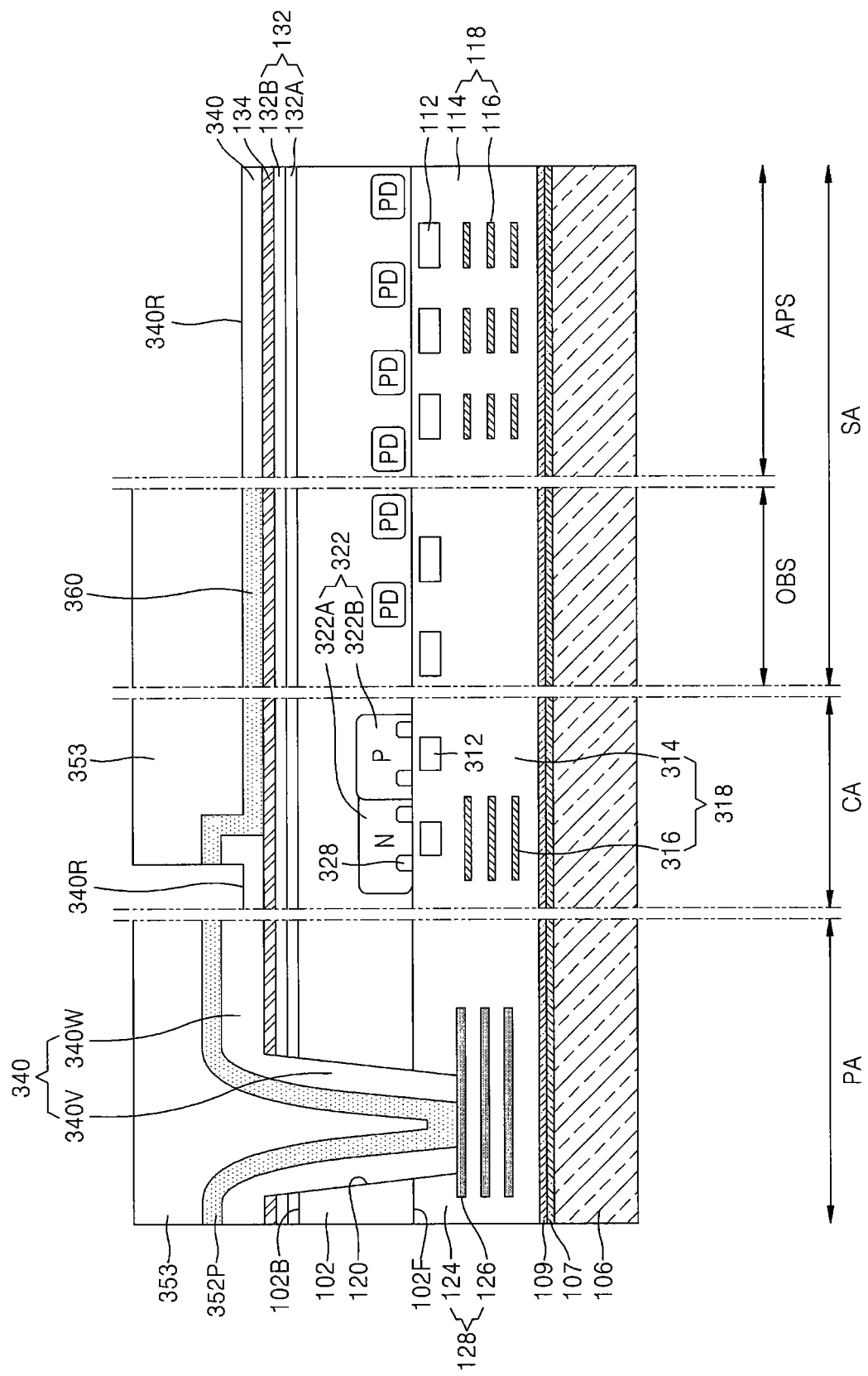

Referring to FIG. 10F, the exposed portion of the preliminary first conductive layer 352P (see FIG. 10E) is etched out using the second mask pattern 353 as an etch mask, and a consequently-exposed portion of the insulation pattern 340 is over-etched to thereby form the recessed surface portion 340R in a portion of the insulation pattern 340.

Due to the partial removal of the preliminary first conductive layer 352P, a portion of the preliminary first conductive layer 352P remaining on the pad area PA constitutes or defines the first conductive layer 352 extending from the top surface of the insulation pattern 340, which covers the backside 102B of the substrate 102, to the inside of the via hole 120. A portion of the preliminary first conductive layer 352P that remains on the optical black sensor area OBS constitutes or defines the light-shielding pattern 360. The light-shielding pattern 360 extends on the substrate 102 such that it covers from the optical black sensor area OBS to a portion of the circuit area CA.

Figure 10G:
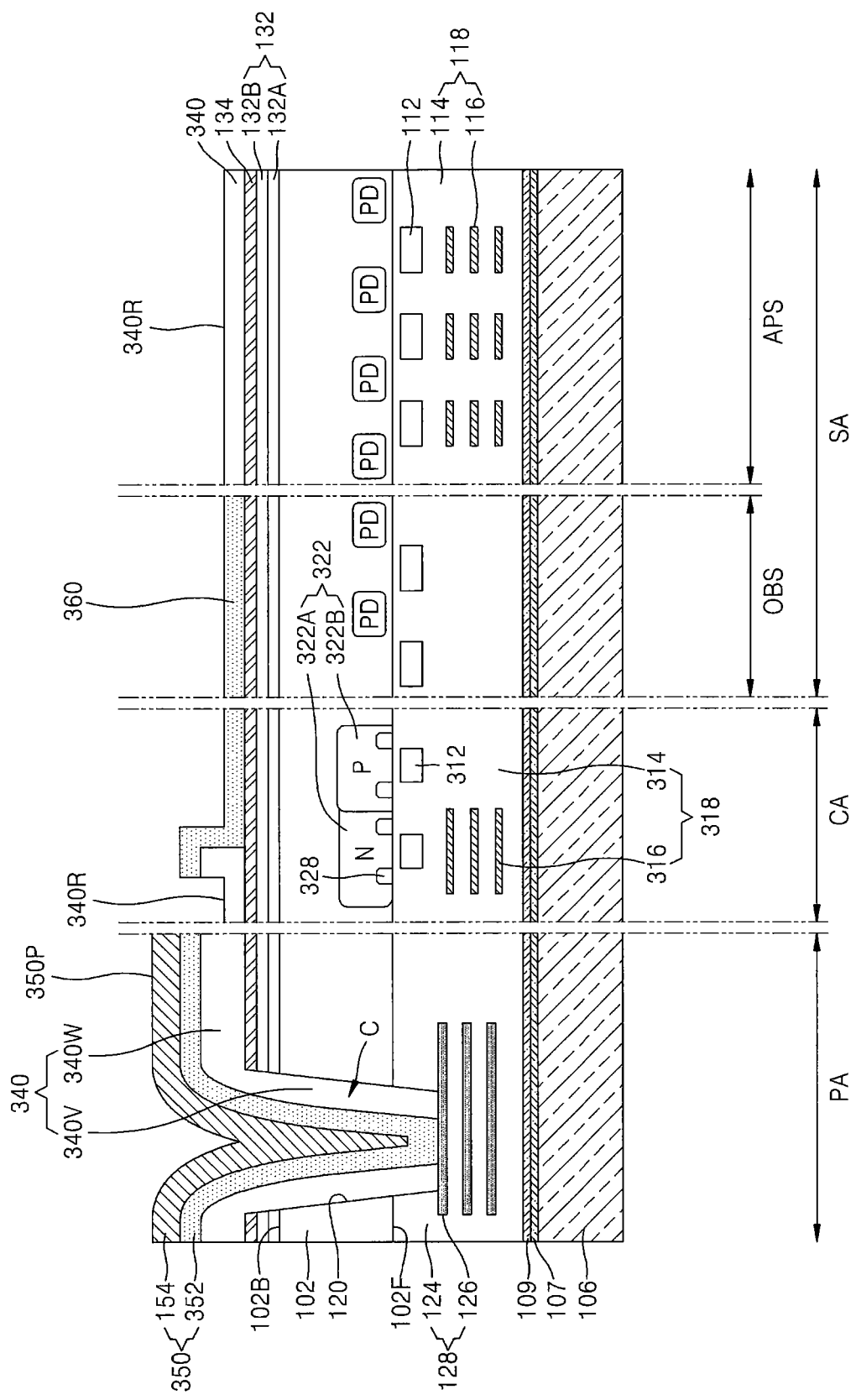

Referring to FIG. 10G, after the second mask pattern 353 (see FIG. 10F) is removed, the second conductive layer 154 is formed on the first conductive layer 352, on the pad area PA.

The first conductive layer 352 and the second conductive layer 154 constitute or define the wiring layer 350 formed on the pad area PA. The wiring layer 350 includes a via contact portion C, which penetrates through the substrate 102 and fills the via hole 120, and a pad portion 350P, which is integrally connected to the via contact portion C and extends on the insulation pattern 340 on the pad area PA.

Figure 10H:
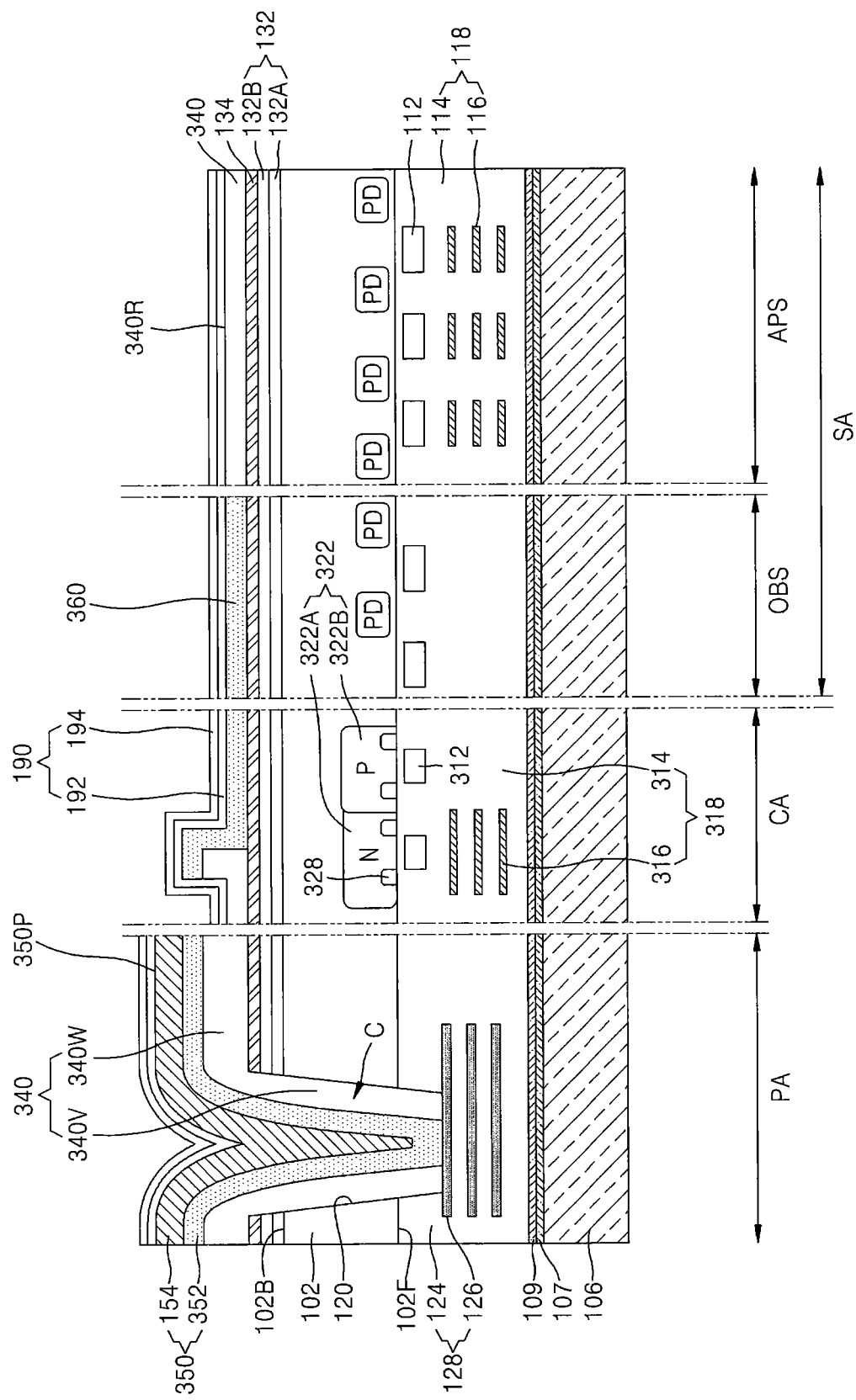

Referring to FIG. 10H, in a method similar to the method described above with reference to FIG. 8M, the second passivation layer 190 covering the wiring layer 350, the light-shielding pattern 360, and the recessed surface portion 340R of the insulation pattern 340 is formed on the backside 102B of the substrate 102.

Figure 10I:
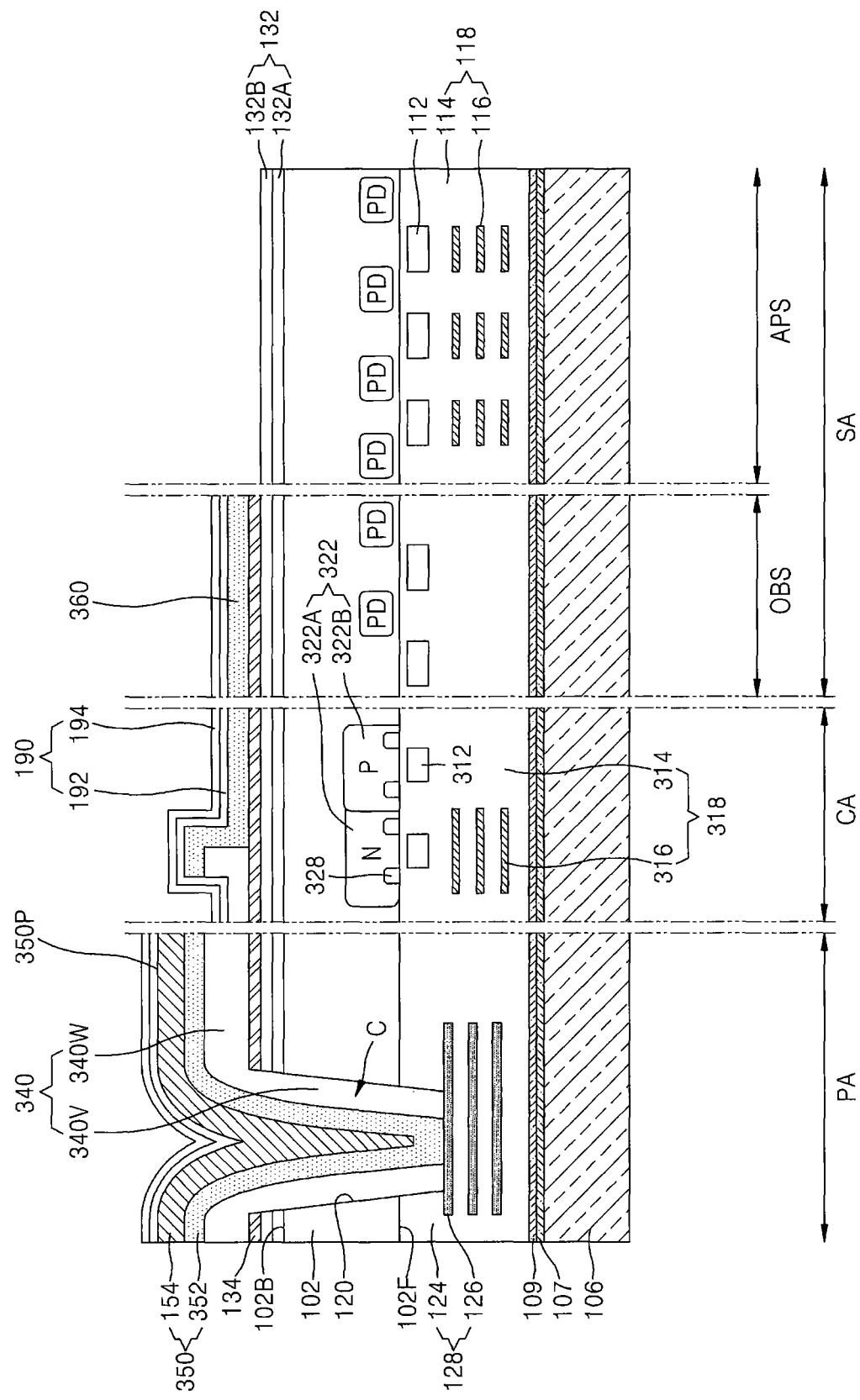

Referring to FIG. 10I, the second passivation layer 190 is selectively removed from the active pixel sensor area APS, and the etching stop layer 134 as exposed according to a result of the removal is also removed, thereby exposing the first passivation layer 132.

Figure 10J:
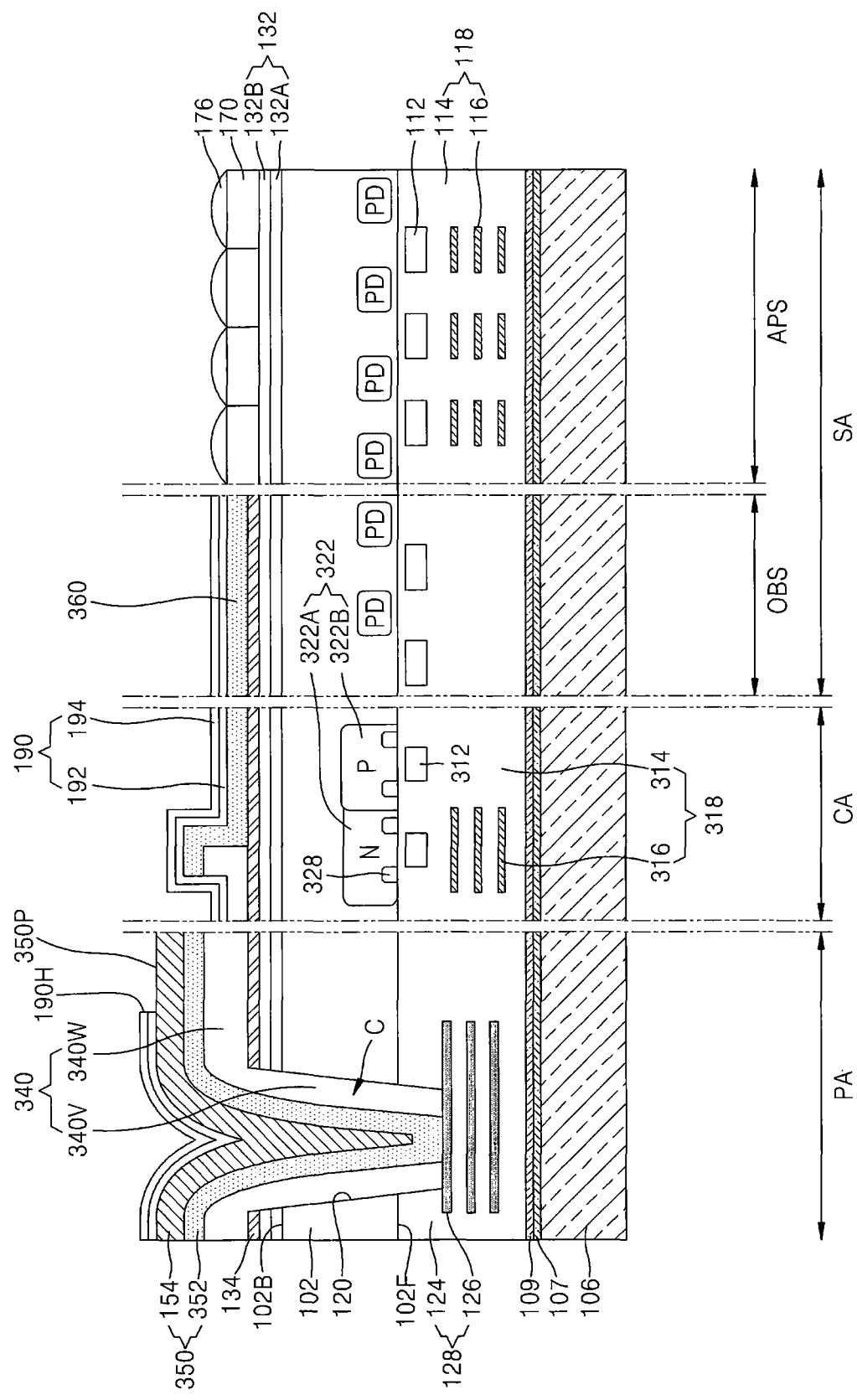

Referring to FIG. 10J, in the pad area PA, a portion of the second passivation layer 190 is removed to form a hole 190H via which the pad portion 350P of the wiring layer 350 is exposed. In the active pixel sensor area APS, the color filter layer 170 and the microlens portion 176 are sequentially formed on the first passivation layer 132.

FIGS. 11A through 11I are cross-sectional views for explaining methods of fabricating an image sensor according to some embodiments of the inventive concept. FIGS. 11A through 11I illustrate methods of fabricating the image sensor 400 of FIGS. 7A and 7B. FIGS. 11A through 11I illustrate a part of each of the active pixel sensor area APS, the optical black sensor area OBS, the circuit area CA, and the pad area PA of the substrate 102. The same reference numerals in FIGS. 11A through 11I as those in FIGS. 1 through 10J denote the same elements, and thus their description will be omitted for simplification of explanation.

Figure 11A:
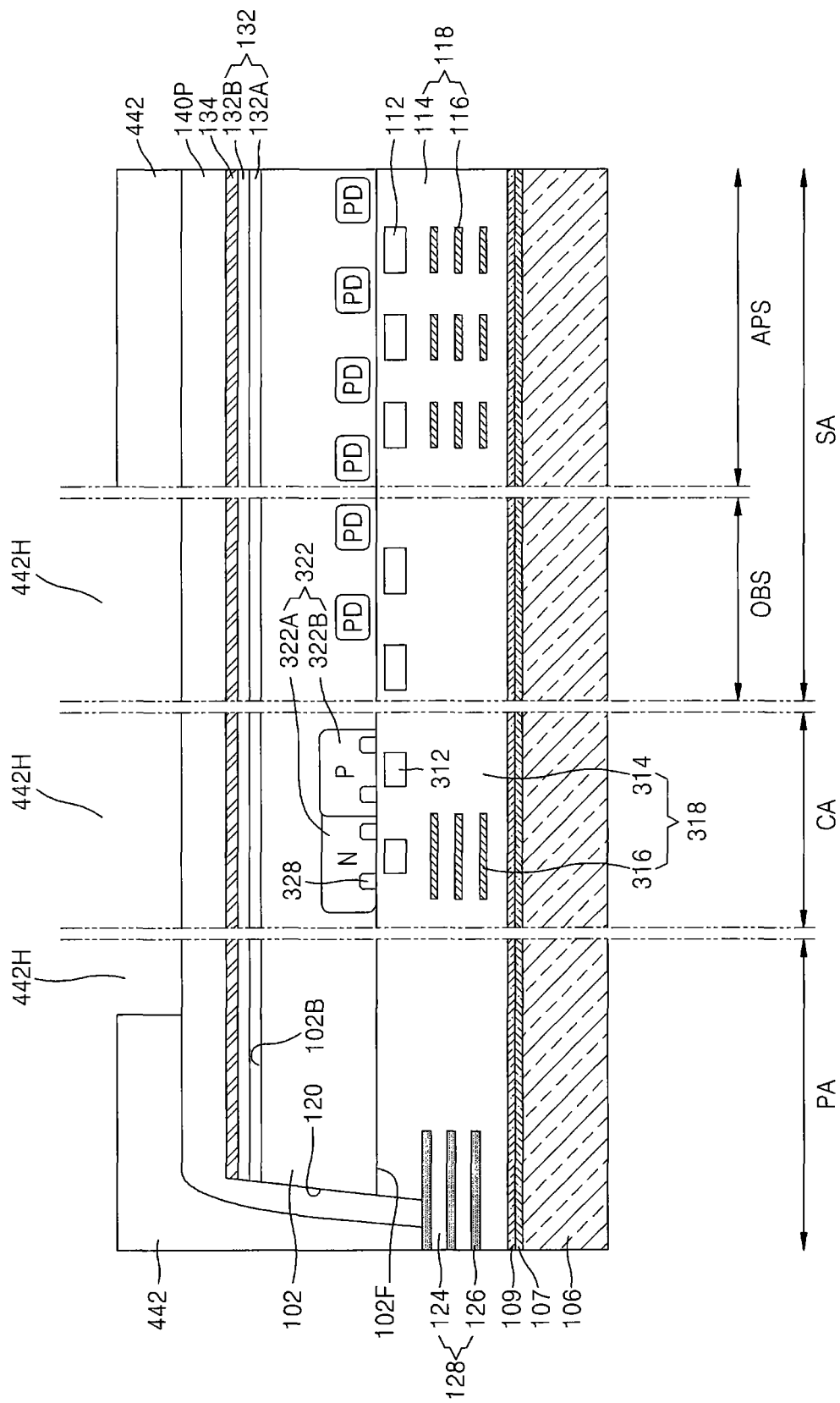

Referring to FIG. 11A, the preliminary insulation pattern 140P is formed on the backside 102B of the substrate 102 as similarly described with reference to FIG. 10A, and then a first mask pattern 442 is formed on the preliminary insulation pattern 140P in a method similar to the formation of the first mask pattern 342 described above with reference of FIG. 10B. However, a hole 442H via which the preliminary insulation pattern 140P is exposed is formed in the first mask pattern 442 on the optical black sensor area OBS, the circuit area CA, and a portion of the pad area PA.

Figure 11B:
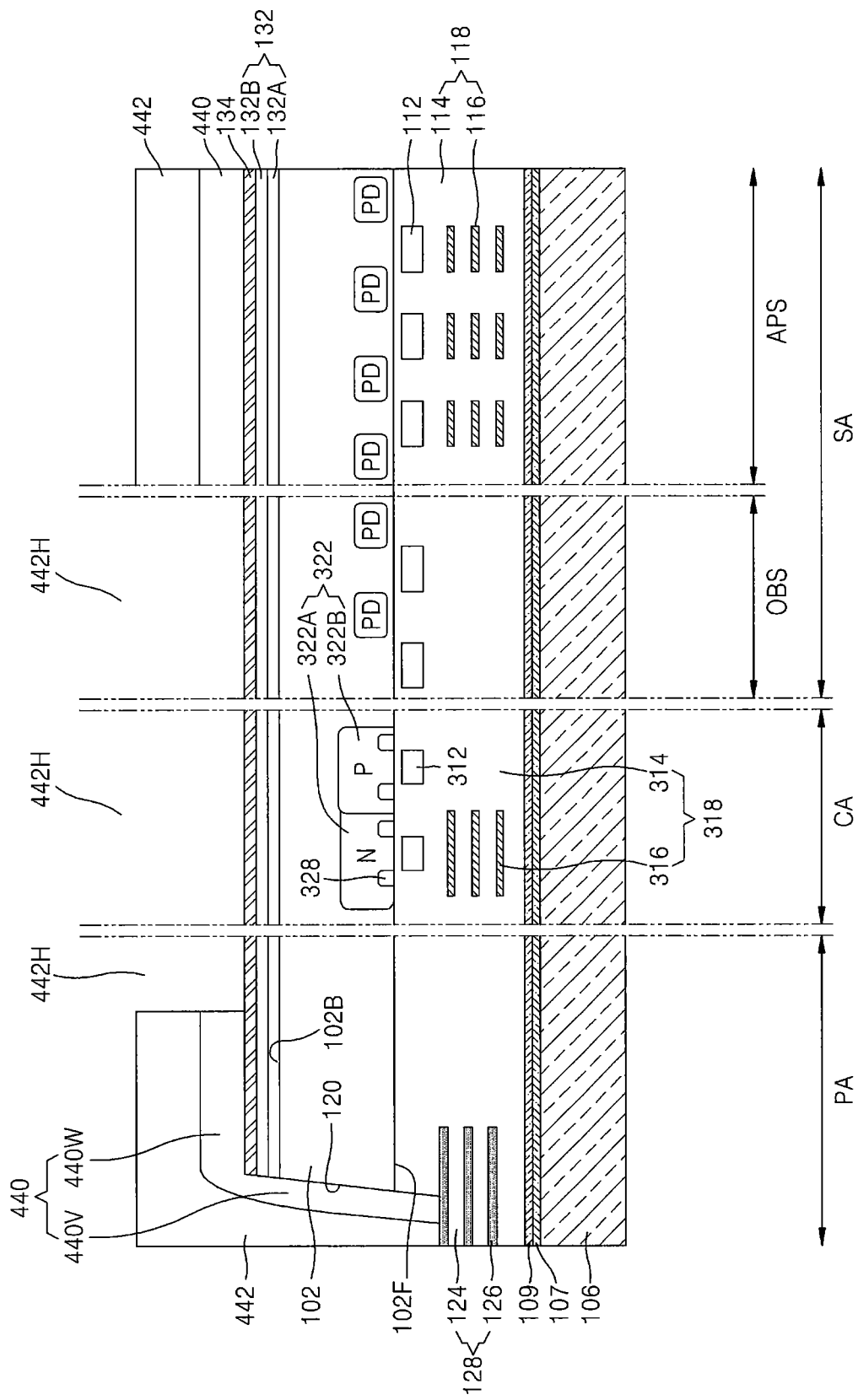

Referring to FIG. 11B, the preliminary insulation pattern 140P is etched using the first mask pattern 442 as an etch mask and the etching stop layer 134 as an etch stop layer, thereby forming the insulation pattern 440.

In the pad area PA, the insulation pattern 440 includes a via insulation pattern portion 440V, which is formed within the via hole 120 and covers the internal sidewall of the via hole 120, and an external insulation pattern portion 440W, which is integrally connected to the via insulation pattern portion 440V and covers the backside 102B of the substrate 102.

Figure 11C:
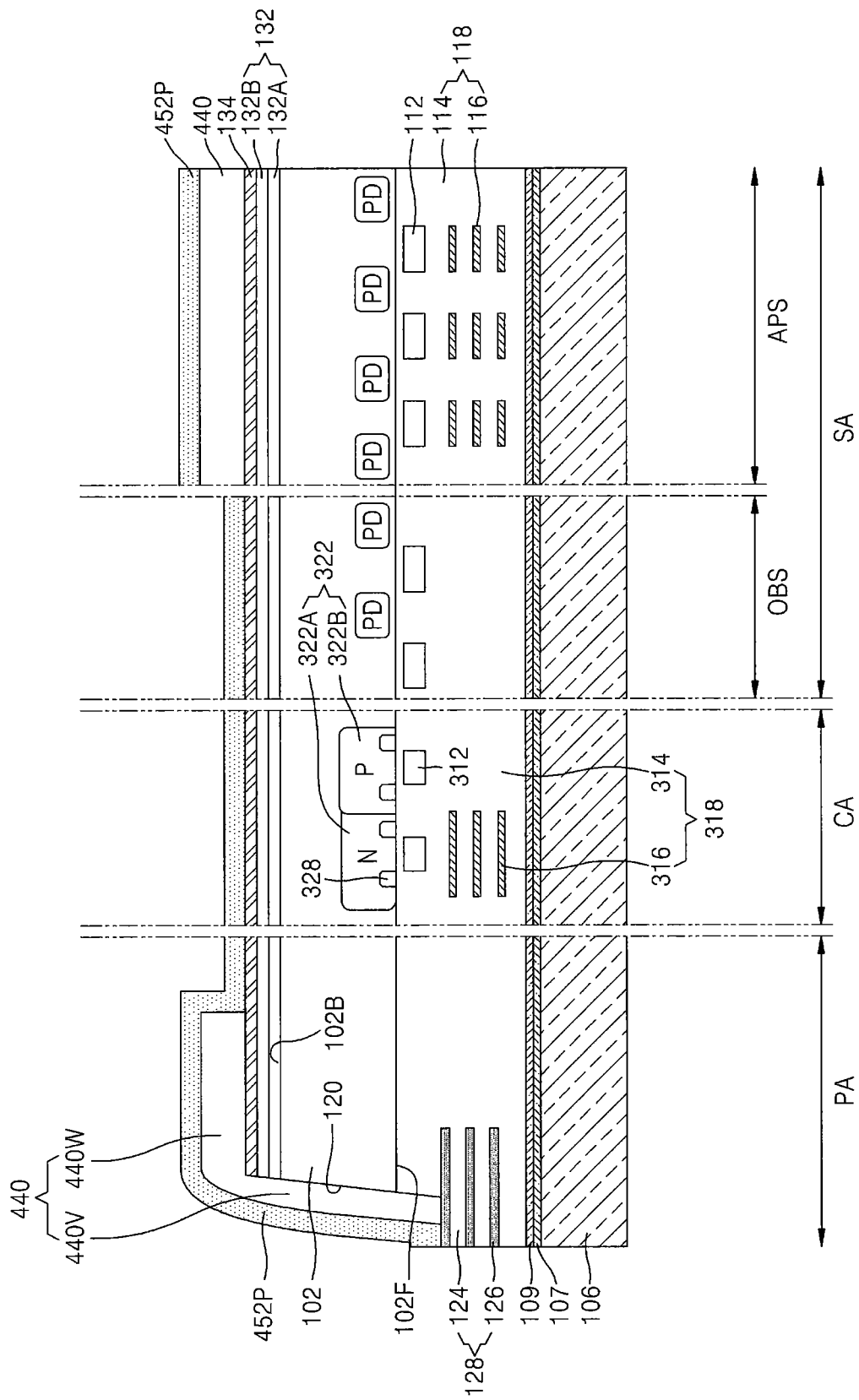

Referring to FIG. 11C, after the first mask pattern 442 (see FIG. 11B) is removed, a preliminary first conductive layer 452P covering an exposed surface of the insulation pattern 440 and an exposed portion of the top surface of the etching stop layer 134 is formed within the via hole 120 and on the backside 102B of the substrate 102.

A detailed description of the preliminary first conductive layer 452P is the same as that of the preliminary first conductive layer 152P made with reference to FIG. 8I.

Figure 11D:
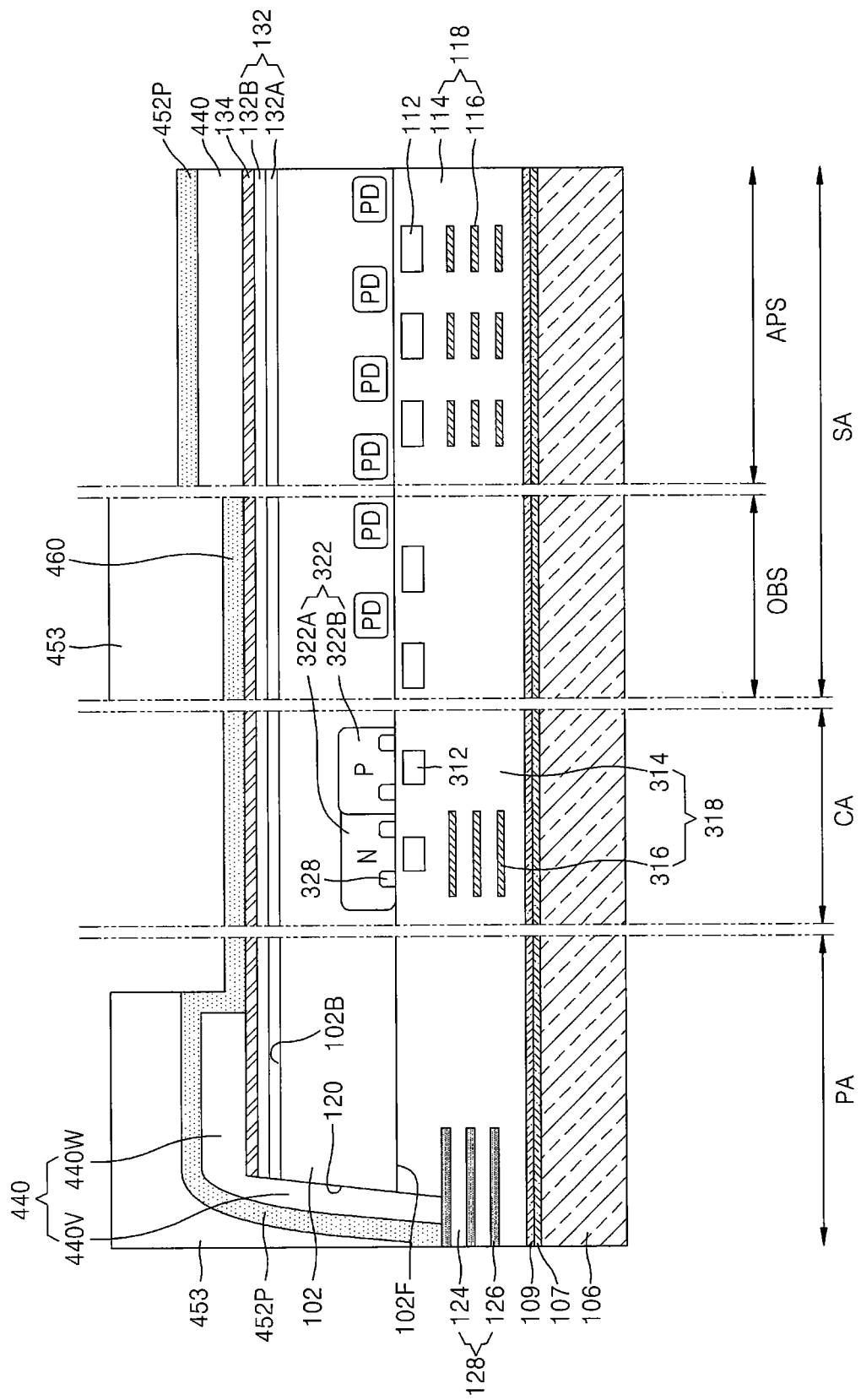

Referring to FIG. 11D, a second mask pattern 453 covering only particular portions of the preliminary first conductive layer 452P in the pad area PA and optical black sensor area OBS is formed on the substrate 102.

The second mask pattern 453 may be, but is not limited thereto, a photoresist layer.

Figure 11E:
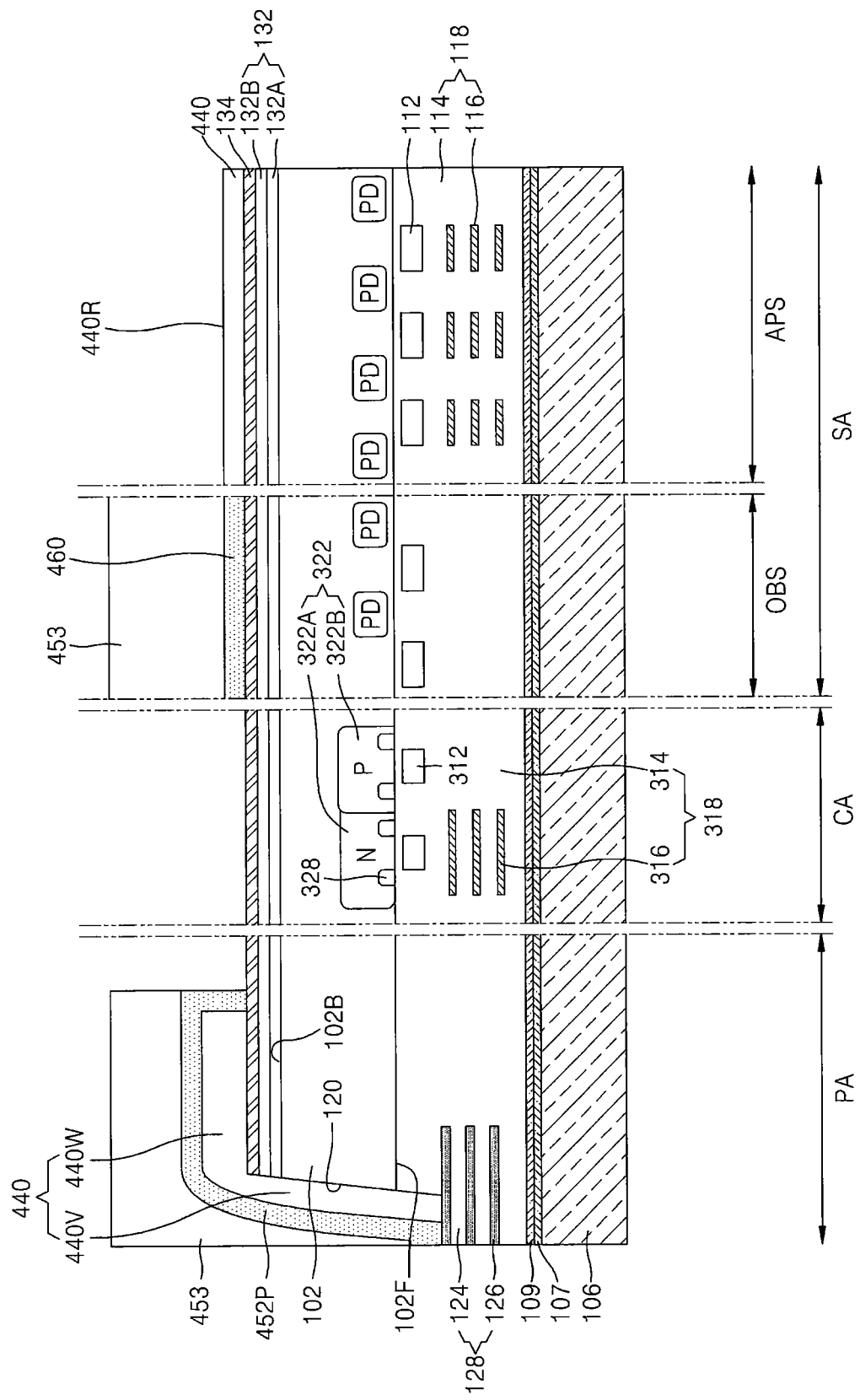

Referring to FIG. 11E, an exposed portion of the preliminary first conductive layer 452P is etched out using the second mask pattern 453 as an etch mask, and a consequently-exposed portion of the insulation pattern 440 is over-etched to thereby form a recessed surface portion 440R in a portion of the insulation pattern 440. During the over-etching, the etching stop layer 134 may be consumed in the circuit area CA. In FIG. 11E, in the circuit area CA, the first passivation layer 132 may be exposed according to a result of the removal of the etching stop layer 134.

Due to the partial removal of the preliminary first conductive layer 452P, a portion of the preliminary first conductive layer 452P remaining on the pad area PA constitutes or defines the first conductive layer 452 extending from the top surface of the insulation pattern 440, which covers the backside 102B of the substrate 102, to the inside of the via hole 120. A portion of the preliminary first conductive layer 452P that remains on the optical black sensor area OBS constitutes or defines the light-shielding pattern 460.

Figure 11F:
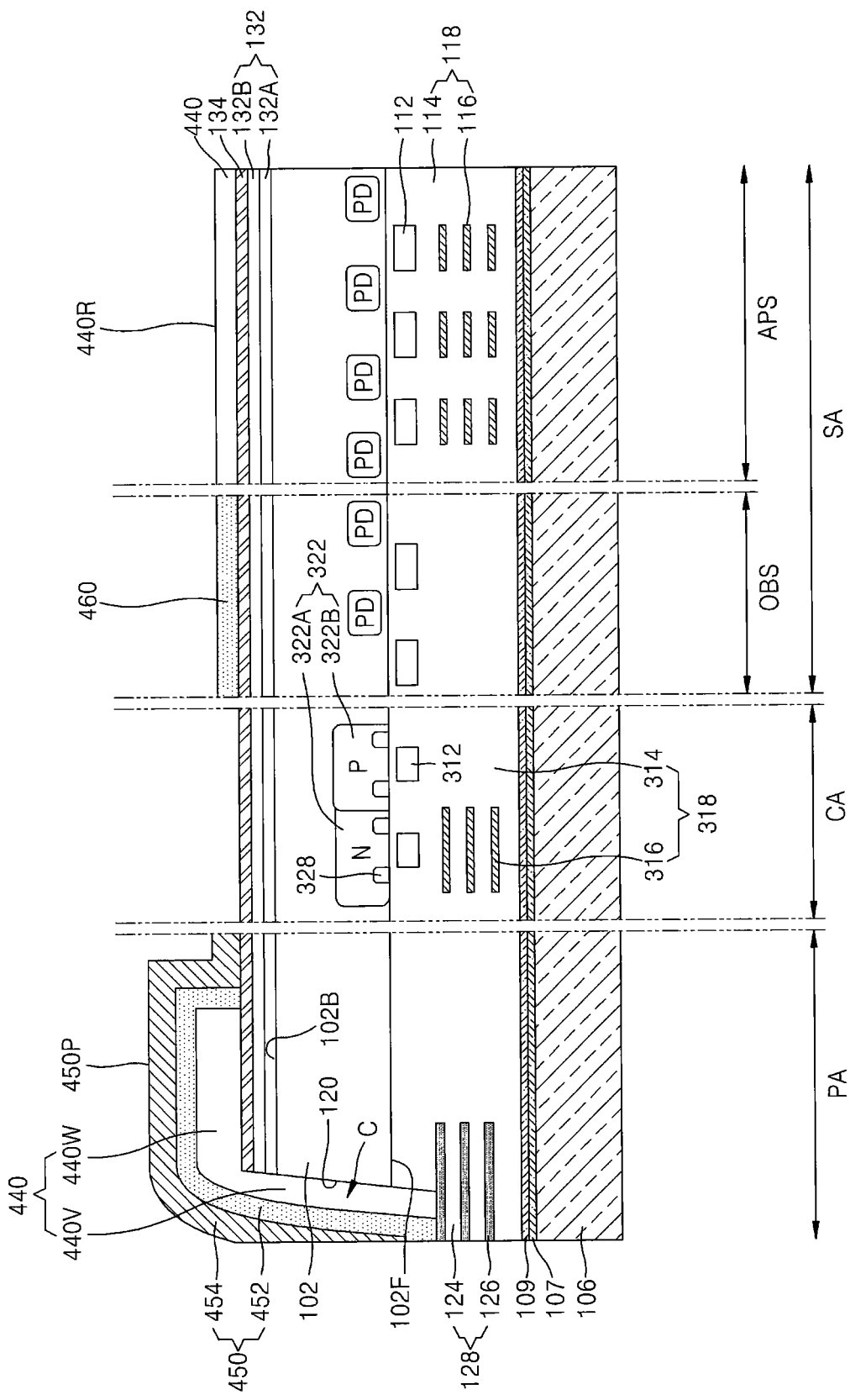

Referring to FIG. 11F, after the second mask pattern 453 (see FIG. 11E) is removed, the second conductive layer 454 is formed on the first conductive layer 452, on the pad area PA.

The first conductive layer 452 and the second conductive layer 454 constitute or define the wiring layer 450 formed on the pad area PA. The wiring layer 450 includes a via contact portion C, which penetrates through the substrate 102 and fills the via hole 120, and the pad portion 450P, which is integrally connected to the via contact portion C and extends on the insulation pattern 440 on the pad area PA.

Figure 11G:
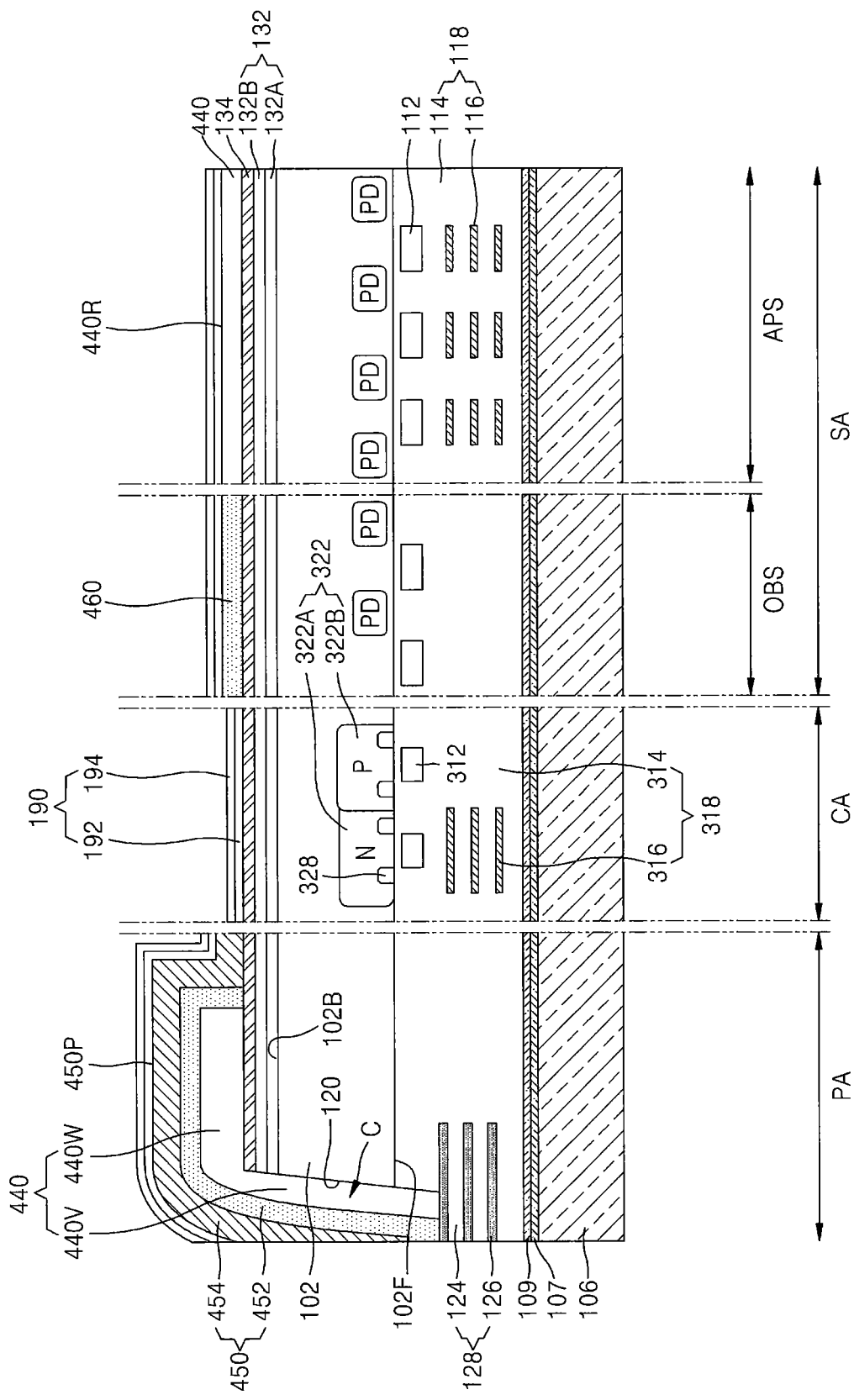

Referring to FIG. 11G, in a method similar to the method described above with reference to FIG. 8M, the second passivation layer 190 covering the wiring layer 450, the light-shielding pattern 460, and the recessed surface portion 440R of the insulation pattern 440 is formed on the backside 102B of the substrate 102.

Figure 11H:
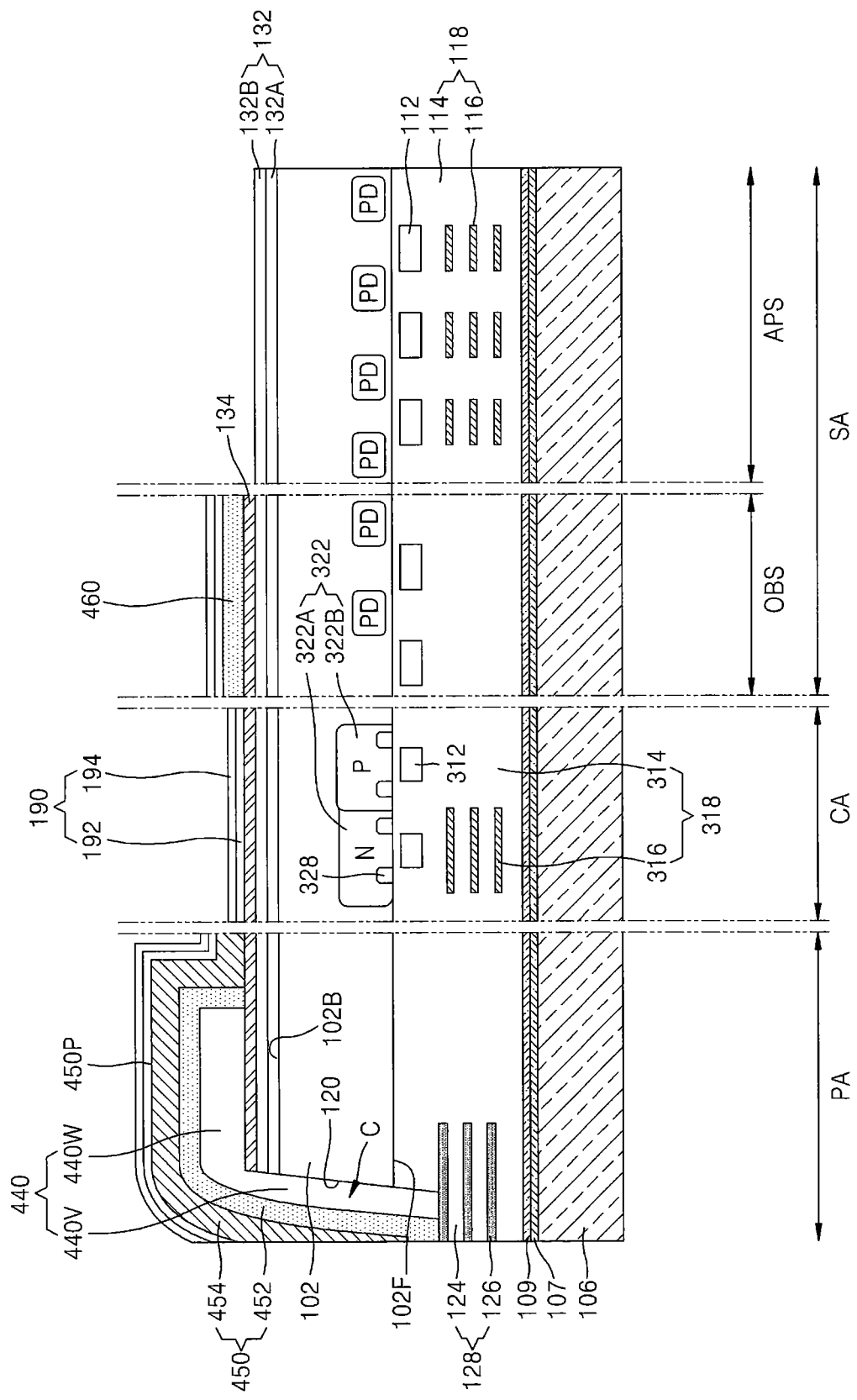

Referring to FIG. 11H, the second passivation layer 190 is removed from the active pixel sensor area APS, and the etching stop layer 134 as exposed according to a result of the removal is also removed, thereby exposing the first passivation layer 132.

Referring to FIG. 11I, in the pad area PA, a portion of the second passivation layer 190 is removed to form a hole 190H via which the pad portion 450P of the wiring layer 450 is exposed. In the active pixel sensor area APS, the color filter layer 170 and the microlens portion 176 are sequentially formed on the first passivation layer 132.

Figure 12:
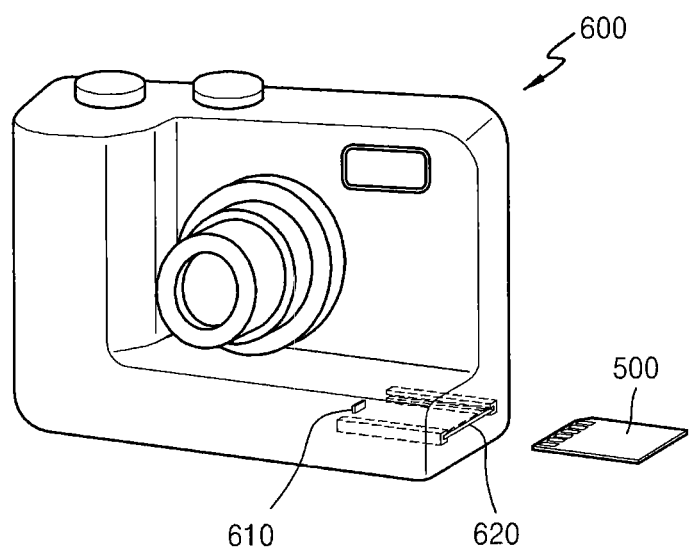
FIG. 12 is a schematic view illustrating an image sensor chip and a camera using the image sensor chip, according to some embodiments of the inventive concept.

FIG. 12 is a schematic view illustrating an image sensor chip 500 and a camera 600 using the image sensor chip 500, according to some embodiments of the inventive concept.

Referring to FIG. 12, the image sensor chip 500 includes at least one of the image sensors 10, 100, 200, 300, and 400 described above with reference to FIGS. 1 through 11I.

The camera 600 includes a digital signal processor (DSP) 610 embedded with a camera controller, an image signal processor, and the like, and an insertion unit 620 into which the image sensor chip 500 can be inserted. Although the image sensor chip 500 is illustrated in FIG. 12 as being detachable for convenience of explanation, the DSP 610 and the image sensor chip 500 may be formed as a single module.

Figure 13:
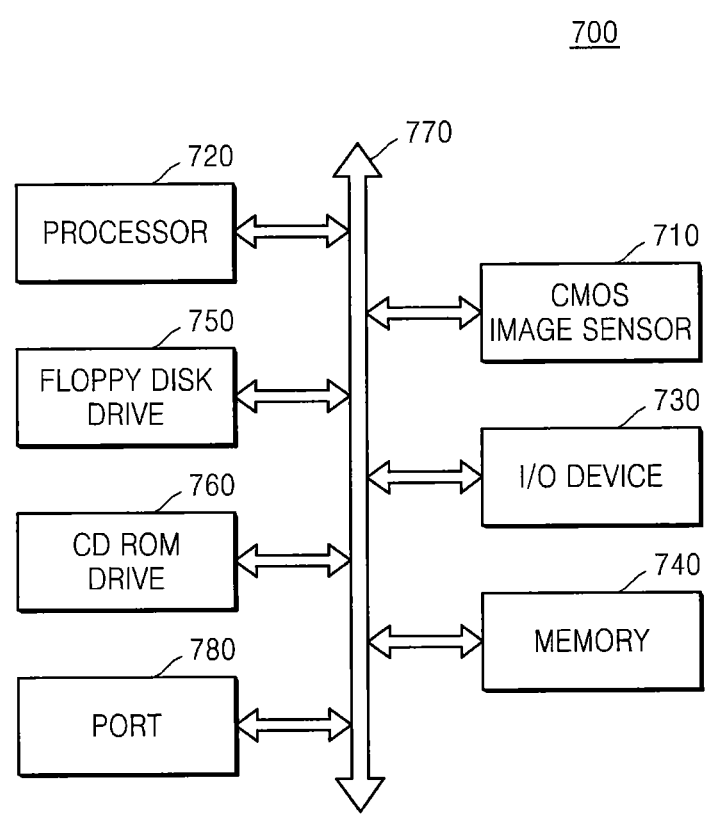
FIG. 13 is a block diagram of an electronic system including an image sensor according to some embodiments of the inventive concept.

FIG. 13 is a block diagram of an electronic system 700 including an image sensor according to some embodiments of the inventive concept.

Referring to FIG. 13, the electronic system 700 includes a CMOS image sensor 710, a processor 720, an input/output (I/O) device 730, a memory 740, a floppy disk drive 750, and a CD ROM drive 760. These components of the electronic system 700 may communicate with one another via a bus 770. The electronic system 700 processes an output image of the CMOS image sensor 710.

The CMOS image sensor 710 includes at least one of the image sensors 10, 100, 200, 300, and 400 described above with reference to FIGS. 1 through 11I.

The electronic system 700 may be a computer system, a camera system, a scanner, an image safety system, or the like. The CMOS image sensor 710 may receive a control signal or data from the processor 720 or another constituent device of the electronic system 700. The CMOS image sensor 710 may provide a signal that defines an image, to the processor 720 based on the received control signal or data, and the processor 720 may process the signal received from the CMOS image sensor 710.

The processor 720 may execute a program and may control the electronic system 700. In some embodiments, the processor 720 may be a microprocessor, a DSP, a microcontroller, or similar devices.

The I/O device 730 may be used to input or output the data of the electronic system 700. The electronic system 700 may be connected to an external device, for example, a personal computer (PC) or a network, by using the I/O device 730, and thus may exchange data with the external device. The I/O device 730 may be, for example, a keypad, a keyboard, and/or a display.

The memory 740 may store a code and/or data for operating the processor 720, or may store processed data output by the processor 720. A port 780 may be connected to a video card, a sound card, a memory card, a USB, or the like, and/or may be used for communication with another system to transfer data.

In an image sensor according to embodiments of the inventive concept, at least a portion of an insulation layer between a substrate and a light-shielding pattern formed on an optical black sensor area of the substrate is removed so that the light-shielding pattern is relatively closer to the substrate. Therefore, a step difference between the level of a color filter layer formed on an active pixel sensor area of the substrate and the level of the light-shielding pattern formed on the optical black sensor area of the substrate may be reduced or minimized. Accordingly, when a color filter layer including a plurality of color filters is formed, the thicknesses of color filters positioned in a region of the active pixel sensor area adjacent to the optical black sensor area may be reduce or prevented from being non-uniform, and problems, such as distortion of an image signal and degradation of the color, may be reduce or prevented from occurring.

While the inventive concept has been particularly shown and described with reference to exemplary embodiments thereof, it will be understood that various changes in form and details may be made therein without departing from the spirit and scope of the following claims.

What is claimed is:

1. An image sensor comprising:
a substrate having a first surface and a second surface opposite to the first surface, the first and second surfaces extending in a first direction;
an interlayer insulating layer disposed on the first surface of the substrate, the interlayer insulating layer including a wiring layer therein;
a conductive layer disposed in a via hole extending in a second direction, a portion of the conductive layer contacting the wiring layer and another portion of the conductive layer, protruding beyond the second surface of the substrate, having a top surface extending in the first direction; and
a light-shielding pattern disposed on the second surface of the substrate, wherein a first distance between the second surface of the substrate to the top surface of the conductive layer is greater than a second distance between the second surface of the substrate to a top surface of the light-shielding pattern.

2. The image sensor of claim 1, wherein at least one of a metal oxide layer, a silicon oxide layer, and an insulation pattern is disposed between the top surface of the conductive layer and the second surface of the substrate.

3. The image sensor of claim 1, wherein a metal oxide layer, a silicon oxide layer, and an insulation pattern are disposed between the top surface of the conductive layer and the second surface of the substrate.

4. The image sensor of claim 1, wherein at least one of a metal oxide layer, a silicon oxide layer, and an insulation pattern is disposed between the light-shielding pattern and the second surface of the substrate.

5. The image sensor of claim 1, wherein a metal oxide layer, a silicon oxide layer, and an insulation pattern are disposed between the light-shielding pattern and the second surface of the substrate.

6. The image sensor of claim 1, wherein the conductive layer comprises:
a first conductive layer and a second conductive layer.

7. The image sensor of claim 6, wherein the first conductive layer includes W, Au, Ag, Cu, Al, or a combination thereof, and the second conductive layer includes Al, Cu, CuSn, CuMg, CuNi, CnZn, CuPd, CuAu, CuRe, CuW, W, W alloy, or a combination thereof.

8. The image sensor of claim 1, wherein the light-shielding pattern includes W, Au, Ag, Cu, Al, or a combination thereof.

9. An image sensor comprising:
a substrate having a via hole;
a photodiode arranged in a substrate, the photodiode laterally adjacent to the via hole in the substrate;
a wiring line arranged under the substrate;
a first conductive layer arranged in the via hole, the first conductive layer protruding through the via hole to the wiring line; and
a second conductive layer electrically connected to the first conductive layer, and extending laterally towards the photodiode over the substrate, the second conductive layer covering the first conductive layer.

10. The image sensor of claim 9, further comprising:
a passivation layer covering a top surface of the second conductive layer, the passivation layer including a silicon oxide layer, a silicon nitride layer, or a combination thereof.

11. The image sensor of claim 9, further comprising:
a light-shielding pattern disposed over the photodiode, the light-shielding pattern including W, Au, Ag, Cu, Al, or a combination thereof.

12. The image sensor of claim 9, further comprising an insulation pattern,
wherein the insulation pattern includes:
a via insulation pattern portion within the via hole; and
an external insulation pattern portion integrally connected to the via insulation pattern portion and interposed between the substrate and the second conductive layer.

13. An image sensor comprising:
a substrate having a via hole;
a first plurality of photodiodes in the substrate;
a second plurality of photodiodes in the substrate;
a light shielding pattern on a backside of the substrate, the light shielding pattern covering the first plurality of photodiodes;
a first conductive layer covering the backside of the substrate and extending laterally on a first level spaced apart from the backside of the substrate; and
a second conductive layer including a vertical portion disposed in the via hole and an external portion extending laterally over the substrate, the external portion integrally connected to the vertical portion and having a pad portion,
wherein the first conductive layer is interposed between the backside of the substrate and the external portion of the second conductive layer, and
wherein the light shielding pattern includes a first portion extending laterally on the first level.

14. The image sensor of claim 13, wherein the light shielding pattern further includes a second portion disposed on a second level closer to the backside of the substrate than the first level, the second portion integrally connected to the first portion.

15. The image sensor of claim 13, further comprising an insulation pattern,
wherein the insulation pattern includes:
a first insulation portion disposed between the backside of the substrate and the first conductive layer; and
a second insulation portion disposed between the backside of the substrate and the light shielding pattern.

16. The image sensor of claim 13, wherein a first distance between the backside of the substrate to a top surface of the second conductive layer is greater than a second distance between the backside of the substrate to a top surface of the light-shielding pattern.

17. The image sensor of claim 13, further comprising a wiring line on a front side of the substrate, the wiring line being connected to the pad portion of the second conductive layer through the vertical portion of the second conductive layer.

18. The image sensor of claim 13, further comprising:
a passivation layer covering a top surface of the light shielding pattern and a top surface of the second conductive layer, the passivation layer including a silicon oxide layer, a silicon nitride layer, or a combination thereof.

19. The image sensor of claim 13, wherein the first conductive layer includes W, Au, Ag, Cu, Al, or a combination thereof.

20. The image sensor of claim 13, wherein the second conductive layer includes Al, Cu, CuSn, CuMg, CuNi, CuZn, CuPd, CuAu, CuRe, CuW, W, W alloy, or a combination thereof.

* * * * *